(12) United States Patent
Caldeira et al.

(10) Patent No.: US 9,207,270 B2
(45) Date of Patent: Dec. 8, 2015

(54) METHOD AND APPARATUS FOR MEASURING NEGAWATT USAGE OF AN APPLIANCE

(75) Inventors: Kenneth G. Caldeira, Redwood City, CA (US); Alistair K. Chan, Bainbridge Island, WA (US); Daniel B. Cook, Seattle, WA (US); Roderick A. Hyde, Redmond, WA (US); Muriel Y. Ishikawa, Livermore, CA (US); Jordin T. Kare, Seattle, WA (US); John Latham, Boulder, CO (US); Nathan P. Myhrvold, Bellevue, WA (US); Thomas J. Nugent, Jr., Bellevue, WA (US); Stephen H. Salter, Edinburgh (GB); Clarence T. Tegreene, Mercer Island, WA (US); David B. Tuckerman, Lafayette, CA (US); Thomas Allan Weaver, San Mateo, CA (US); Charles Whitmer, North Bend, WA (US); Lowell L. Wood, Jr., Bellevue, WA (US); Victoria Y. H. Wood, Livermore, CA (US)

(73) Assignee: ELWHA LLC, Bellevue, WA (US)

( * ) Notice: Subject to any disclaimer, the term of this patent is extended or adjusted under 35 U.S.C. 154(b) by 515 days.

(21) Appl. No.: 13/600,397

(22) Filed: Aug. 31, 2012

(65) Prior Publication Data

US 2014/0067296 A1    Mar. 6, 2014

(51) Int. Cl.
*G01R 21/133*    (2006.01)
*G06Q 50/06*    (2012.01)
*G01D 4/00*    (2006.01)
*G01R 22/10*    (2006.01)

(52) U.S. Cl.
CPC ............. *G01R 21/133* (2013.01); *G06Q 50/06* (2013.01); *G01D 4/00* (2013.01); *G01R 22/10* (2013.01)

(58) Field of Classification Search
CPC ...... G01R 21/133; G01R 22/10; G06Q 50/06; G01D 4/00
USPC .......... 700/108, 130, 282, 295; 204/602, 405, 204/416; 73/866.5, 865.8
See application file for complete search history.

(56) References Cited

U.S. PATENT DOCUMENTS

| | | | |
|---|---|---|---|
| 4,644,320 A | 2/1987 | Carr et al. | |
| 5,297,992 A * | 3/1994 | Bailey et al. | 454/339 |
| 6,169,964 B1 | 1/2001 | Aisa et al. | |
| 6,249,472 B1 * | 6/2001 | Tamura et al. | 365/225.7 |
| 6,397,883 B1 * | 6/2002 | Huntley et al. | 137/382 |
| 6,449,530 B1 * | 9/2002 | Yamada et al. | 700/214 |
| 7,059,003 B2 | 6/2006 | Bergemann et al. | |
| 7,153,690 B2 * | 12/2006 | Stevens et al. | 436/51 |
| 7,212,977 B2 * | 5/2007 | Tsuji et al. | 705/63 |
| 7,214,537 B2 * | 5/2007 | Stevens et al. | 436/42 |
| 7,376,490 B2 * | 5/2008 | Ueno et al. | 700/291 |
| 7,423,546 B1 | 9/2008 | Aisa | |
| 7,684,903 B2 * | 3/2010 | Tomine | 700/306 |

(Continued)

*Primary Examiner* — Carol S Tsai

(57) ABSTRACT

The present invention may include measuring energy usage of one or more appliances for a selected usage metric, receiving reference energy usage data indicative of energy usage of one or more reference appliances for the selected usage metric, comparing the measured energy usage of the one or more appliances for the selected usage metric to the one or more received sets of reference energy usage data for the selected usage metric, and reporting an amount of energy savings based on the comparison of measured energy usage of the one or more appliances and the one or more received sets of reference energy data.

47 Claims, 37 Drawing Sheets

(56) References Cited

U.S. PATENT DOCUMENTS

| | | | |
|---|---|---|---|
| 7,760,325 B2* | 7/2010 | Okada | 355/30 |
| 7,826,916 B2* | 11/2010 | Tomine | 700/121 |
| 8,264,271 B2* | 9/2012 | Nishimura | 327/392 |
| 8,266,076 B2* | 9/2012 | Lopez et al. | 705/412 |
| 8,718,825 B2* | 5/2014 | George | 700/276 |
| 2003/0121799 A1* | 7/2003 | Stevens et al. | 205/775 |
| 2004/0065547 A1* | 4/2004 | Stevens et al. | 204/405 |
| 2005/0016228 A1 | 1/2005 | Bergemann et al. | |
| 2005/0185427 A1* | 8/2005 | Lv et al. | 363/21.1 |
| 2006/0172427 A1* | 8/2006 | Germouni et al. | 436/55 |
| 2006/0211129 A1* | 9/2006 | Stevens et al. | 436/173 |
| 2007/0106671 A1* | 5/2007 | Uchida et al. | 707/10 |
| 2007/0174668 A1 | 7/2007 | Srinivasan | |
| 2008/0122585 A1 | 5/2008 | Castaldo et al. | |
| 2008/0136581 A1 | 6/2008 | Heilman et al. | |
| 2008/0167772 A1* | 7/2008 | Du et al. | 701/33 |
| 2009/0011376 A1* | 1/2009 | Okada | 430/325 |
| 2009/0107212 A1* | 4/2009 | Becker | 73/23.2 |
| 2009/0187445 A1* | 7/2009 | Barclay et al. | 705/7 |
| 2009/0195349 A1* | 8/2009 | Frader-Thompson et al. | 340/3.1 |
| 2009/0228406 A1* | 9/2009 | Lopez et al. | 705/412 |
| 2010/0070434 A1 | 3/2010 | Cooper et al. | |
| 2010/0076615 A1 | 3/2010 | Daniel et al. | |
| 2010/0117625 A1 | 5/2010 | Botts | |
| 2010/0146712 A1 | 6/2010 | Finch et al. | |
| 2010/0161502 A1 | 6/2010 | Kumazawa et al. | |
| 2010/0175719 A1 | 7/2010 | Finch et al. | |
| 2010/0191487 A1 | 7/2010 | Rada et al. | |
| 2010/0228405 A1 | 9/2010 | Morgal et al. | |
| 2010/0325466 A1* | 12/2010 | Ohta et al. | 713/400 |
| 2011/0138202 A1* | 6/2011 | Inoue et al. | 713/310 |
| 2011/0144791 A1* | 6/2011 | Loldj et al. | 700/108 |

* cited by examiner

METHOD AND APPARATUS FOR MEASURING NEGAWATT USAGE OF AN APPLIANCE

TECHNICAL FIELD

The present disclosure generally relates to the measurement of negawatt usage of a residential or commercial appliance, and, in particular, the measurement of negawatt usage by an appliance expressed in terms of energy usage or energy cost measured relative to one or more reference appliances.

SUMMARY

In one aspect, a method includes, but is not limited to, measuring energy usage of one or more appliances for a selected usage metric; receiving reference energy usage data indicative of energy usage of one or more reference appliances for the selected usage metric; comparing the measured energy usage of the one or more appliances for the selected usage metric to the one or more received sets of reference energy usage data for the selected usage metric; and reporting an amount of energy savings based on the comparison of measured energy usage of the one or more appliances and the one or more received sets of reference energy data.

In another aspect, a method includes, but is not limited to, measuring energy usage of one or more appliances for a selected usage metric; receiving reference energy usage data indicative of energy usage of one or more reference appliances for the selected usage metric; comparing the measured energy usage of the one or more appliances for the selected usage metric to the one or more received sets of reference energy usage data for the selected usage metric; receiving energy cost data indicative of a cost of energy during at least a portion of the energy usage measurement; and reporting an amount of energy cost saving based on the comparison of measured energy usage of the one or more appliances and the one or more received sets of reference energy data and the received energy cost data.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

In one aspect, an apparatus includes, but is not limited to, one or more energy meters configured to measure energy usage of one or more appliances for a selected usage metric; a controller communicatively coupled to the one or more energy meters, the controller configured to: receive reference energy usage data indicative of energy usage of one or more reference appliances for the selected usage metric; and compare the energy usage of the one or more appliances measured by the one or more energy meters for the selected usage metric to the one or more received sets of reference energy usage data for the selected usage metric; and a display device communicatively coupled to the controller and configured to display an amount of energy savings based on the comparison of measured energy usage of the one or more appliances and the one or more received sets of reference energy data.

In another aspect, an apparatus includes, but is not limited to, one or more energy meters configured to measure energy usage of one or more appliances for a selected usage metric; a controller communicatively coupled to the one or more energy meters, the controller configured to: receive reference energy usage data indicative of energy usage of one or more reference appliances for the selected usage metric; compare the energy usage of the one or more appliances measured by the one or more energy meters for the selected usage metric to the one or more received sets of reference energy usage data for the selected usage metric; and receive energy cost data indicative of a cost of energy during at least a portion of the energy usage measurement; and a display device communicatively coupled to the controller and configured to display the amount of energy cost savings based on the comparison of measured energy usage of the one or more appliances and the one or more received sets of reference energy data, and the received energy cost data.

In addition to the foregoing, various other method and/or system and/or program product aspects are set forth and described in the teachings such as text (e.g., claims and/or detailed description) and/or drawings of the present disclosure.

The foregoing is a summary and thus may contain simplifications, generalizations, inclusions, and/or omissions of detail; consequently, those skilled in the art will appreciate that the summary is illustrative only and is NOT intended to be in any way limiting. Other aspects, features, and advantages of the devices and/or processes and/or other subject matter described herein will become apparent in the teachings set forth herein.

DETAILED DESCRIPTION

Figure 1A:
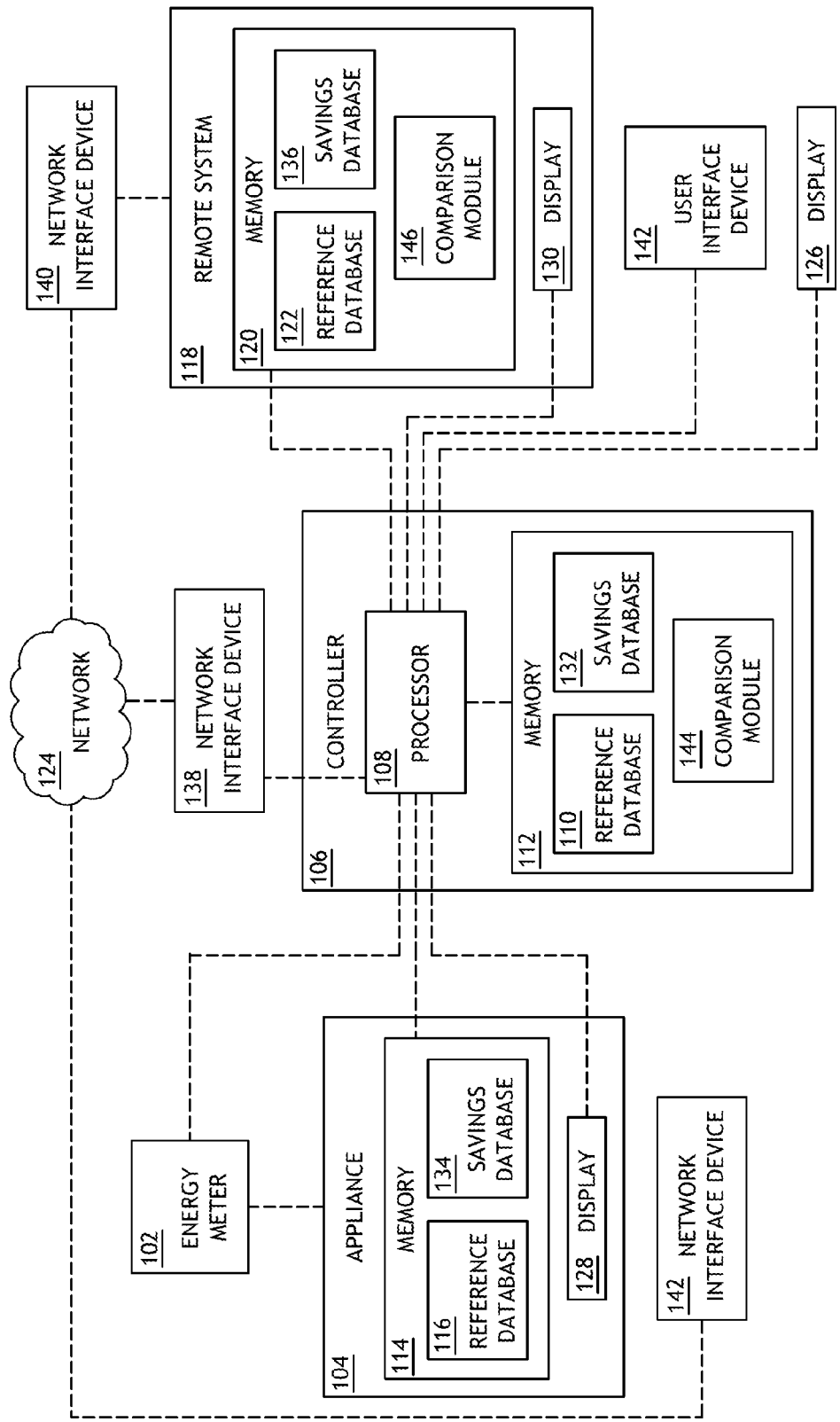
FIG. 1A is a block diagram view of a system for measuring negawatt usage of one or more appliances.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Figure 1B:
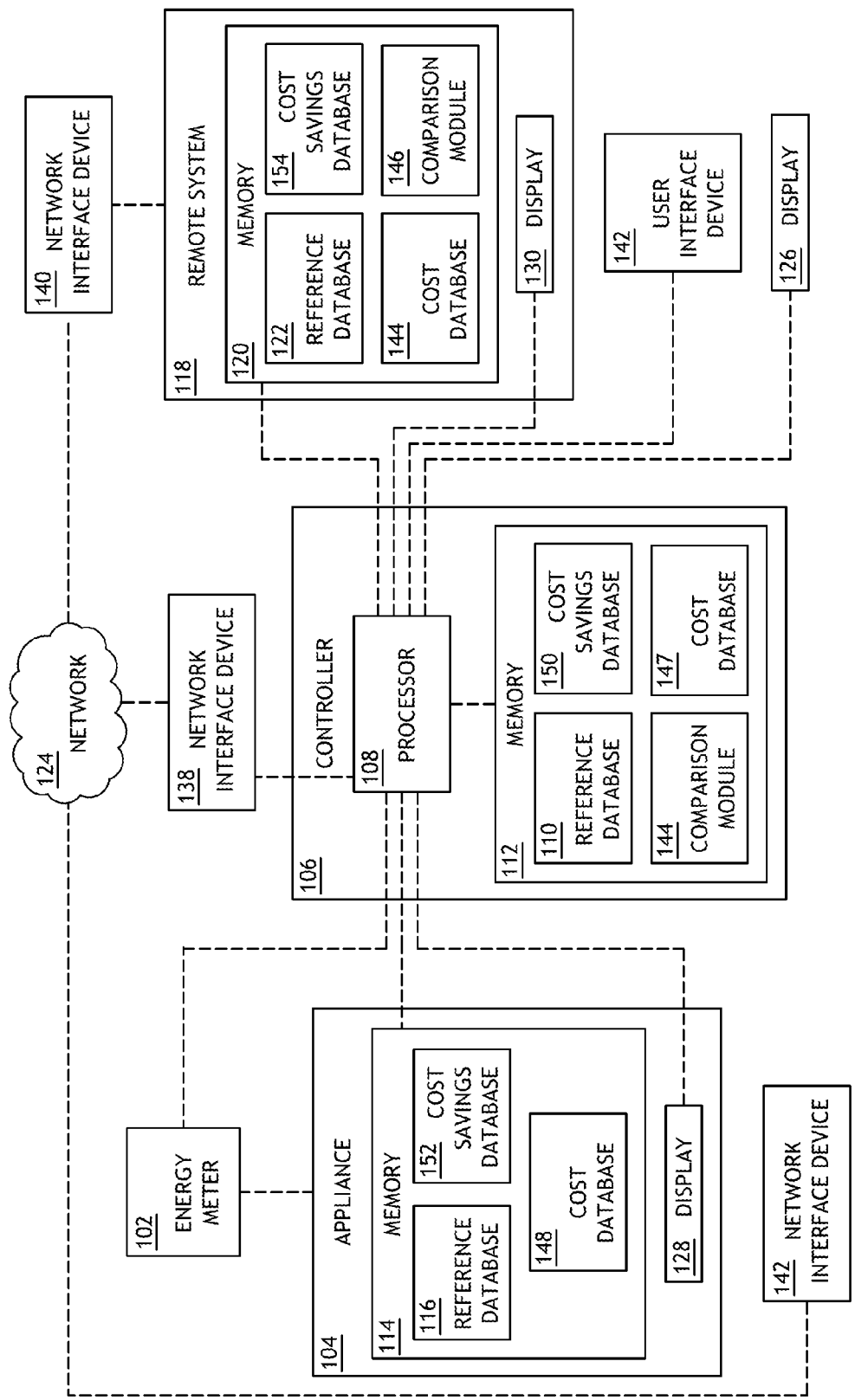
FIG. 1B is a block diagram view of a system for measuring negawatt usage of one or more appliances.

Referring generally to FIGS. 1A through 1B, a negawatt measurement system 100 is described in accordance with the present invention. FIG. 1A illustrates a block diagram view of a negawatt measurement system 100, in accordance with one embodiment of the present invention. The negawatt measurement system 100 may include one or more energy meters 102 configured to measure energy usage of one or more appliances 104 for a selected energy usage metric (e.g., selected time period, selected number of appliance operations, and the like). In a further aspect, the negawatt measurement system 100 includes a controller 106 communicatively coupled to the one or more energy meters 102. The controller 106 is configured to i) receiving reference energy usage data indicative of energy usage of one or more reference appliances for the selected usage metric; ii) comparing the measured energy usage of the one or more appliances 104 for the selected usage metric to the one or more received sets of reference energy usage data for the selected usage metric; and iii) report an amount of energy savings based on the comparison of measured energy usage of the one or more appliances 104 and the one or more received sets of reference energy data.

In a general sense, the energy meter 102 of the present invention may include any known system or device suitable for measuring energy usage by one or more appliances. In one aspect, the energy meter 102 may include any device suitable for measuring electrical energy usage of one or more appliances. For example, the energy meter 102 may include an electrical power meter. For instance, the energy meter 102 may include a system or device suitable for measuring voltage and current of one or more appliances 104 placed in series or parallel with the one or more appliances 104. Utilizing the measured instantaneous voltage and current, the energy meter 102 may calculate the instantaneous electric power usage of the one or more appliances, which in turn may be used to determine the net energy usage over a selected integration time. The energy meter 102 may express the instantaneous power or energy used by one or more appliances 104 in any manner known in the art. For example, in the case of power, the energy meter 102 may express the instantaneous power in terms of watts, volt-amps, and the like. In the case of energy usage, the energy meter 102 may express the amount of energy used over a selected time interval in terms of kilowatt-hours, joules, and the like.

In another embodiment, the energy meter 102 may be selectably placed in a circuit common to the one or more appliances. For example, the energy meter 102 may include a "pluggable" or "plug load" meter. In a general sense, any plug load meter known in the art may be suitable for implementation in the present invention. In this regard, the energy meter 102 may be plugged into an electrical outlet residing on a residential or commercial circuit. In turn, the one or more appliances 104 may be plugged into a receiving port of the energy meter 102, thereby placing the one or more appliances 104 in a series configuration with the energy meter 102.

In one embodiment, the energy meter 102 may include an electromechanical induction meter. In a further embodiment, the energy meter 102 may include a solid-state energy meter suitable for determining one or more parameters (e.g., power, energy usage, and the like) of the one or more appliances 104 utilizing the measured current and voltage of the one or more appliances. In a further embodiment, the one or more energy meters 102 may be integrated within the housing of the one or more appliances.

In another aspect, the energy meter 102 may include any system or device suitable for measuring the heat generated by the one or more appliances 104. For example, the energy meter 102 may include one or more heat meters positioned proximate to the one or more appliances 104 and configured to measure or approximate the amount of thermal energy generated by the one or more appliances 104 during operation. Even further, it is recognized herein that the one or more processors 108 may utilize measurement data from multiple heat meters (e.g., thermal probes) to provide an estimation of the heat generated by the one or more appliances. In another example, the energy meter 102 may include one or more heat meters disposed on or within the housing of the one or more appliances 104.

The controller 106 includes one or more computer processors 108 configured to receive reference energy usage data indicative of energy usage of one or more reference appliances for the selected usage metric from a reference usage database.

The one or more processors 108 of the controller 106 may be communicatively coupled to the various sub-systems of system 100 in any manner known in the art. For example, the one or more processors 108 may be communicatively coupled to the one or more appliances via a wireline (e.g., copper wire, fiber optic cable, and the like) or wireless connection (e.g., RF coupling, IR coupling, data network communication, and the like. By way of another example, the one or more processors 108 may be communicatively coupled to the energy meter 102 via a wireline or wireless connection. In another example, the one or more processors 108 may be communicatively coupled to a remote system 118 via a network 124. In this regard, the controller 106 may include a network interface device 138 suitable for interfacing with network 124, while the remote system 118 includes a network interface device 140 also suitable for interfacing with network 124. The network interface devices 138 and 140 may include any network interface device known in the art. For instance, the network interface devices 138 and 140 may include wireline-based interface device (e.g., DSL-based interconnection, Cable-based interconnection, T9-based interconnection, and the like). In another instance, the network interface devices 138 and 140 may include a wireless-based interface device employing GSM, GPRS, CDMA, EV-DO, EDGE, WiMAX, LTE, Wi-fi protocols, and the like.

In one embodiment, the controller 106 may be positioned in close proximity to the one or more appliances 104. For instance, the controller 106 may be integrated within the housing of the energy meter 102. In another embodiment, the controller 106 may be disposed within the housing of the one or more appliances. In another embodiment, the controller 106 may be positioned remotely from the one or more appliances 104. For instance, the controller 106 may be located several miles from the one or more appliances 104 and may be coupled to the one or more appliances 104 via a network 124.

In some embodiments, the one or more processors 108 may be configured to receive energy usage data for a selected usage metric from at least one of the following: a reference usage database 110 stored in the memory 112 of the controller 106, a reference usage database 116 stored in the memory 114 of the appliance 104, or a reference usage database 122 stored in the memory 120 of a remote system 118 (e.g., remote server coupled to network 124, remote computing system coupled to network 124, and the like).

The processor 108 of the controller 106 is further configured to compare the energy usage of the one or more appliances 104, as measured by the one or more energy meters 102, to the one or more sets of reference energy usage data received from a reference energy usage database for the selected usage metric. In this regard, the processor 108 of the controller 106 may calculate at least one of a difference, a relative difference, or a ratio between the energy usage of the one or more appliances 104, as measured by the energy meter 102, and the one or more sets of reference energy usage data received from a reference energy usage database for the selected usage metric.

In one embodiment, the processor 108 of the controller may carry out the comparison between the energy usage of the one or more appliances 104 and the reference energy usage data at a selected set of time intervals. In another embodiment, the processor 108 of the controller may carry out the comparison between the energy usage of the one or more appliances 104 and the reference energy usage data in response to a selected number of operation cycles of the one or more appliances 104. In another embodiment, the processor 108 of the controller may carry out the comparison between the energy usage of the one or more appliances 104 and the reference energy usage data in response to a query (e.g., user query, external system query, and the like). In another embodiment, the processor 108 of the controller may carry out the comparison between the energy usage of the one or more appliances 104 and the reference energy usage data in response to a selected energy usage level of the one or more appliances 104.

In an additional embodiment, the processor 108 of the controller 106 may compare the time-averaged measured energy usage of the one or more appliances 104 to the one or more sets of reference energy data for the selected usage metric. In an another embodiment, the processor 108 of the controller 106 may compare the operation-averaged measured energy usage of the one or more appliances 104 to the one or more sets of reference energy data for the selected usage metric.

In a further aspect, the processor 108 of the controller 106 may carry out the comparison between the energy usage of the one or more appliances 104 and the reference energy usage data for the selected energy usage metric utilizing a comparison module. For example, the comparison module may include a comparison module 144 of the controller 106. In this regard, the comparison modules 144 may include a set of program instructions stored in the memory 112 of the controller 106 and configured to cause the one or more processors 108 to execute a comparison operation between the between the energy usage of the one or more appliances 104 and the reference energy usage data for the selected energy usage metric. By way of another example, the comparison module may include a comparison module 146 of the remote system 118. In this regard, the comparison modules 146 may include a set of program instructions stored in the memory 1120 of the remote system 118 and configured to cause the one or more processors 108 to execute a comparison operation between the between the energy usage of the one or more appliances 104 and the reference energy usage data for the selected energy usage metric.

In a further aspect, the negawatt measurement system 100 may include a display device (e.g., display device 126, display device 128, display device 130, and the like) communicatively coupled to the controller 106 and configured to display an amount of energy savings, as reported by the controller 106, based on the comparison of measured energy usage of the one or more appliances 104 and the one or more received sets of reference energy data. For example, the display device may include, but is not limited to, a display device 126 positioned proximate to the one or more appliances 104, a display device 128 of the one or more appliances 104, or a display device 130 of a remote system 118.

In a general sense, the display devices 126, 128, and/or 130 may include a visual or audio display device. For example, in the case of visual display, the display device may include, but is not limited to a liquid crystal display (LCD), one or more light emitting diodes (LEDs), one or more organic LEDs (OLEDs), or a cathode rate tube (CRT). In this regard, the one or more display devices may be configured to utilize text-based messages, symbols, indicia, or other identifiable visual characters, or symbols. In the case of audio display, the display devices may include, but are not limited to, a speaker. In this regard, information related to the energy savings of the one or more appliances 104 may be relayed to a user via an audible signal, such as, but not limited to, an audible announcement, a tone, a simulated voice, or a series of tones.

In a further aspect, the one or more processors 108 may be configured to report the results of the energy usage comparison to one or more memory devices. For example, the one or more processors 108 may transmit the results of the energy savings comparison to a savings database 132 maintained in the memory 112 of the controller 106, a savings database 134 maintained in the memory 114 of the one or more appliances 104, and/or the savings database 136 maintained in the memory 120 of the remote system 118. In this regard, the one or more processors 108 may report the energy savings in terms of i) accumulated energy savings over a selected time period; ii) time-averaged energy savings over a selected time period; and an iii) operation-averaged energy savings over a selected number of operation cycles of the one or more appliances. Further, the one or more processors 108 may report the energy savings in terms of i) a difference between the measured energy usage of the appliance 104 and the reference energy data; ii) a ratio between the measured energy usage of the appliance 104 and the reference energy data; and iii) a relative difference between the measured energy usage of the appliance 104 and the reference energy data.

In a further embodiment, the negawatt measurement system 100 may provide a financial benefit to a user based on the reported amount of energy savings from the controller 106. For example, upon receiving a report from the controller 106, a remote system 118 communicatively coupled to the controller 106 and maintained by an entity, such as, but not limited to, a utility company, an appliance manufacturer, a governmental entity, and the like, may provide a financial benefit to a user based on the reported energy savings from the controller 106. In this regard, after a remote system 118 receives the reported energy savings from the controller 106, the remote system 118 may determine a financial benefit associated with the reported energy savings and then transmit a notification of a financial benefit to the controller 106 or to another user device (e.g., smartphone, computer, and the like) via network 124. Alternatively, the remote system 118 may determine a financial benefit associated with the reported energy savings and then transmit a notification of the financial benefit to the entity maintaining the remote system 118. Further, the remote system 118 may provide the financial benefit electronically to user by transmitting the financial benefit to an electronic-based financial account (e.g., bank account, utility account, and the like) of the user via network 124. In some embodiments, the financial benefit may include, but is not limited to, a rebate, a credit, or a payment.

In a further aspect, the negawatt measurement system 100 further includes one or more user interface devices 142 communicatively coupled to the one or more processors 108 of the controller 106. The one or more user interface device 142 may include any user interface device known in the art. For example, the one or more user interface devices 142 may include a keyboard, a touchpad, a touchscreen integrated with a display device, a mouse, and the like.

FIG. 1B illustrates a block diagram view of a negawatt measurement system 100, in accordance with an alternative embodiment of the present invention. The system 100 for measuring negawatt usage by one or more appliances may alternatively express the energy savings of one or more appliances in terms of energy "cost" savings as function of monetary savings to the user. In this regard, the one or more processors 108 of the controller 106 may further be configured to receive cost of energy data for at least a portion of the time interval in which the energy meter 102 performed one or more the energy usage measurements of the one or more appliances. For example, the one or more processors 108 of the controller 106 may receive energy cost data indicative of cost of energy usage of the one or more appliances 104 from a selected cost reference source for at least a portion of the energy usage measurement. For instance, the one or more processors 108 may receive energy cost data from a energy cost database 148 maintained in the memory 114 of appliance 104, an energy cost database 147 maintained in the memory 112 of controller 106, or an energy cost database 144 maintained in memory 120 of remote system 118 (i.e., network accessible cost of energy database, and the like).

In a further embodiment, the controller 106 may then report the amount of energy cost savings based on the comparison of measured energy usage of the one or more appliances 104 and the one or more received sets of reference energy data and the received energy cost data to a memory device (e.g., controller memory 112, appliance memory 114, remote memory 120, and the like) or a display device (e.g., display 126, display 128, display 130, and the like). For example, the one or more processors 108 of the controller 106 may transmit the energy cost savings to at least one of an energy cost savings database 150 maintained in the memory 112 of the controller 106, an energy cost savings database 152 maintained in the memory 114 of the one or more appliances 104, or the energy cost savings database 154 maintained in the memory 120 of the remote system 118.

In a further embodiment, the negawatt measurement system 100 may provide a financial benefit to a user based on the reported amount of energy cost savings from the controller 106. For example, upon receiving a report from the controller 106, a remote system 118 communicatively coupled to the controller 106 and maintained by an entity, such as, but not limited to, a utility company, an appliance manufacturer, a governmental entity, and the like, may provide a financial benefit to a user based on the reported energy cost savings from the controller 106. In this regard, after a remote system 118 receives the reported energy savings from the controller 106, the remote system 118 may determine a financial benefit associated with the reported energy cost savings and then transmit a notification of a financial benefit to the controller 106 or to another user device via network 124. Alternatively, the remote system 118 may determine a financial benefit associated with the reported energy cost savings and then transmit a notification of the financial benefit to the entity maintaining the remote system 118. Further, the remote system 118 may provide the financial benefit electronically to user by transmitting the financial benefit to an electronic-based financial account of the user via network 124.

Following are a series of flowcharts depicting implementations. For ease of understanding, the flowcharts are organized such that the initial flowcharts present implementations via an example implementation and thereafter the following flowcharts present alternate implementations and/or expansions of the initial flowchart(s) as either sub-component operations or additional component operations building on one or more earlier-presented flowcharts. Those having skill in the art will appreciate that the style of presentation utilized herein (e.g., beginning with a presentation of a flowchart(s) presenting an example implementation and thereafter providing additions to and/or further details in subsequent flowcharts) generally allows for a rapid and easy understanding of the various process implementations. In addition, those skilled in the art will further appreciate that the style of presentation used herein also lends itself well to modular and/or object-oriented program design paradigms.

Figure 2:
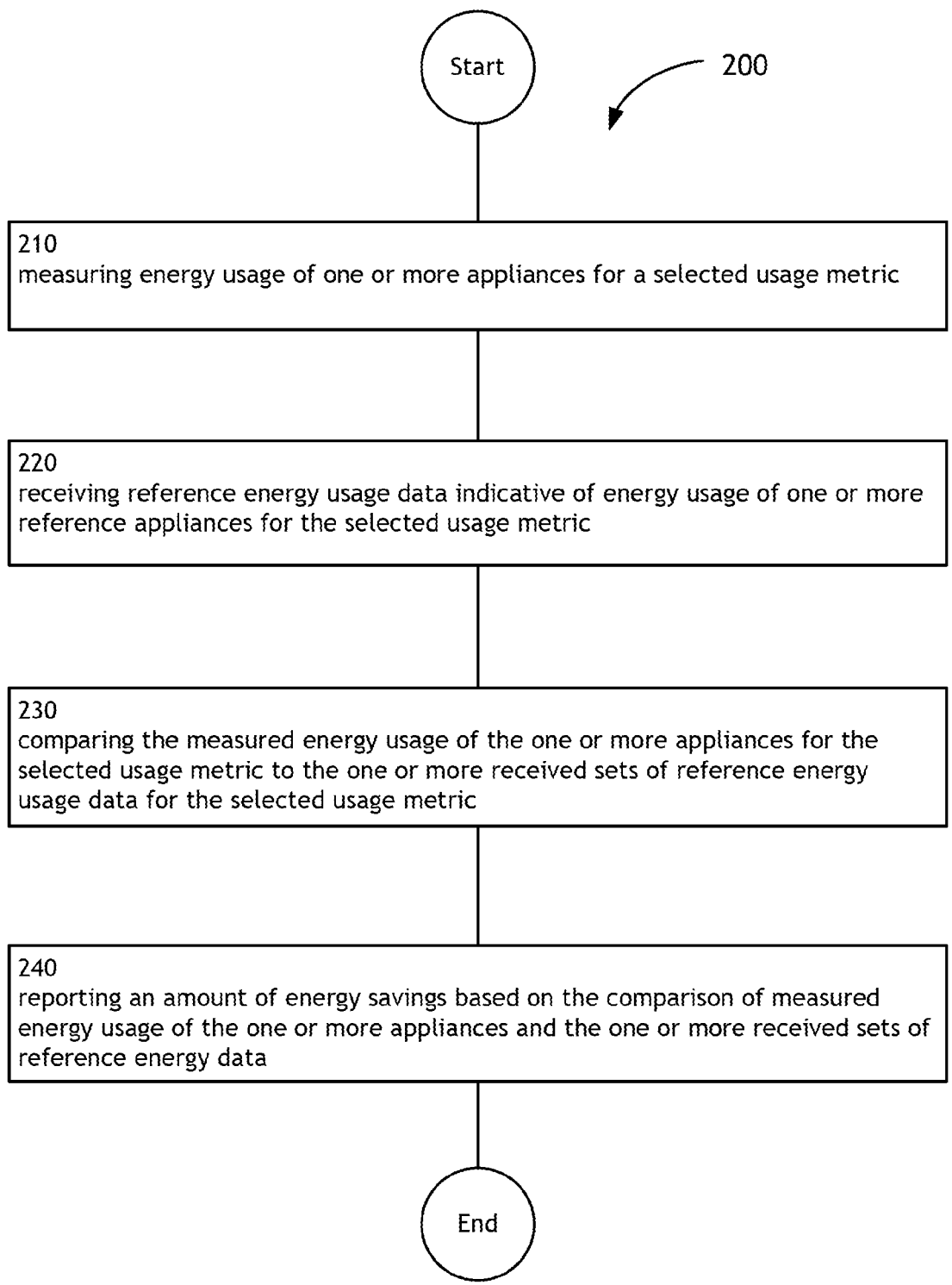
FIG. 2 is a high-level flowchart of a method for measuring negawatt usage of one or more appliances.

FIG. 2 illustrates an operational flow 200 representing example operations related to measuring negawatt usage of an appliance. In FIG. 2 and in following figures that include various examples of operational flows, discussion and explanation may be provided with respect to the above-described examples of FIGS. 1A and 1B, and/or with respect to other examples and contexts. However, it should be understood that the operational flows may be executed in a number of other environments and contexts, and/or in modified versions of FIGS. 1A and 1B. Also, although the various operational flows are presented in the sequence(s) illustrated, it should be understood that the various operations may be performed in other orders than those which are illustrated, or may be performed concurrently.

After a start operation, the operational flow 200 moves to a measuring operation 210. The measuring operation 210 depicts measuring energy usage of one or more appliances 104 for a selected usage metric. For example, as shown in FIGS. 1A and 1B, the system 100 may include one or more measurement devices (e.g., electrical power meter, heat measurement device, and the like) configured to measure at least a portion of the amount of energy used by an appliance 104 for a selected usage metric (e.g., selected time interval, selected number of appliances operation cycles, and the like).

Then, reference receiving operation 220 depicts receiving reference energy usage data indicative of energy usage of one or more reference appliances for the selected usage metric. For example, as shown in FIGS. 1A and 1B, one or more processors 108 of the controller 106 may receive reference energy usage data indicative of energy usage of one or more reference appliances for the selected usage metric from a selected reference appliance energy usage source (e.g., memory 114 of appliance 104, memory 120 of remote system 118, or memory 112 of controller 106).

Then, comparing operation 230 depicts comparing the measured energy usage of the one or more appliances 104 for the selected usage metric to the one or more received sets of reference energy usage data for the selected usage metric. For example, the one or more processors 108 of the controller 106 may compare the measured energy usage of the one or more appliances 104 for the selected usage metric to the one or more received sets of reference energy usage data for the selected usage metric. In this regard, the one or more processors 108 of the controller 106 may determine an amount of energy savings of the appliance 104 as measured relative to the received sets of reference energy usage data. For example, the one or more processors 108 may determine an absolute difference between the energy usage (e.g., time averaged energy usage, operation averaged energy usage, and the like) of the appliance 104 and the reference energy data associated with a reference energy appliance. By way of another example, the one or more processors 108 may determine a relative difference between the energy usage of the appliance 104 and the reference energy data associated with a reference energy appliance. Further, the one or more processors 108 may determine a ratio between the energy usage of the appliance 104 and the reference energy data associated with a reference energy appliance.

Then, reporting operation 240 depicts reporting an amount of energy savings based on the comparison of measured energy usage of the one or more appliances and the one or more received sets of reference energy data. For example, the one or more processors 108 of the controller 106 may display results of the energy comparison of operation 230 on a display device (e.g., audio display device, visual display device, and the like). By way of another example, the one or more processors 108 of the controller 106 may store the results of the energy comparison of operation 230 in an energy savings database (e.g., database 130, database 134, database 136) maintained on memory device (e.g., controller memory 112, appliance memory 114, remote memory 120, and the like).

Figure 3:
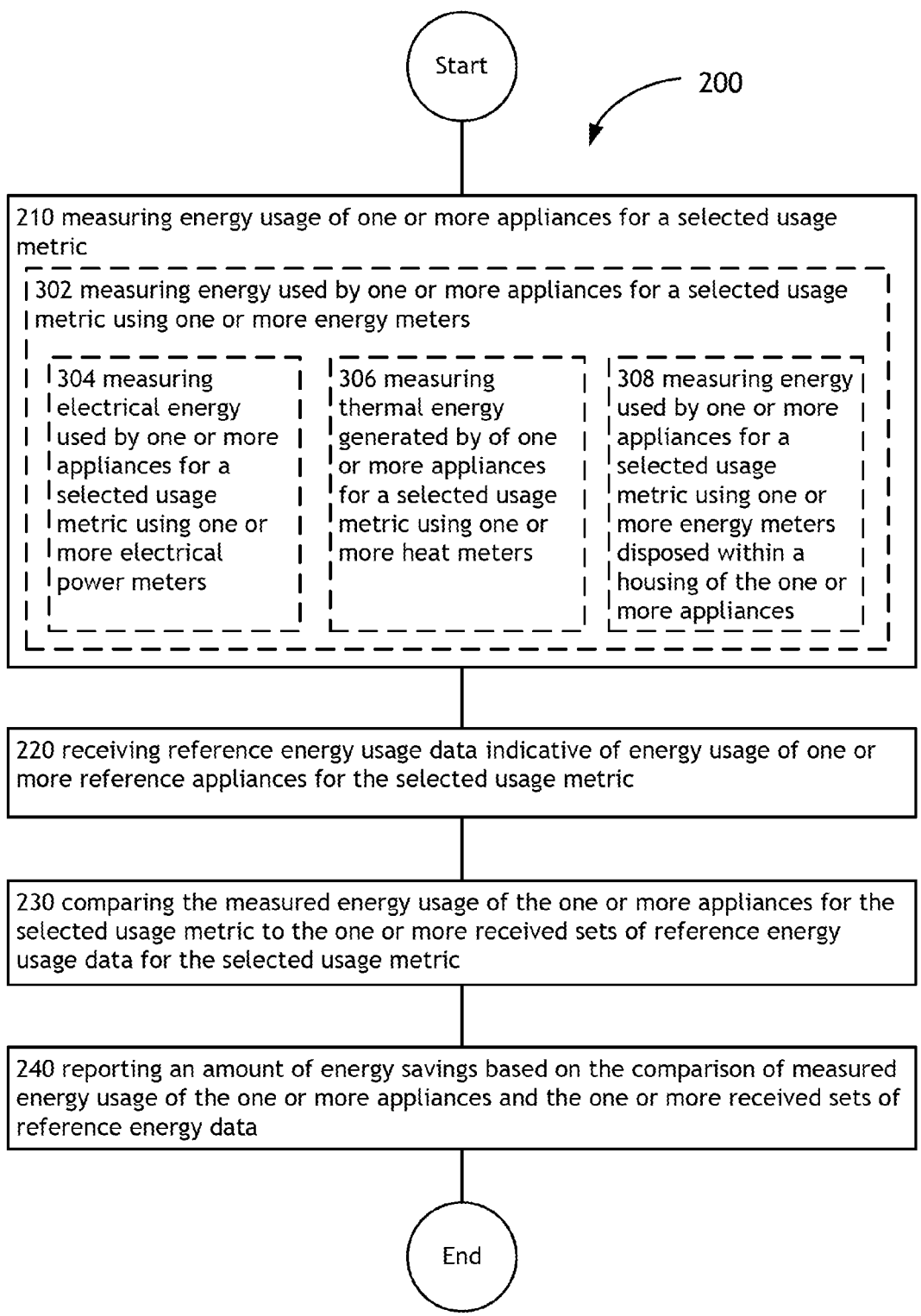
FIGS. 3 through 18 are high-level flowcharts depicting alternate implementations of FIG. 2.

FIG. 3 illustrates alternative embodiments of the example operational flow 200 of FIG. 2. FIG. 3 illustrates example embodiments where the measuring operation 210 may include at least one additional operation. Additional operations may include operations 302, 304, 306 and/or 308.

The operation 302 illustrates measuring energy used by one or more appliances 104 for a selected usage metric using one or more energy meters 102. For example, as shown in FIGS. 1A and 1B, an electrical-based energy meter wired in a common circuit (e.g., local household circuit) with the one or more appliances 104 may measure energy used by the one or more appliances 104 for a selected usage metric using one or more energy meters. In this regard, the electrical-based energy meter may measure one or more electrical parameters (e.g., voltage, current, and the like) of the one or more appliances 104 in order to characterize the amount of energy used by the one or more appliances 104 over a selected usage metric. For instance, the electrical-based energy meter may be wired in a parallel configuration with the one or more appliances 104. In another instance, the electrical-based energy meter may be wired in a series configuration with the one or more appliances 104. It is further contemplated that the one or more energy meters 102 may include multiple individual electrical-based energy meters, wherein the measurement results of the electrical-based energy meters may be combined by the one or more processors 108 in order to characterize the energy usage of the one or more appliances 104 over a selected usage metric.

In a further embodiment, operation 304 illustrates measuring electrical energy used by one or more appliances 104 for a selected usage metric using one or more electrical power meters. For example, as shown in FIGS. 1A and 1B, an electric power meter wired in a common circuit (e.g., local household circuit) with the one or more appliances 104 may measure energy used by one or more appliances 104 for a selected usage metric. In this regard, the electrical power meter may be configured to measure the instantaneous or time-averaged electrical power utilized by the one or more appliances 104. The one or more processors 108 may then determine the amount of energy used by the appliance over a selected usage metric using the measured electric power measurements provided by the one or more electric power meters. Further, the one or more electrical power meters may be wired in series with the one or more appliances 104.

In another embodiment, operation 306 illustrates measuring thermal energy generated by of one or more appliances 104 for a selected usage metric using one or more heat meters. For example, as shown in FIGS. 1A and 1B, one or more heat meters placed in contact or located in proximity with the one or more appliances 104 may measure a portion of the thermal energy generated by the one or more appliances 104. The one or more processors 108 may then utilize the thermal energy measurements of the one or more heat meters to estimate the amount of energy used by the one or more appliances 104 for a selected usage metric. In this regard, the system 100 may include one or more heat meters (e.g., single heat meter or multiple heat meters) arranged at selected positions relative the one or more appliances 104. Utilizing a pre-programmed predictive algorithm the one or more processors 108 may aggregate the measurements from each of the one or more heat meters in order to provide an estimate for the amount of energy used by the one or more appliances over a selected usage metric, such as a selected number of appliances operations or a selected amount of time. Those skilled in the art should recognize that the source of heating is associated with the Joule heating present in any operating electrical circuit. It is further contemplated that the system 100 may utilize one or more heat meters in conjunction with one or more electrical-based meters (e.g., power meter). For example, the system 100 may include both one or more electrical power meters and one or more heat meters configured to measure electrical energy used and thermal energy generated by the one or more appliances 104. It is further noted herein that the one or more processors 108 may provide an energy usage estimate for the one or more appliances 104 using an algorithm configured to conjunctively utilized thermal energy measurements from one or more heat meters and an electrical energy measurement from one or more electrical power meters.

In a further embodiment, operation 308 illustrates measuring energy used by one or more appliances 104 for a selected usage metric using one or more energy meters 102 disposed within a housing of the one or more appliances 104. For example, an electrical power meter disposed within the housing of the one or more appliances 104 may measure energy used by one or more appliances 104 for a selected usage metric. In another example, one or more heat meters disposed within the housing of the one or more appliances 104 may measure thermal energy generated by one or more appliances 104 for a selected usage metric and used to determine the amount of energy used by the one or more appliances 104.

Figure 4:
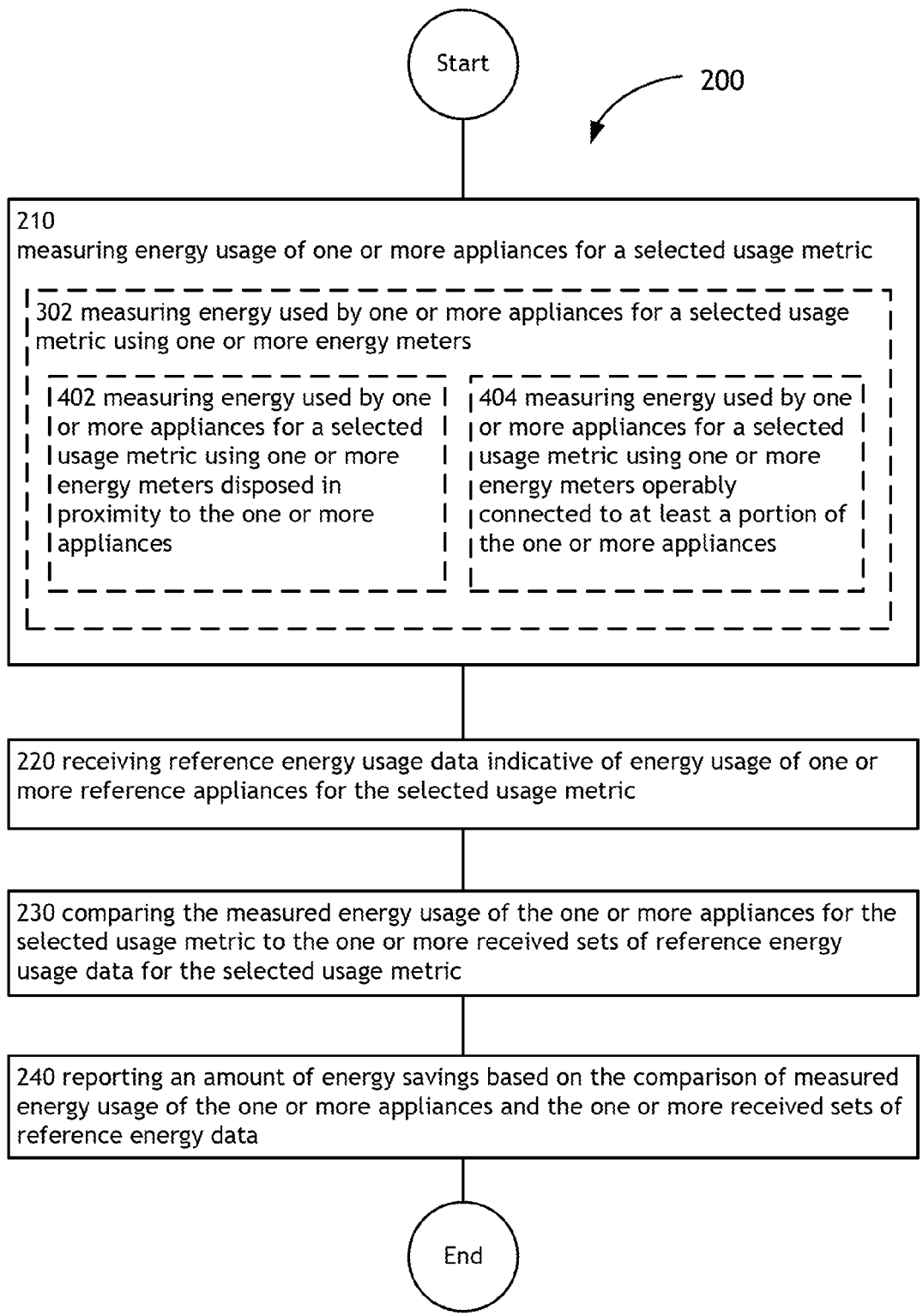

FIG. 4 illustrates alternative embodiments of the example operational flow 200 of FIG. 2. FIG. 4 illustrates example embodiments where the measuring operation 210 may include at least one additional operation. Additional operations may include an operation 402, and/or operation 404.

In a further embodiment, operation 402 illustrates measuring energy used by one or more appliances for a selected usage metric using one or more energy meters 102 disposed in proximity to the one or more appliances 104. For example, as shown in FIGS. 1A and 1B, one or more energy meters 102 may be disposed about the one or more appliances 104 according to a selected spatial arrangement and utilized to measure energy usage of the one or more appliances 104 for a selected usage metric. For instance, an electrical power meter electrically coupled to the one or more appliances 104 and positioned at a selected position relative to the one or more appliances 104 may measure electrical energy used by one or more appliances 104 for a selected usage metric. For instance, a portable electrical power meter may be used to retrofit the one or more appliances 104 with negawatt measurement capabilities. In this regard, the one or more energy meters 102 may reside in a housing different from the housing of the one or more appliances 104, with the one or more energy meters 102 being reversibly electrically couplable to the one or more appliances 104. In another example, one or more heat meters positioned in proximity to the one or more appliances 104 may measure thermal energy generated by one or more appliances 104 for a selected usage metric and determine the amount of energy used by the one or more appliances 104. In this regard, the one or more processors 108 may be configured to execute an algorithm pre-programmed to estimate the energy usage of the one or more appliances 104 based on the geometrical arrangement of the one or more heat meters relative to the one or more appliances 104.

In another embodiment, operation 404 illustrates measuring energy used by one or more appliances 104 for a selected usage metric using one or more energy meters 102 operably connected to at least a portion of the one or more appliances 104. For example, as shown in FIGS. 1A and 1B, an energy meter 102 mechanically coupled to a portion of the one or more appliances 104 may measure energy used by one or more appliances 104 for a selected usage metric. For instance, an energy meter 102 may be mechanically coupled to a surface (e.g., external surface or internal surface) of the one or more appliances 104. In another example, one or more heat meters mechanically and thermally coupled to a surface of the housing (e.g., interior side of housing or exterior side of housing) of the one or more appliances may measure thermal energy generated by one or more appliances 104 for a selected usage metric determine the amount of energy used by the one or more appliances 104. In this regard, the housing of the one or more appliances 104 may act to serve as a thermal absorbing medium that absorbs thermal energy generated by the electrical circuitry of the one or more appliances 104. In this regard, the one or more processors 108 may be configured to execute an algorithm pre-programmed to estimate the energy usage of the one or more appliances 104 based on the geometrical arrangement and material properties of the housing and the heat measurements at one or more locations of the housing of the one or more appliances 104.

Figure 5:
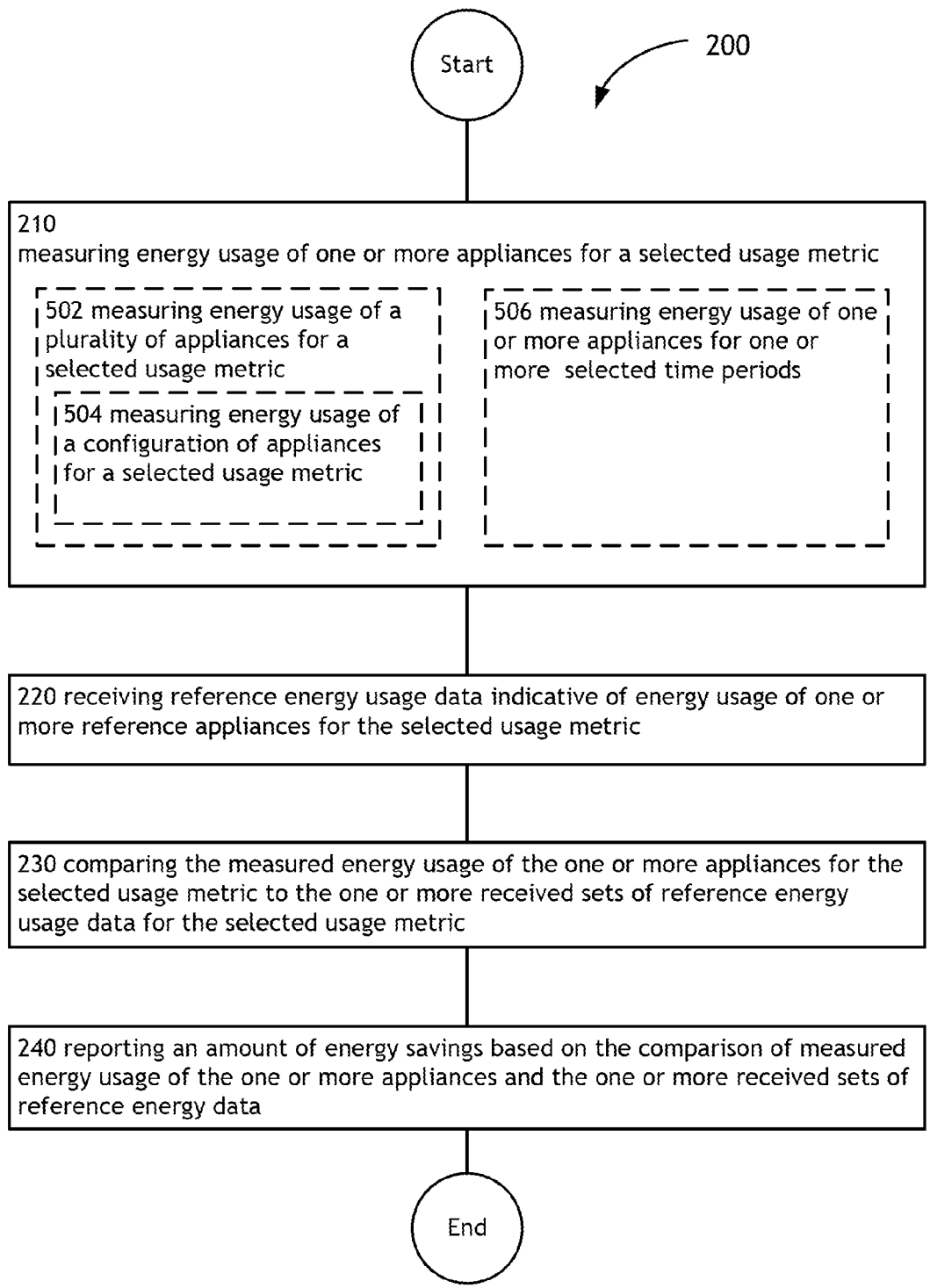

FIG. 5 illustrates alternative embodiments of the example operational flow 200 of FIG. 2. FIG. 5 illustrates example embodiments where the measuring operation 210 may include at least one additional operation. Additional operations may include an operation 502, 504 and/or operation 506.

The operation 502 illustrates measuring energy usage of a plurality of appliances 104 for a selected usage metric. For example, as shown in FIGS. 1A and 1B, one or more energy meters 102 may measure energy usage of a set of appliances 104 for a selected usage metric. The set of appliances 104 may include a first appliance, a second appliance, and up to and including an Nth appliance. For instance, the one or more energy meters 102 may measure the aggregated energy usage of the appliances 104 in a selected room of a residence. In another instance, the one or more energy meters 102 may measure the aggregated energy usage of the appliances 104 of a selected type (e.g., laundry-based appliances, kitchen-based appliances, entertainment-based devices, and the like). In this regard, the one or more energy meters 102 may measure energy usage of any grouping of appliances 104 as selected by a user.

Further, operation 504 illustrates measuring energy usage of a configuration of appliances for a selected usage metric. For example, the one or more energy meters 102 may measure the aggregated energy usage of a configuration of appliances 104. For instance, a configuration of appliances 104 may include a selected set of laundry appliances, such as a washer and dryer. In another instance, a configuration of appliances 104 may include a selected set of kitchen appliances, such as refrigerator, dishwasher, microwave, and oven. It is further contemplated that the one or more processors 108 may then compare the energy usage of a selected appliance configuration with reference energy usage data associated with the same appliance configuration.

The operation 506 illustrates measuring energy usage of one or more appliances 104 for one or more selected time periods. For example, as shown in FIGS. 1A and 1B, the one or more energy meters 102 may measure the energy used by one or more appliances 104 for one or more selected time periods. For instance, the one or more energy meters 102 may measure the total energy used by one or more appliances 104 over a selected time interval (e.g., 1 hour, 1 day, 1 month, 1 year, and the like). In another instance, the one or more energy meters 102 may measure the total energy used by one or more appliances 104 over a selected number of time interval. In yet another instance, the one or more energy meters 102 may measure the total energy used by one or more appliances 104 over a cumulative time period. In this regard, the energy meter 102 may begin an energy usage measurement operation upon receiving a start instruction from the controller 106 and end the energy usage measurement operation upon receiving a stop instruction from the controller 106.

Figure 6:
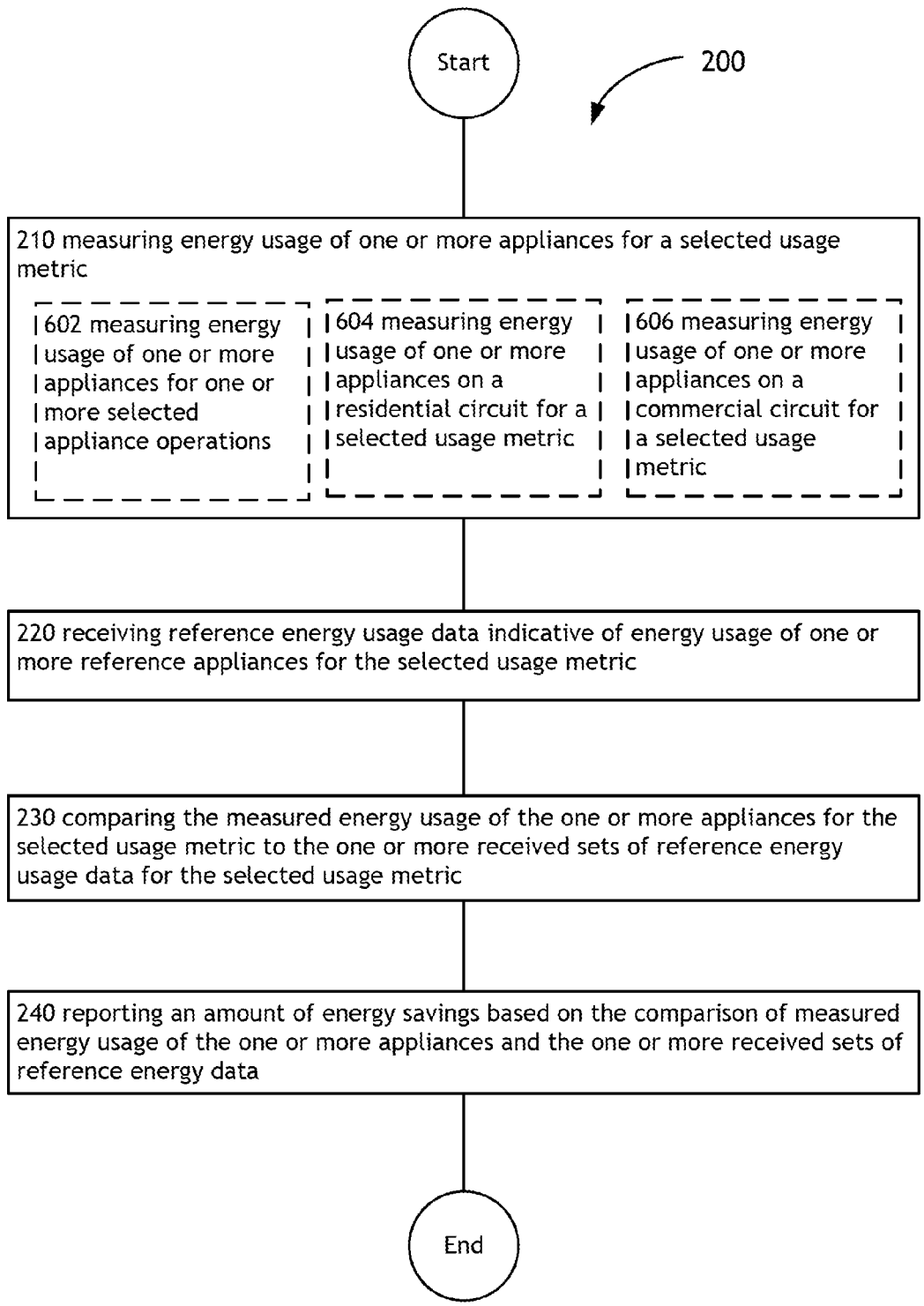

FIG. 6 illustrates alternative embodiments of the example operational flow 200 of FIG. 2. FIG. 6 illustrates example embodiments where the measuring operation 210 may include at least one additional operation. Additional operations may include an operation 602, 604 and/or operation 606.

The operation 602 illustrates measuring energy usage of one or more appliances for one or more selected appliance operations. For example, as shown in FIGS. 1A and 1B, the one or more energy meters 102 may measure the energy used by one or more appliances 104 for a selected number of appliance operations. For example, as shown in FIGS. 1A and 1B, the one or more energy meters 102 may measure the energy used by a washer/dryer for a selected number of washing/drying cycles.

The operation 604 illustrates measuring energy usage of one or more appliances on a residential circuit for a selected usage metric. For example, as shown in FIGS. 1A and 1B, the one or more energy meters 102 may measure the energy used by one or more appliances 104 on a residential circuit for a selected usage metric.

The operation 606 illustrates measuring energy usage of one or more appliances on a commercial circuit for a selected usage metric. For example, as shown in FIGS. 1A and 1B, the one or more energy meters 102 may measure the energy used by one or more appliances 104 on a commercial circuit for a selected usage metric.

Figure 7:
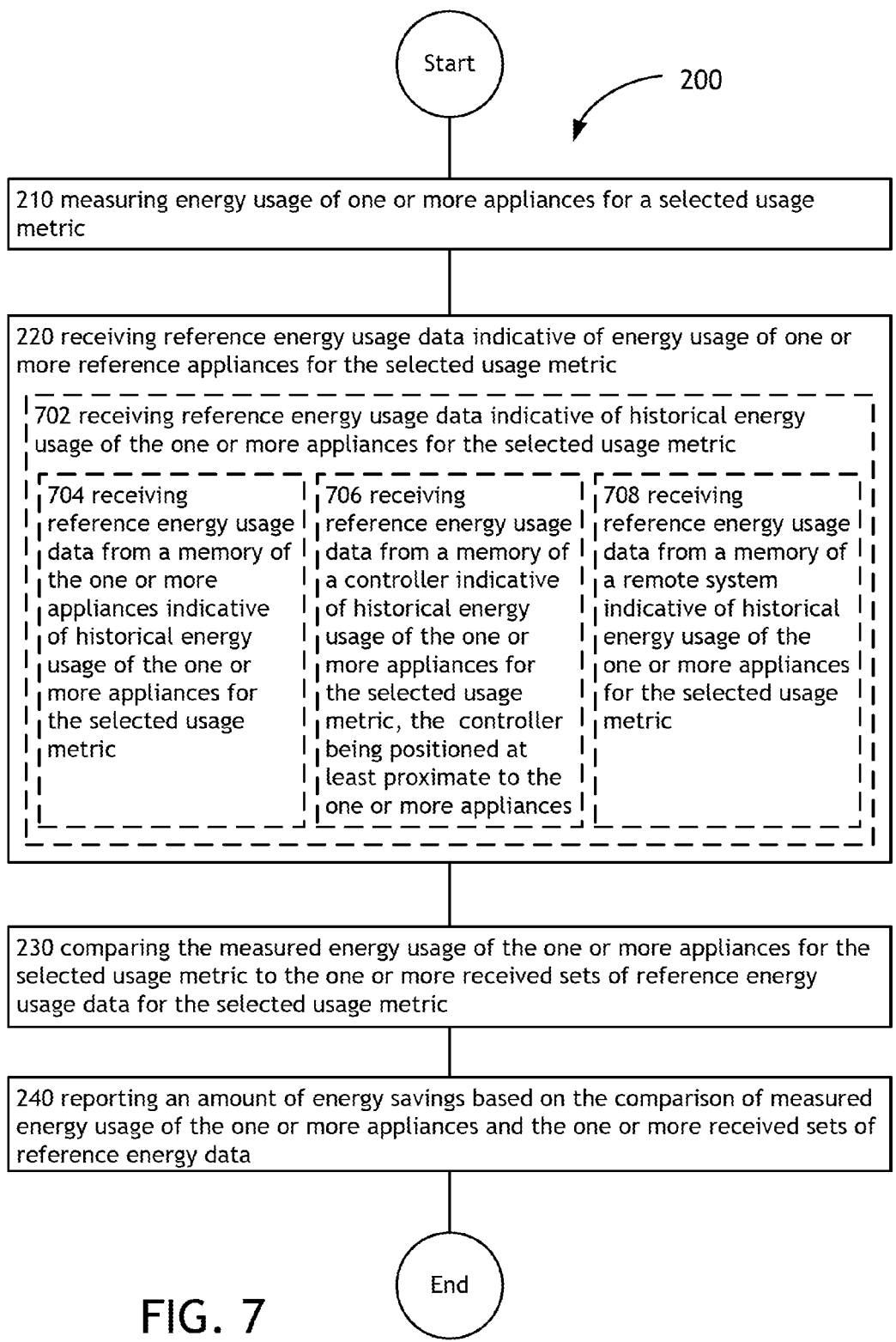

FIG. 7 illustrates alternative embodiments of the example operational flow 200 of FIG. 2. FIG. 7 illustrates example embodiments where the reference receiving operation 220 may include at least one additional operation. Additional operations may include an operation 702, 704, 706 and/or operation 708.

The operation 702 illustrates receiving reference energy usage data indicative of historical energy usage of the one or more appliances 104 for the selected usage metric. For example, as shown in FIGS. 1A and 1B, the one or more processors 108 of the controller 106 may receive reference energy usage data indicative of historical energy usage of the one or more appliances 104 from a reference energy usage database (e.g., database 110, database 116, database 122 and the like) maintained on a memory device. In this regard, the controller 106 may act to generate a historical energy usage database for one or more appliances 104 by storing energy usage data associated with the one or more appliances 104 in a reference energy database maintained in a memory communicatively coupled to the one or more processors 108 of the controller 106. Reference energy usage data stored in the generated historical reference energy database may then be transmitted from the memory device to the one or more processors 108 of the controller 106 via network 124.

In a further embodiment, operation 704 illustrates receiving reference energy usage data from a memory 114 of the one or more appliances 104 indicative of historical energy usage of the one or more appliances for the selected usage metric. For example, as shown in FIGS. 1A and 1B, the one or more processors 108 of the controller 106 may receive reference energy usage data indicative of historical energy usage of the one or more appliances 104 from a reference energy usage database 116 maintained in a memory device 114 of the one or more appliances 104 via a wireline or wireless data coupling between the one or more appliances 104 and the controller 106.

In a further embodiment, operation 706 illustrates receiving reference energy usage data from a memory 112 of a controller 106 indicative of historical energy usage of the one or more appliances 104 for the selected usage metric, the controller 104 being positioned at least proximate to the one or more appliances 104. For example, as shown in FIGS. 1A and 1B, the one or more processors 108 of the controller 106 may receive reference energy usage data indicative of historical energy usage of the one or more appliances 104 for a selected usage metric from a reference energy database 110 maintained on a memory device 112 of controller 106.

In a further embodiment, operation 708 illustrates receiving reference energy usage data from a memory 120 of a remote system 118 indicative of historical energy usage of the one or more appliances 104 for the selected usage metric. For example, as shown in FIGS. 1A and 1B, the one or more processors 108 of the controller 106 may receive reference energy usage data indicative of historical energy usage of the one or more appliances 104 for a selected usage metric from a reference energy database 122 maintained on a memory device 120 of a remote system 118 via network 124.

Figure 8:
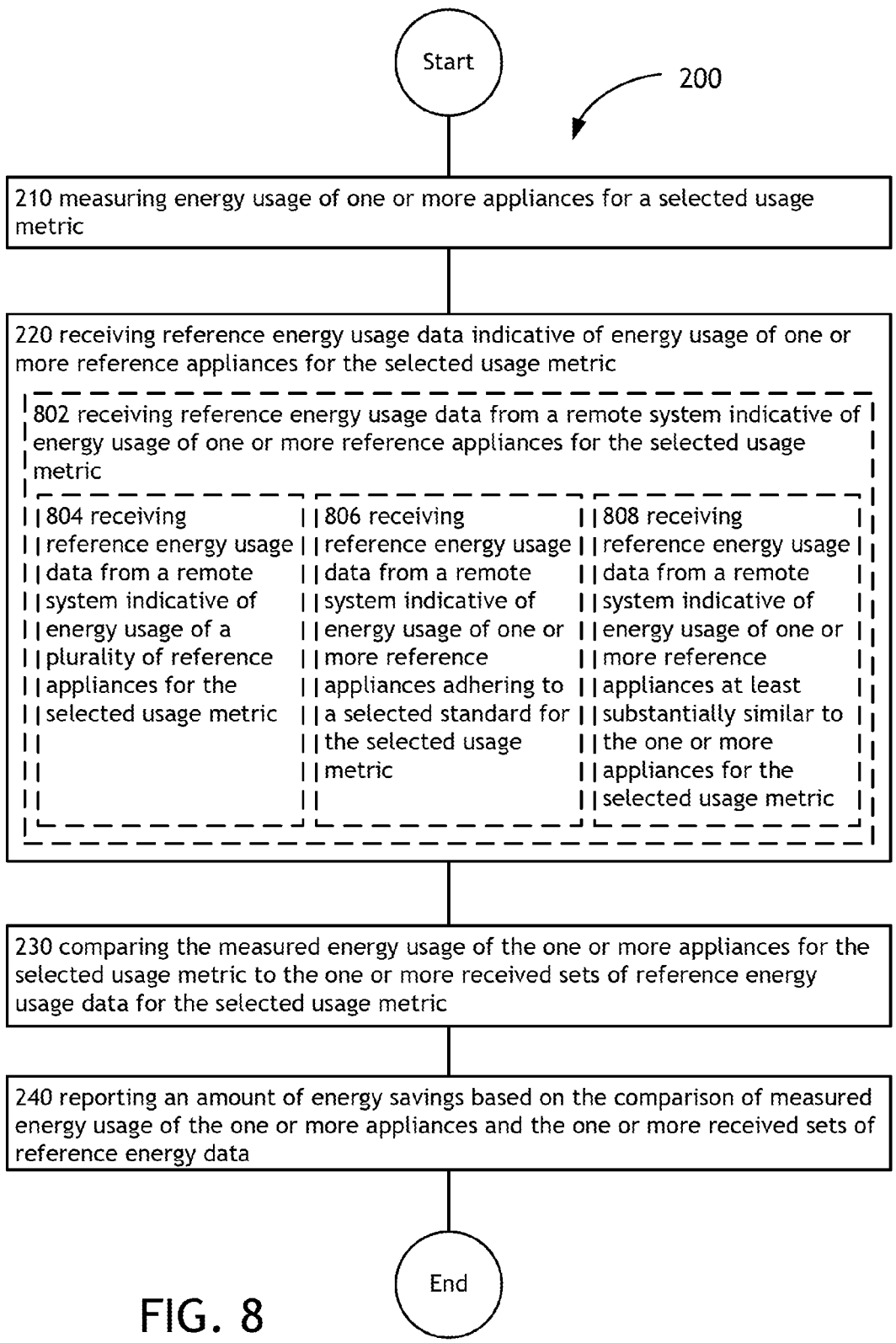

FIG. 8 illustrates alternative embodiments of the example operational flow 200 of FIG. 2. FIG. 8 illustrates example embodiments where the reference receiving operation 220 may include at least one additional operation. Additional operations may include an operation 802, 804, 806 and/or operation 808.

The operation 802 illustrates receiving reference energy usage data from a remote system 118 indicative of energy usage of one or more reference appliances for the selected usage metric. For example, as shown in FIGS. 1A and 1B, the one or more processors 108 of the controller 106 may receive reference energy usage data indicative of energy usage of one or more reference appliances for the selected usage metric from a reference energy database 122 maintained on a memory device 120 of a remote system 118. The one or more processors 108 and the remote system 118 may both be connected to the network 124 via network interface devices 138 and 140, respectively. In this regard, the remote system 118 may transmit reference energy usage data from the reference energy database 122 maintained on the memory device 120 to the one or more processors 108 of controller 106 via network 124.

In a further embodiment, operation 804 illustrates receiving reference energy usage data from a remote system 118 indicative of energy usage of a plurality of reference appliances for the selected usage metric. For example, as shown in FIGS. 1A and 1B, the one or more processors 108 of the controller 106 may receive reference energy usage data indicative of energy usage of a plurality of reference appliances for the selected usage metric from a reference energy database 122 maintained on a memory device 120 of a remote system 118 via network 124. In this regard, the remote system 118 may act to aggregate reference energy data from multiple reference appliances. For instance, the remote system 118 may act to aggregate reference energy data from multiple reference appliances from a selected geographic region (e.g., neighborhood, city, state, country, and the like). In one embodiment, the remote system 118 may feed reference data to the one or more processors 108 of the controller 106 for reference appliances residing in the same geographic region as the one or more appliances 104. In another instance, the remote system 118 may act to aggregate reference energy data from multiple reference appliances over a selected time period. In a further aspect, the multiple reference appliances may be identical to or similar in type (e.g., brand, model, and the like) as the one or more appliances 104. In another aspect, the multiple reference appliances may be of a different type than the one or more appliances 104.

In a further embodiment, operation 806 illustrates receiving reference energy usage data from a remote system indicative of energy usage of one or more reference appliances adhering to a selected standard for the selected usage metric. For example, as shown in FIGS. 1A and 1B, the one or more processors 108 of the controller 106 may receive reference energy usage data indicative of energy usage of one or more reference appliances adhering to a selected standard for the selected usage metric from a reference energy database 122 maintained on a memory device 120 of a remote system 118 via network 124. In this regard, the remote system 118 may act to collect reference energy data from one or more reference appliances adhering to a selected standard. For instance, the selected standard may include, but is not limited to, standard defined by an industry (e.g., industry trade association), a standard defined by a manufacturer, a standard defined by a consumer advocacy group, and the like.

In a further embodiment, operation 808 illustrates receiving reference energy usage data from a remote system 118 indicative of energy usage of one or more reference appliances at least substantially similar to the one or more appliances 104 for the selected usage metric. For example, as shown in FIGS. 1A and 1B, the one or more processors 108 of the controller 106 may receive reference energy usage data indicative of energy usage for one or more references appliances similar or identical to the one or more appliances 104 for the selected usage metric from a reference energy database 122 maintained on a memory device 120 of a remote system 118 via network 124. In this regard, the remote system 118 may act to collect reference energy data from one or more reference appliances identical to or at least similar to the one or more appliances 104. The remote system 118 may then transmit the reference energy data to the one or more processors 108 of the controller 106 via the network 124.

Figure 9:
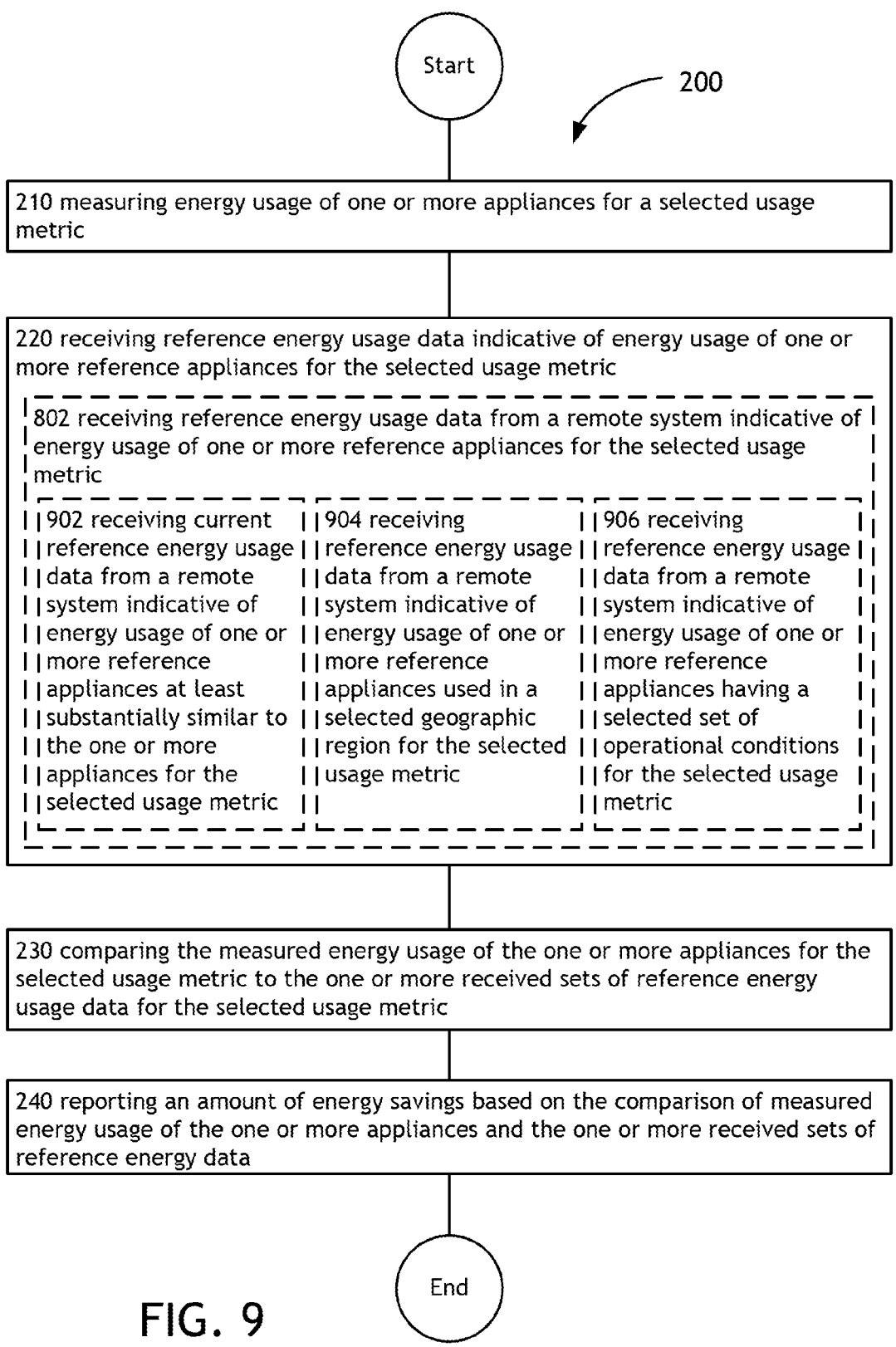

FIG. 9 illustrates alternative embodiments of the example operational flow 200 of FIG. 2. FIG. 9 illustrates example embodiments where the reference receiving operation 220 may include at least one additional operation. Additional operations may include an operation 902, 904, and/or operation 906.

In a further embodiment, operation 902 illustrates receiving current reference energy usage data from a remote system indicative of energy usage of one or more reference appliances at least substantially similar to the one or more appliances for the selected usage metric. For example, as shown in FIGS. 1A and 1B, the one or more processors 108 of the controller 106 may receive current reference energy usage data indicative of energy usage for one or more references appliances similar or identical to the one or more appliances 104 for the selected usage metric from a reference energy database 122 maintained on a memory device 120 of a remote system 118 via network 124. In this regard, the remote system 118 may act to collect reference energy data from one or more reference appliances identical to or at least similar to the one or more appliances 104 and, in real-time or near real-time, transmit the reference energy data to the one or more processors 108 of the controller 106 via the network 124.

In a further embodiment, operation 904 illustrates receiving reference energy usage data from a remote system 118 indicative of energy usage of one or more reference appliances used in a selected geographic region for the selected usage metric. For example, as shown in FIGS. 1A and 1B, the one or more processors 108 of the controller 106 may receive reference energy usage data indicative of energy usage for one or more references appliances used in a selected geographic region for the selected usage metric from a reference energy database 122 maintained on a memory device 120 of a remote system 118 via network 124. For instance, the remote system 118 may act to collect reference energy data from one or more reference appliances used in a geographic region (e.g., neighborhood, city, state, country and the like) common to the one or more appliances 104 and transmit the reference energy data to the one or more processors 108 of the controller 106 via the network 124. In another instance, the remote system 118 may act to collect reference energy data from one or more reference appliances used in a geographic region different from the geographic region of the one or more appliances 104 and transmit the reference energy data to the one or more processors 108 of the controller 106 via the network 124.

In a further embodiment, operation 906 illustrates receiving reference energy usage data from a remote system indicative of energy usage of one or more reference appliances having a selected set of operational conditions for the selected usage metric. For example, as shown in FIGS. 1A and 1B, the one or more processors 108 of the controller 106 may receive reference energy usage data indicative of energy usage for one or more references appliances having a selected set of operational conditions for the selected usage metric from a reference energy database 122 maintained on a memory device 120 of a remote system 118 via network 124. For instance, the remote system 118 may act to collect reference energy data from one or more reference appliances for a selected set of operational conditions of the one or more appliances 104 and transmit the reference energy data to the one or more processors 108 of the controller 106 via the network 124. In one aspect, the one or more selected set of operational conditions may include, but are not limited to, conditions associated with the physical setting of the one or more appliances 104. For instance, an operational condition may include, but is not limited to, a physical attribute associated with the residence or building with which the one or more appliances 104 are implemented. For example, in the case of a heater/air conditioner, an operational condition may include, but is not limited to, the average outdoor temperature of the geographic region the appliance 104 is implemented, the orientation (e.g., relative to the Sun) of the building the heater/air conditioner is implemented, the average humidity of the geographic region the appliance 104 is implemented, and the like.

Figure 10:
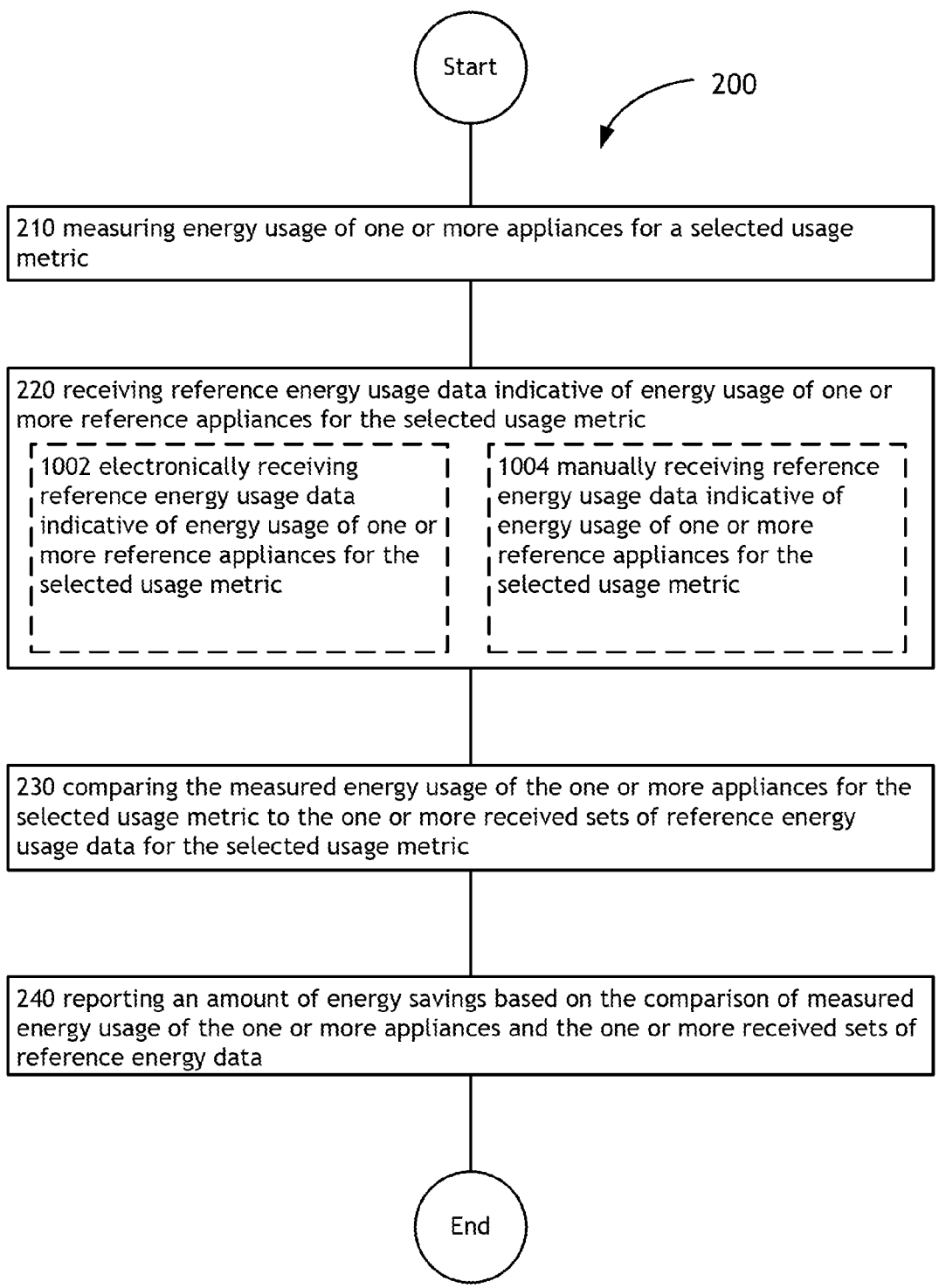

FIG. 10 illustrates alternative embodiments of the example operational flow 200 of FIG. 2. FIG. 10 illustrates example embodiments where the reference receiving operation 220 may include at least one additional operation. Additional operations may include an operation 1002 and/or operation 1004.

The operation 1002 illustrates electronically receiving reference energy usage data indicative of energy usage of one or more reference appliances for the selected usage metric. For example, as shown in FIGS. 1A and 1B, the one or more processors 108 of the controller 106 may electronically receive reference energy usage data indicative of energy usage for one or more references appliances for the selected usage metric from a reference energy database 122 maintained on a memory device 120 of a remote system 118 via network 124. For instance, the remote system 118 may include a remote server suitable for storing in memory the reference energy database 122 and coupled to network 124 via network interface device 140. Further, the one or more processors 108 of controller 106 may be coupled to the network 124 via network interface device 138, allowing the one or more processors 108 to selectably access the reference database 122 maintained on the memory of the server of the remote system 118.

The operation 1004 illustrates manually receiving reference energy usage data indicative of energy usage of one or more reference appliances for the selected usage metric. For example, as shown in FIGS. 1A and 1B, the one or more processors 108 of the controller 106 may manually receive reference energy usage data indicative of energy usage for one or more references appliances for the selected usage metric. For instance, reference energy data may be stored on a non-transitory medium (e.g., magnetic storage device, solid state memory device, optical storage device, and the like). The medium may then be manually transferred to the controller 106 by a user, wherein the one or more processors 108 may read the medium in order to obtain the reference energy data stored on the medium. In another instance, the reference energy data may be manually inputted into the controller 106 by a user via a user input device 142 (e.g., keyboard, touchpad interface, bezel mounted input device and the like) of the controller 106.

Figure 11:
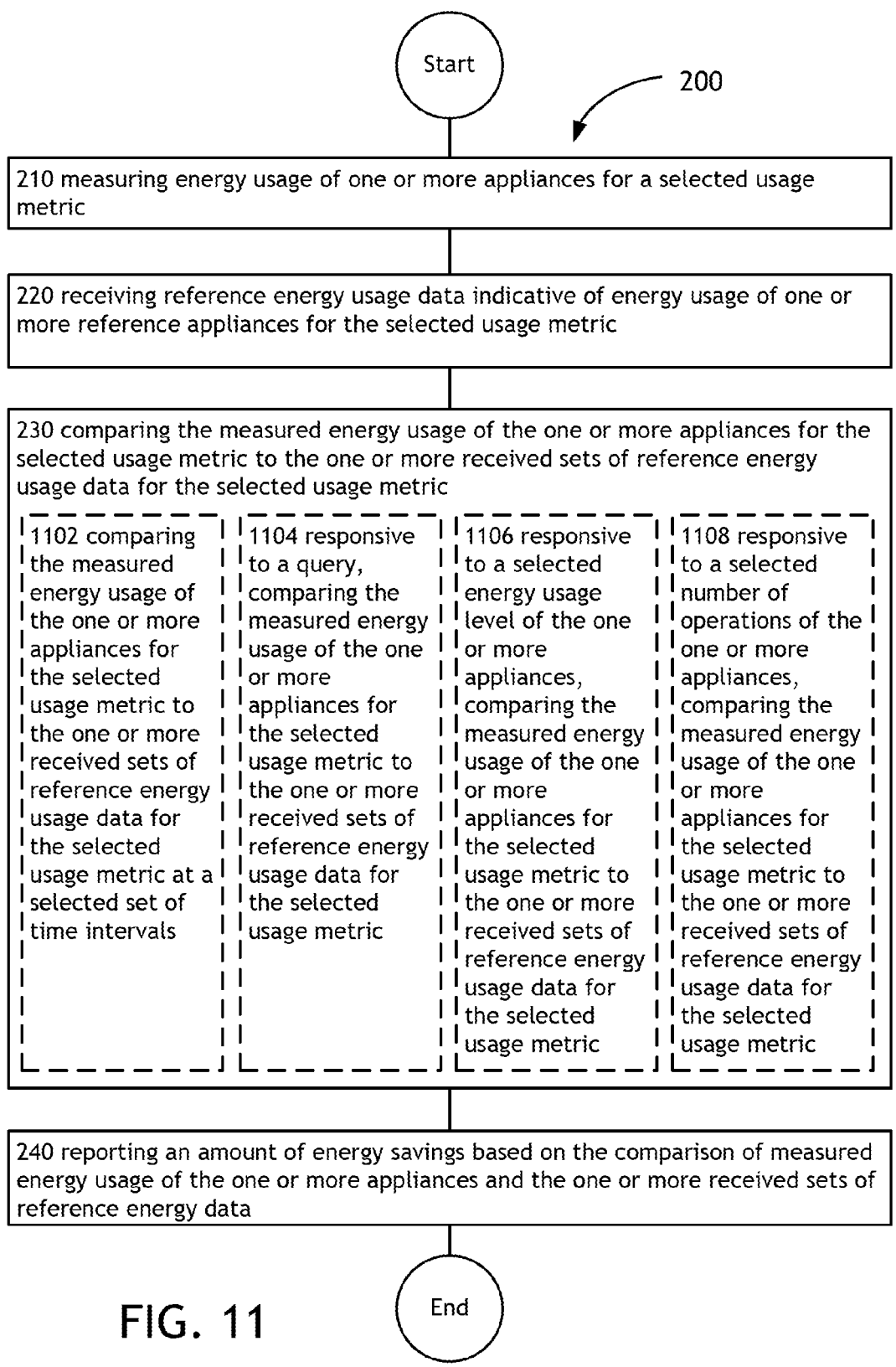

FIG. 11 illustrates alternative embodiments of the example operational flow 200 of FIG. 2. FIG. 11 illustrates example embodiments where the comparing operation 230 may include at least one additional operation. Additional operations may include an operation 1102, 1104, 1106, and/or operation 1108.

The operation 1102 illustrates comparing the measured energy usage of the one or more appliances 104 for the selected usage metric to the one or more received sets of reference energy usage data for the selected usage metric at a selected set of time intervals. For example, as shown in FIGS. 1A and 1B, the one or more processors 108 of controller 106 may compare the energy usage of the one or more appliances 104 as measured by the energy meter 102 to the one or more received sets of reference energy usage data for the selected usage metric at each of a selected set of time intervals. In this regard, the one or more processors 108 of the controller 106 may determine an amount of energy savings of the appliance 104 as measured relative to the received sets of reference energy usage data at each of a selected set of time intervals (e.g., selected number of hours, selected number of days, selected number of weeks, selected number of months, selected number of years and the like).

The operation 1104 illustrates, responsive to a query, comparing the measured energy usage of the one or more appliances 104 for the selected usage metric to the one or more received sets of reference energy usage data for the selected usage metric. For example, as shown in FIGS. 1A and 1B, the one or more processors 108 of controller 106 may compare the energy usage of the one or more appliances 104 as measured by the energy meter 102 to the one or more received sets of reference energy usage data for the selected usage metric in response to a query. For instance, a query may include a user generated query received by the one or more processors 108 from the user input device 142. In this regard, the one or more processors 108 of the controller 106 may determine an amount of energy savings of the appliance 104 as measured relative to the received set of reference energy usage data in response to a query signal from the user input device 142. In another instance, a query may include a query received from an additional system received by the one or more processors 108. In this regard, the one or more processors 108 of the controller 106 may determine an amount of energy savings of the appliance 104 as measured relative to the received set of reference energy usage data in response to a signal received from an additional system (e.g., received via network 124). For instance, the additional system (e.g., remote system 118) may include a system communicatively coupled to the controller 106 and maintained by an entity (e.g., manufacturer of appliance 104, governmental entity, consumer advocacy group, and the like) seeking to track the energy usage and/or efficiency of the one or more appliances 104.

The operation 1106 illustrates, responsive to a selected energy usage level of the one or more appliances 104, comparing the measured energy usage of the one or more appliances 104 for the selected usage metric to the one or more received sets of reference energy usage data for the selected usage metric. For example, as shown in FIGS. 1A and 1B, upon reaching a selected amount of used energy by the one or more appliances 104, the one or more processors 108 of controller 106 may compare the energy usage of the one or more appliances 104 as measured by the energy meter 102 to the one or more received sets of reference energy usage data for the selected usage metric. In this regard, the one or more processors 108 of the controller 106 may determine an amount of energy savings of the appliance 104 as measured relative to the received sets of reference energy usage data once the energy meter 102 has measured a selected level of energy usage by the one or more appliances 104. For instance, the selected level of energy usage by the one or more appliances 104 may include a selected amount of energy usage in a selected amount of time. For example, the one or more processors 108 may determine the amount of energy savings of the appliance 104 in the event the appliance 104 uses a selected amount of energy (e.g., 0.1 kWh, 1 kWh, 10 kWh, and the like) in one day. By way of another example, the one or more processors 108 may determine an amount of energy savings of the appliance 104 upon the measurement of an accumulated amount of energy usage by the appliance 104 that meets or exceeds a selected level of energy usage since the most recent comparison by the one or more processors 108. For instance, the one or more processors 108 may determine an amount of energy savings of the appliance 104 after the energy meter 102 measures an accumulated usage of 1 kWh by an appliance 104 since the last comparison operation performed by the one or more processors 108.

The operation 1108 illustrates, responsive to a selected number of operations of the one or more appliances 104, comparing the measured energy usage of the one or more appliances 104 for the selected usage metric to the one or more received sets of reference energy usage data for the selected usage metric. For example, as shown in FIGS. 1A and 1B, upon sensing a selected number of operations by the one or more appliances 104, the one or more processors 108 of controller 106 may compare the energy usage of the one or more appliances 104 as measured by the energy meter 102 to the one or more received sets of reference energy usage data for the selected usage metric. In this regard, the one or more processors 108 of the controller 106 may determine an amount of energy savings of the appliance 104 as measured relative to the received sets of reference energy usage data once the controller 106 has detected that the one or more appliances 104 have performed a selected number of operations. For instance, in the case of a washer/dryer, the one or more processors 108 may determine the amount of energy savings of the washer/dryer once the washer/dryer has performed a selected number of operations (e.g., 10 cycles, 100 cycles, 1000 cycles, and the like).

Figure 12:
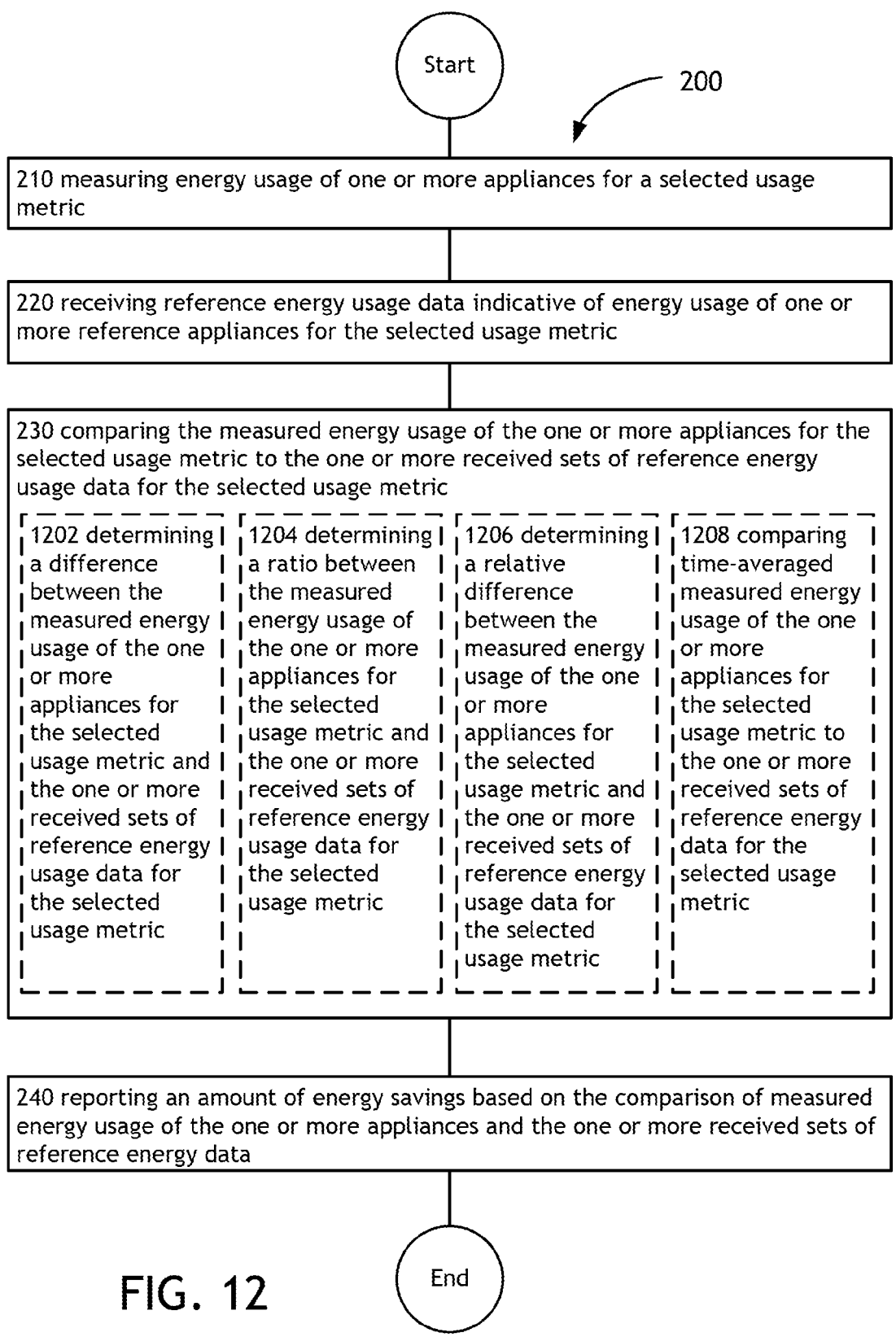

FIG. 12 illustrates alternative embodiments of the example operational flow 200 of FIG. 2. FIG. 12 illustrates example embodiments where the comparing operation 230 may include at least one additional operation. Additional operations may include an operation 1202, 1204, 1206, and/or operation 1208.

The operation 1202 illustrates determining a difference between the measured energy usage of the one or more appliances 104 for the selected usage metric and the one or more received sets of reference energy usage data for the selected usage metric. For example, as shown in FIGS. 1A and 1B, the one or more processors 108 of controller 106 may calculate a difference between the energy used by the one or more appliances 104 as measured by the energy meter 102 and the one or more received sets of reference energy usage data for the selected usage metric.

The operation 1204 illustrates determining a ratio between the measured energy usage of the one or more appliances for the selected usage metric and the one or more received sets of reference energy usage data for the selected usage metric. For example, as shown in FIGS. 1A and 1B, the one or more processors 108 of controller 106 may calculate a ratio between the energy used by the one or more appliances 104 as measured by the energy meter 102 and the one or more received sets of reference energy usage data for the selected usage metric.

The operation 1206 illustrates determining a relative difference between the measured energy usage of the one or more appliances for the selected usage metric and the one or more received sets of reference energy usage data for the selected usage metric. For example, as shown in FIGS. 1A and 1B, the one or more processors 108 of controller 106 may calculate a relative difference between the energy used by the one or more appliances 104 as measured by the energy meter 102 and the one or more received sets of reference energy usage data for the selected usage metric.

The operation 1208 illustrates comparing time-averaged measured energy usage of the one or more appliances 104 for the selected usage metric to the one or more received sets of reference energy data for the selected usage metric. For example, as shown in FIGS. 1A and 1B, the one or more processors 108 of controller 106 may compare the time-averaged energy usage of the one or more appliances 104 as measured by the energy meter 102 to the one or more received sets of reference energy usage data corresponding to the time-averaged energy usage of one or more reference appliances. For instance, the one or more processors 108 of the controller may compare (e.g., calculate a difference, relative difference, or ratio) the energy usage averaged over a selected time interval (e.g., 1 hour, 1 day, 1 month, 1 year, and the like) to the one or more received sets of reference energy corresponding to the time-averaged energy usage of one or more reference appliances.

Figure 13:
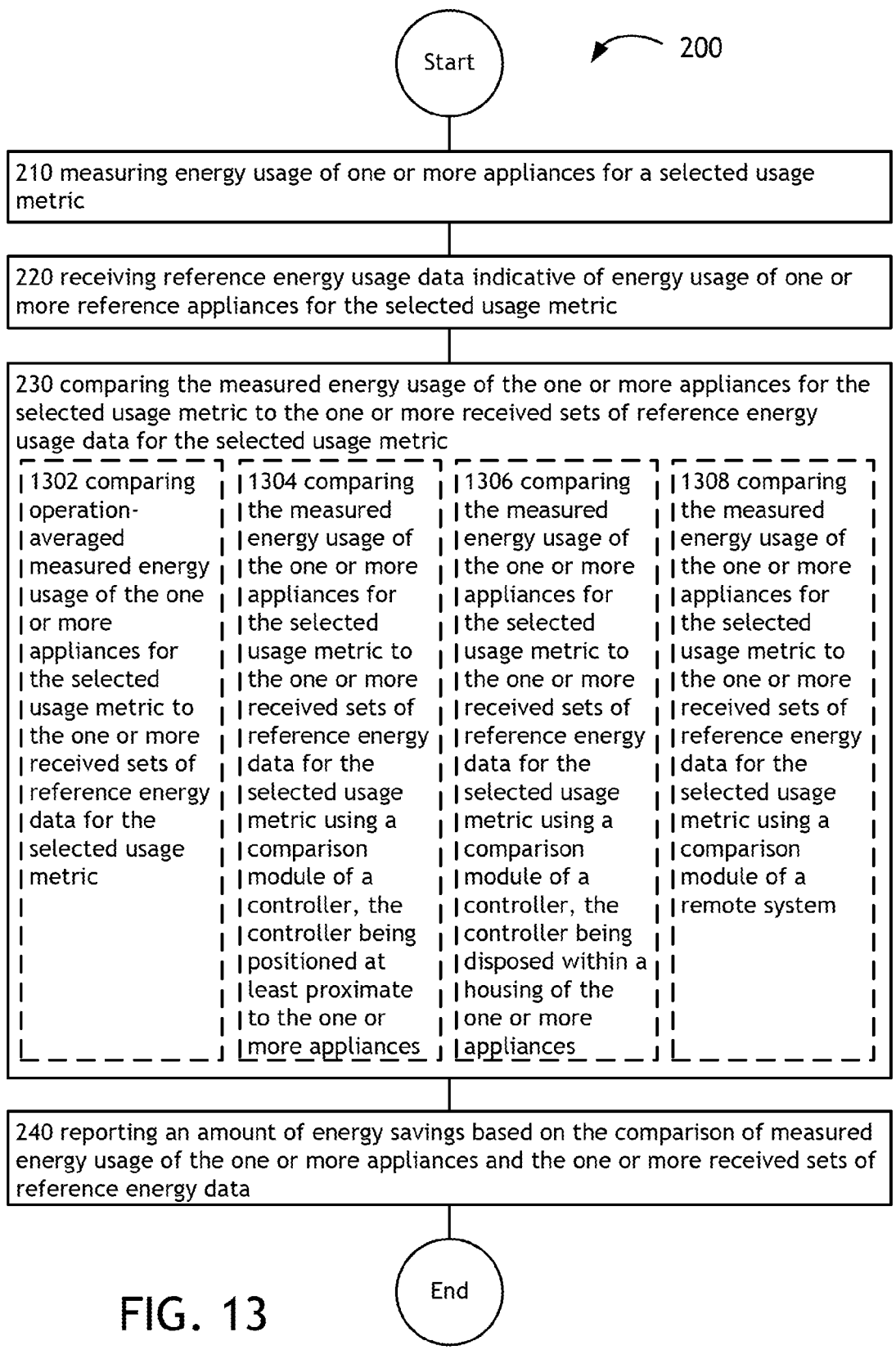

FIG. 13 illustrates alternative embodiments of the example operational flow 200 of FIG. 2. FIG. 13 illustrates example embodiments where the comparing operation 230 may include at least one additional operation. Additional operations may include an operation 1302, 1304, 1306, and/or operation 1308.

The operation 1302 illustrates comparing operation-averaged measured energy usage of the one or more appliances 104 for the selected usage metric to the one or more received sets of reference energy data for the selected usage metric. For example, as shown in FIGS. 1A and 1B, the one or more processors 108 of controller 106 may compare the operation-averaged energy usage of the one or more appliances 104 as measured by the energy meter 102 to the one or more received sets of reference energy usage data corresponding to the operation-averaged energy usage of one or more reference appliances. For instance, the one or more processors 108 of the controller 106 may compare the energy usage averaged over a selected number of operation cycles of the one or more appliances 104 to the one or more received sets of reference energy usage data corresponding to the operation-averaged energy usage of one or more reference appliances.

The operation 1304 illustrates comparing the measured energy usage of the one or more appliances 104 for the selected usage metric to the one or more received sets of reference energy data for the selected usage metric using a comparison module of a controller 106 positioned at least proximate to the one or more appliances 104. For example, as shown in FIGS. 1A and 1B, the one or more processors 108 of a controller 106 positioned proximate to the one or more appliances 104 may utilize a comparison module 144 in order to compare the energy usage of the one or more appliances 104 as measured by the energy meter 102 to the one or more received sets of reference energy usage data for the selected usage metric. In this regard, the comparison module 144 may include a set of program instructions stored in the memory 112 of the controller 106 and configured to direct the one or more processors 108 to execute a comparison operation between the measured energy usage of the one or more appliances 104 and the reference energy data.

The operation 1306 illustrates comparing the measured energy usage of the one or more appliances 104 for the selected usage metric to the one or more received sets of reference energy data for the selected usage metric using a comparison module of a controller 106 disposed within a housing of the one or more appliances 104. For example, as shown in FIGS. 1A and 1B, the one or more processors 108 of a controller 106 disposed within the housing of the one or more appliances 104 may utilize a comparison module 144 in order to compare the energy usage of the one or more appliances 104 as measured by the energy meter 102 to the one or more received sets of reference energy usage data for the selected usage metric. In this regard, the comparison module 144 may include a set of program instructions stored in the memory 112 of the controller 106 and configured to direct the one or more processors 108 to execute a comparison operation between the measured energy usage of the one or more appliances 104 and the reference energy data.

The operation 1308 illustrates comparing the measured energy usage of the one or more appliances 104 for the selected usage metric to the one or more received sets of reference energy data for the selected usage metric using a comparison module of a remote system 118. For example, as shown in FIGS. 1A and 1B, the one or more processors 108 of a controller 106 may utilize a comparison module 146 of a remote system 118 in order to compare the energy usage of the one or more appliances 104 as measured by the energy meter 102 to the one or more received sets of reference energy usage data for the selected usage metric. For instance, the comparison module 146 may include a set of program instructions stored in the memory 120 of the remote system 118 and configured to direct the one or more processors 108 of controller 106 to execute a comparison operation between the measured energy usage of the one or more appliances 104 and the reference energy data. In one aspect, the one or more controllers 106 may include a free-standing controller operatively coupled to the one or more appliances 104 and configured to execute the set of program instructions stored on the memory 120 of the remote system 118. Alternatively, the one or more controllers 106 may be disposed within the remote system 118 (e.g., within the housing of the remote system) or proximate to the remote system 118 and may be configured to execute the comparison algorithm stored on the memory 120 of the remote system 118.

Figure 14:
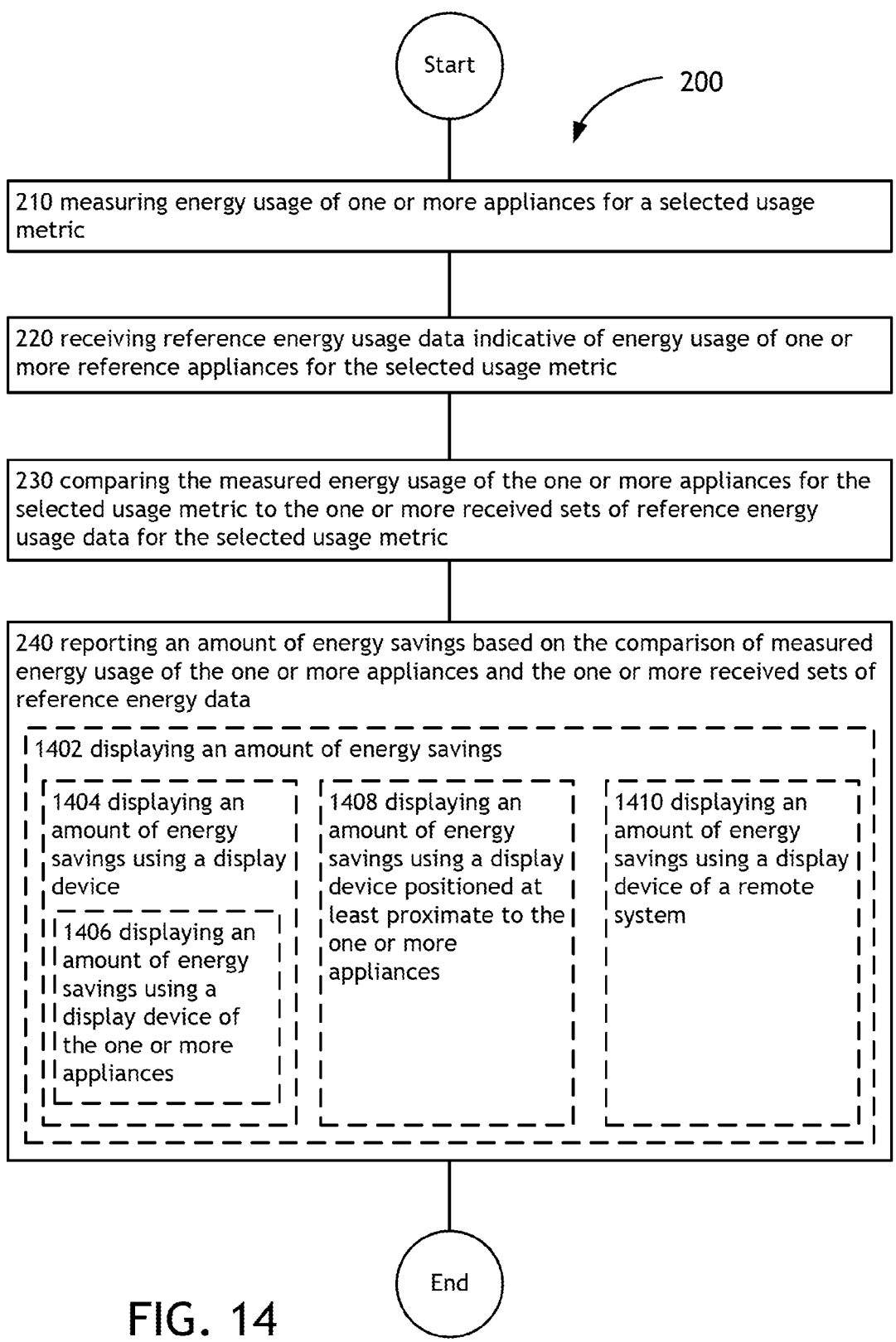

FIG. 14 illustrates alternative embodiments of the example operational flow 200 of FIG. 2. FIG. 14 illustrates example embodiments where the reporting operation 240 may include at least one additional operation. Additional operations may include an operation 1402, 1404, 1406, 1408, and/or operation 1410.

The operation 1402 illustrates displaying an amount of energy savings. For example, as shown in FIG. 1A and FIG. 1B, the one or more processors 108 of the controller 106 may visually display the amount of energy savings based on the comparison of measured energy usage of the one or more appliances 104 and the one or more received sets of reference energy data. In another example, the one or more processors 108 of the controller 106 may audibly display the amount of energy savings based on the comparison of measured energy usage of the one or more appliances 104 and the one or more received sets of reference energy data.

In a further embodiment, operation 1404 illustrates displaying an amount of energy savings using a display device. For example, as shown in FIG. 1A and FIG. 1B, the one or more processors 108 of the controller 106 may display the amount of energy savings based on the comparison of measured energy usage of the one or more appliances 104 and the one or more received sets of reference energy data on one or more display devices communicatively coupled to the one or more processors 108. For instance, the one or more processors 108 of the controller 106 may display the amount of energy savings on one or more visual display devices, such as a liquid crystal display (LCD), one or more light emitting diodes (LEDs), one or more organic LEDs (OLEDs), or a cathode rate tube (CRT). In this regard, the one or more display devices may be configured to utilize text-based messages, symbols, indicia, or other identifiable visual characters, or symbols. In another instance, the one or more processors 108 of the controller 106 may display the amount of energy on one or more audio display devices, such as a speaker. In this regard, information related to the energy savings of the one or more appliances 104 may be relayed to a user via an audible signal, such as, but not limited to, an audible announcement, a tone, a simulated voice, or a series of tones.

Further, operation 1406 illustrates displaying an amount of energy savings on a display device 128 of the one or more appliances 104. For example, as shown in FIG. 1A and FIG. 1B, the one or more processors 108 of the controller 106 may display the amount of energy savings based on the comparison of measured energy usage of the one or more appliances 104 and the one or more received sets of reference energy data on one or more display devices 128 of the one or more appliances 104. In this regard, the one or more display devices 128 may be integrated within the housing of the one or more appliances 104.

Further, operation 1408 illustrates displaying an amount of energy savings on a display device 126 positioned at least proximate to the one or more appliances 104. For example, as shown in FIG. 1A and FIG. 1B, the one or more processors 108 of the controller 106 may display the amount of energy savings based on the comparison of measured energy usage of the one or more appliances 104 and the one or more received sets of reference energy data on one or more display devices 128 positioned at least proximate to the one or more appliances 104. For instance, the one or more processors 108 may display the energy savings on a free-standing display device 126 communicatively coupled to the one or more processors 108 of the controller 106 and positioned proximate to the one or more appliances 104. In another instance, the one or more processors 108 may display the energy savings on an integrated controller-display device, whereby the display device 126 and controller 106 are integrated into a single housing unit, which is communicatively couplable to the energy meter 102. In another instance, the one or more processors 108 may display the energy savings on a display device 126 integrated within the housing of the energy meter 102 (e.g., a LCD display of the energy meter 102).

Further, operation 1410 illustrates displaying an amount of energy savings on a display device 130 of a remote system 118. For example, as shown in FIG. 1A and FIG. 1B, the one or more processors 108 of the controller 106 may display the amount of energy savings based on the comparison of measured energy usage of the one or more appliances 104 and the one or more received sets of reference energy data on one or more display devices 130 of a remote system 118. For instance, the remote system 118 may consist of a system positioned remotely from the controller 106 and communicatively coupled to the controller 106, such as a portable communications device (e.g., tablet, PDA, smartphone, and the like) or a remotely positioned computing system (e.g., desktop computer, server, network of multiple computers, and the like).

Figure 15:
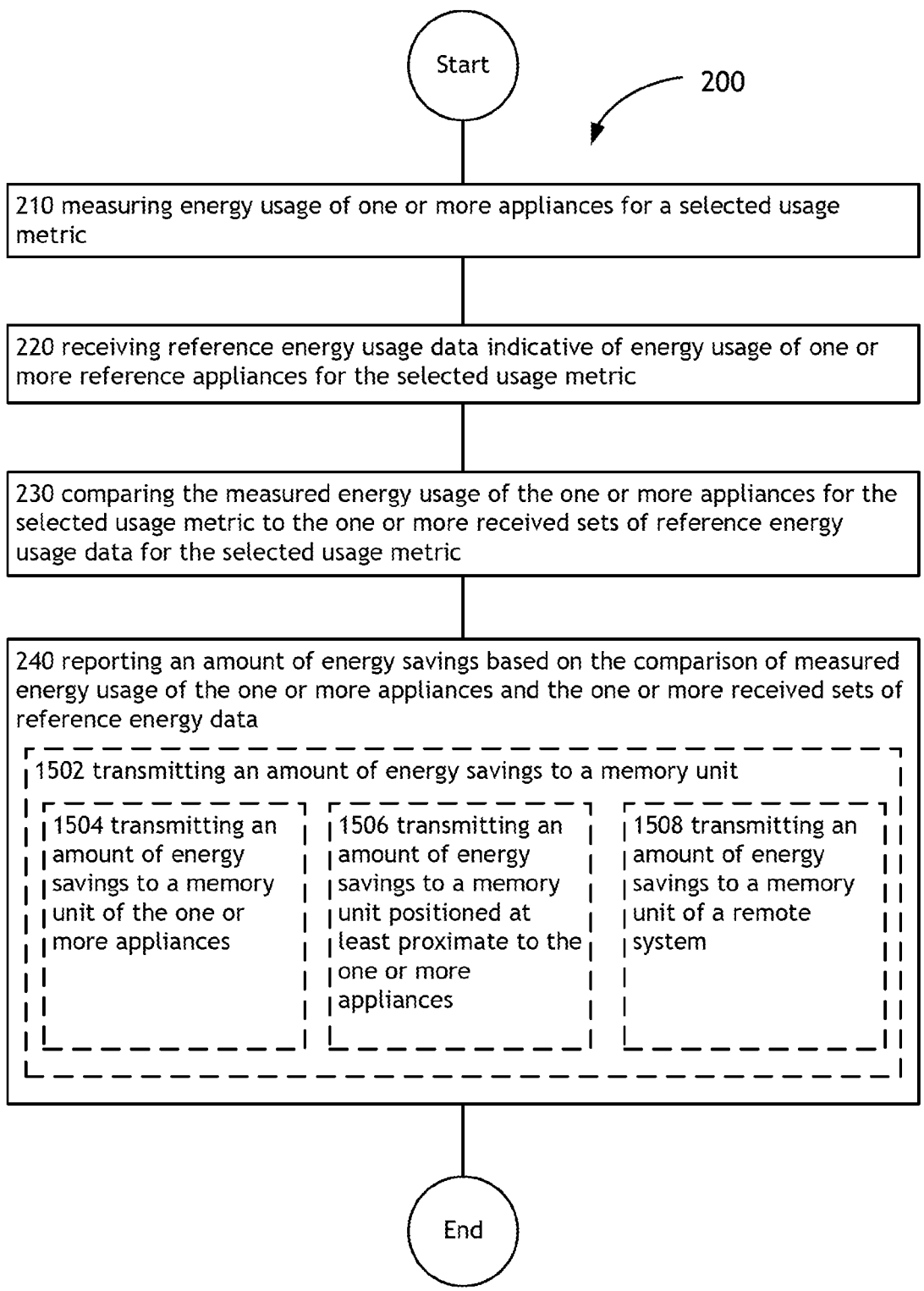

FIG. 15 illustrates alternative embodiments of the example operational flow 200 of FIG. 2. FIG. 15 illustrates example embodiments where the reporting operation 240 may include at least one additional operation. Additional operations may include an operation 1502, 1504, 1506, and/or 1508.

The operation 1502 illustrates transmitting an amount of energy savings to a memory unit. For example, as shown in FIGS. 1A and 1B, the one or more processors 108 of the controller 106 may transmit the amount of energy savings based on the comparison of measured energy usage of the one or more appliances 104 and the one or more received sets of reference energy data to a memory unit communicatively coupled to the one or more processors 108. For instance, the one or more processors 108 of the controller 106 may transmit the amount of energy savings based on the comparison of measured energy usage of the one or more appliances 104 and the one or more received sets of reference energy data to an energy savings database maintained on a memory unit communicatively coupled to the one or more processors 108.

In a further embodiment, operation 1504 illustrates transmitting an amount of energy savings to a memory unit of the one or more appliances 104. For example, as shown in FIGS. 1A and 1B, the one or more processors 108 of the controller 106 may transmit the amount of energy savings based on the comparison of measured energy usage of the one or more appliances 104 and the one or more received sets of reference energy data to a memory unit 114 of the one or more appliances 104 communicatively coupled to the one or more processors 108. For instance, the one or more processors 108 of the controller 106 may transmit the amount of energy savings based on the comparison of measured energy usage of the one or more appliances 104 and the one or more received sets of reference energy data to an energy savings database 134 maintained on a memory unit 114 communicatively coupled to the one or more processors 108.

In a further embodiment, operation 1506 illustrates transmitting an amount of energy savings to a memory unit 112 positioned at least proximate to the one or more appliances 104. For example, as shown in FIGS. 1A and 1B, the one or more processors 108 of the controller 106 may transmit the amount of energy savings based on the comparison of measured energy usage of the one or more appliances 104 and the one or more received sets of reference energy data to a memory unit 112 positioned at least proximate to the one or more appliances 104 and communicatively coupled to the one or more processors 108 of the controller 106. For instance, the one or more processors 108 of the controller 106 may transmit the amount of energy savings based on the comparison of measured energy usage of the one or more appliances 104 and the one or more received sets of reference energy data to an energy savings database 132 maintained on a memory unit 112 of the controller 106, whereby the controller 106 is positioned at least proximate to the one or more appliances 104.

In a further embodiment, operation 1508 illustrates transmitting an amount of energy savings to a memory unit 120 of a remote system 118. For example, as shown in FIGS. 1A and 1B, the one or more processors 108 of the controller 106 may transmit the amount of energy savings based on the comparison of measured energy usage of the one or more appliances 104 and the one or more received sets of reference energy data to a memory unit 120 of a remote system 118. For instance, the one or more processors 108 of the controller 106 may transmit the amount of energy savings based on the comparison of measured energy usage of the one or more appliances 104 and the one or more received sets of reference energy data to an energy savings database 136 maintained on a memory unit 120 of the remote system 118 via network 124.

Figure 16:
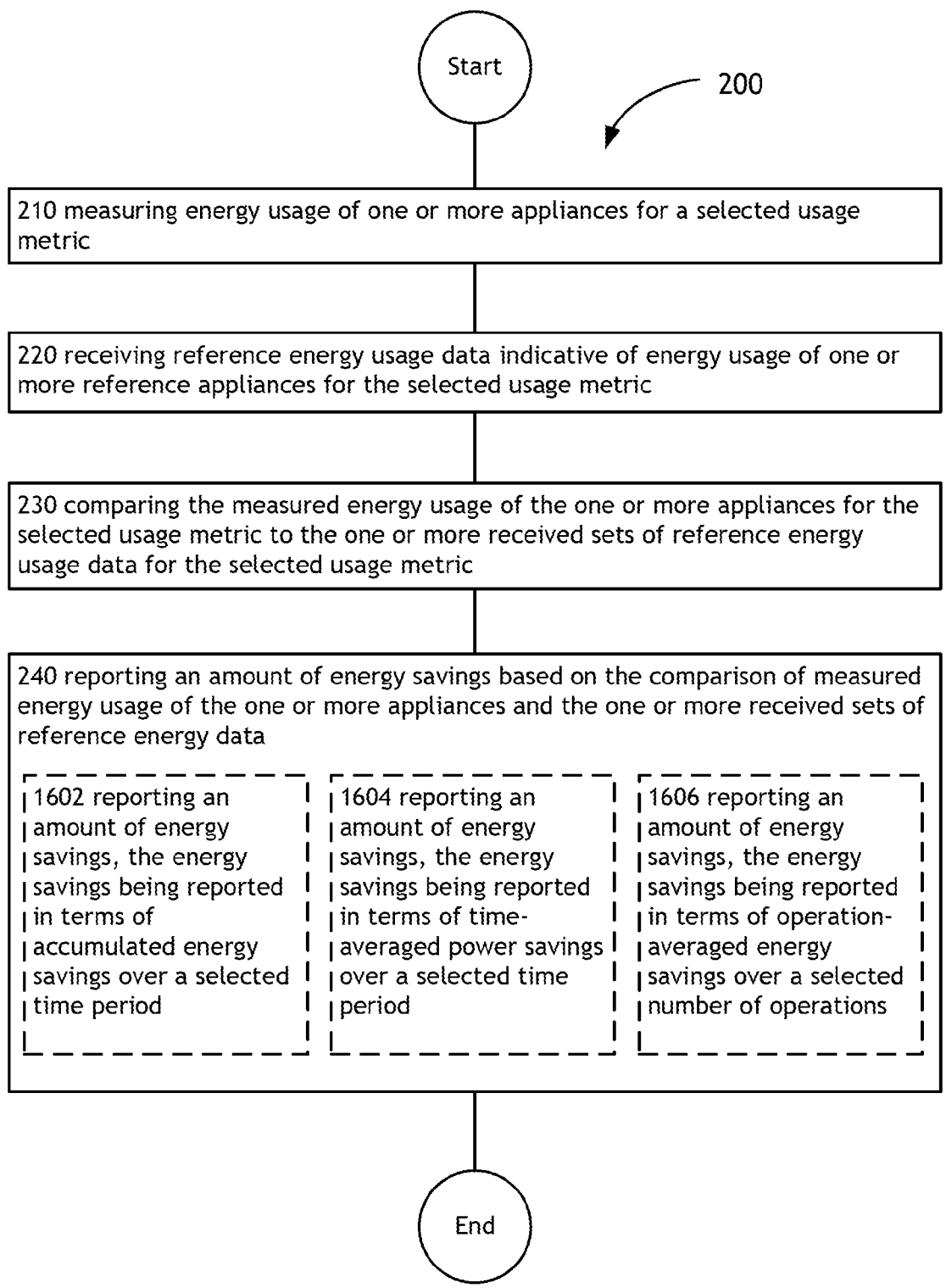

FIG. 16 illustrates alternative embodiments of the example operational flow 200 of FIG. 2. FIG. 16 illustrates example embodiments where the reporting operation 240 may include at least one additional operation. Additional operations may include an operation 1602, 1604, and/or 1606.

The operation 1602 illustrates reporting an amount of energy savings in terms of accumulated energy savings over a selected time period. For example, as shown in FIGS. 1A and 1B, the one or more processors 108 of the controller 106 may report (e.g., display on display device, transmit to memory, and the like) the amount of energy savings based on the comparison of measured energy usage of the one or more appliances 104 and the one or more received sets of reference energy data in terms of accumulated energy savings over a selected time period (e.g., selected by a user).

The operation 1604 illustrates reporting an amount of energy savings in terms of time-averaged power savings over a selected time period. For example, as shown in FIGS. 1A and 1B, the one or more processors 108 of the controller 106 may report the amount of energy savings based on the comparison of measured energy usage of the one or more appliances 104 and the one or more received sets of reference energy data in terms of time-averaged power savings over a selected time period.

The operation 1606 illustrates reporting an amount of energy savings in terms of operation-averaged power savings over a selected number of operations. For example, as shown in FIGS. 1A and 1B, the one or more processors 108 of the controller 106 may report the amount of energy savings based on the comparison of measured energy usage of the one or more appliances 104 and the one or more received sets of reference energy data in terms of operation-averaged power savings over a selected number of appliance operations (i.e., appliance cycles).

Figure 17:
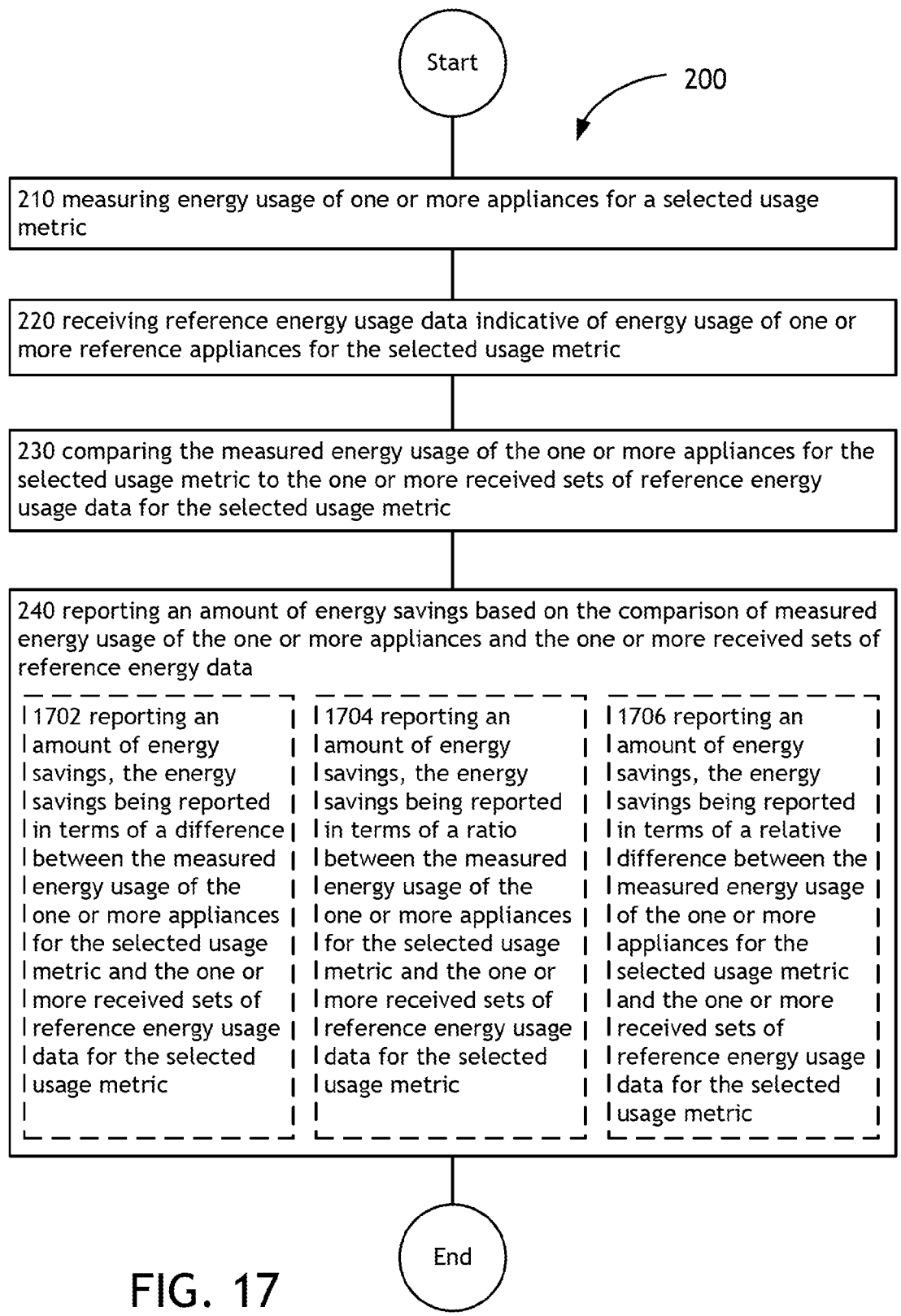

FIG. 17 illustrates alternative embodiments of the example operational flow 200 of FIG. 2. FIG. 17 illustrates example embodiments where the reporting operation 240 may include at least one additional operation. Additional operations may include an operation 1702, 1704, and/or 1706.

The operation 1702 illustrates reporting an amount of energy savings in terms of a difference between the measured energy usage of the one or more appliances for the selected usage metric and the one or more received sets of reference energy usage data for the selected usage metric. For example, as shown in FIGS. 1A and 1B, the one or more processors 108 of the controller 106 may report the amount of energy savings based on the comparison of measured energy usage of the one or more appliances 104 and the one or more received sets of reference energy data in terms of a difference between the measured energy usage of the one or more appliances and the one or more received sets of reference energy usage data for the selected usage metric.

The operation 1704 illustrates reporting an amount of energy savings in terms of a ratio between the measured energy usage of the one or more appliances for the selected usage metric and the one or more received sets of reference energy usage data for the selected usage metric. For example, as shown in FIGS. 1A and 1B, the one or more processors 108 of the controller 106 may report the amount of energy savings based on the comparison of measured energy usage of the one or more appliances 104 and the one or more received sets of reference energy data in terms of a ratio between the measured energy usage of the one or more appliances and the one or more received sets of reference energy usage data for the selected usage metric.

The operation 1706 illustrates reporting an amount of energy savings in terms of a relative difference between the measured energy usage of the one or more appliances for the selected usage metric and the one or more received sets of reference energy usage data for the selected usage metric. For example, as shown in FIGS. 1A and 1B, the one or more processors 108 of the controller 106 may report the amount of energy savings based on the comparison of measured energy usage of the one or more appliances 104 and the one or more received sets of reference energy data in terms of a relative difference between the measured energy usage of the one or more appliances and the one or more received sets of reference energy usage data for the selected usage metric.

Figure 18:
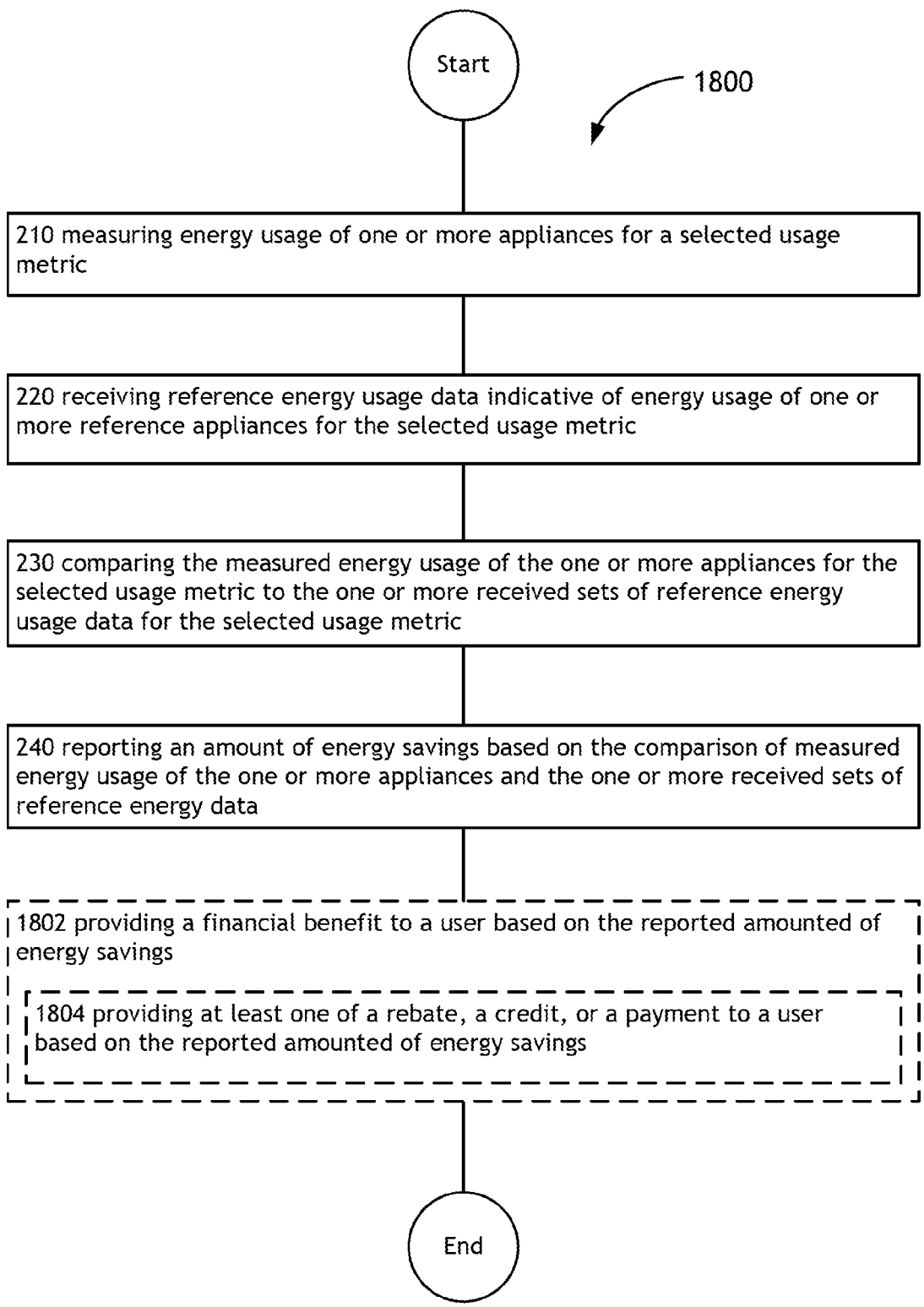

FIG. 18 illustrates alternative embodiments of the example operational flow 200 of FIG. 2. FIG. 18 illustrates example embodiments where the reporting operation 240 may include at least one additional operation. Additional operations may include an operation 1802 and/or 1804.

The operation 1802 illustrates providing a financial benefit to a user based on the reported amounted of energy savings. For example, as shown in FIGS. 1A and 1B, upon receiving a report from the controller 106, a remote system 118 communicatively coupled to the controller 106 and maintained by an entity (e.g., utility company, appliance manufacturer, governmental entity) may provide a financial benefit to a user based on the reported energy savings of step 240. In this regard, after a remote system 118 receives the reported energy savings from the controller 106, the remote system 118 may be configured to determine a financial benefit associated with the reported energy savings and then transmit a notification of a financial benefit to the controller 106 or to another user device (e.g., smartphone, computer, and the like) via network 124. Alternatively, the remote system 118 may determine a financial benefit associated with the reported energy savings and then transmit a notification of the financial benefit to the entity maintaining the remote system 118. Further, the remote system 118 may provide the financial benefit electronically to user by transmitting the financial benefit to an electronic-based financial account (e.g., bank account, utility account, and the like) of the user via network 124.

In a further embodiment, operation 1804 illustrates providing at least one of a rebate, a credit, or a payment to a user based on the reported amounted of energy savings. For example, as shown in FIGS. 1A and 1B, upon receiving a report from the controller 106, a remote system 118 communicatively coupled to the controller 106 and maintained by an entity (e.g., utility company, appliance manufacturer, governmental entity) may provide at least one of a rebate, a credit, or a payment to a user based on the reported amounted of energy savings to a user based on the reported energy savings of step 240. In this regard, after a remote system 118 receives the reported energy savings from the controller 106, the remote system 118 may be configured to determine the amount of at least one of a rebate, a credit, or a payment based on the reported amounted of energy savings and then transmit a notification of a financial benefit to the controller 106 or to another user device (e.g., smartphone, computer, and the like) via network 124. Alternatively, the remote system 118 may determine the amount of at least one of a rebate, a credit, or a payment based on the reported energy savings and then transmit a notification of the financial benefit to the entity maintaining the remote system 118. Further, the remote system 118 may provide the benefit electronically to user by transmitting a rebate, credit, or payment to an electronic-based financial account of the user via network 124.

Figure 19:
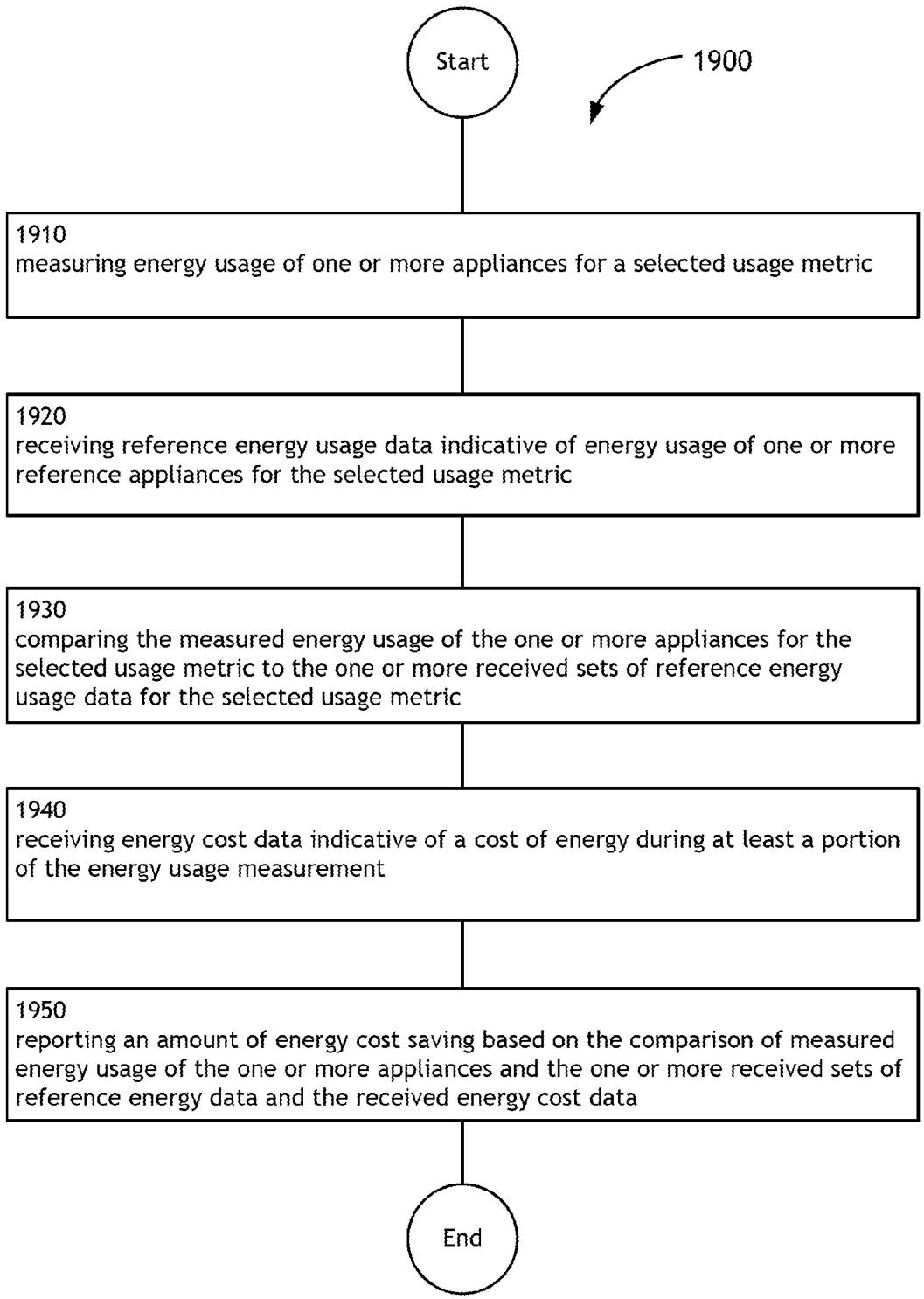
FIG. 19 is a high-level flowchart of a method for measuring negawatt usage of one or more appliances.

FIG. 19 illustrates an operational flow 1900 representing example operations related to an alternative method for measuring negawatt usage of an appliance. In FIG. 19 and in following figures that include various examples of operational flows, discussion and explanation may be provided with respect to the above-described examples of FIGS. 1A and 1B, and/or with respect to other examples and contexts. However, it should be understood that the operational flows may be executed in a number of other environments and contexts, and/or in modified versions of FIGS. 1A and 1B. Also, although the various operational flows are presented in the sequence(s) illustrated, it should be understood that the various operations may be performed in other orders than those which are illustrated, or may be performed concurrently.

After a start operation, the operational flow 1900 moves to a measuring operation 1910. The measuring operation 1910 depicts measuring energy usage of one or more appliances 104 for a selected usage metric. For example, as shown in FIGS. 1A and 1B, the system 100 may include one or more measurement devices (e.g., electrical power meter, heat measurement device, and the like) configured to measure at least a portion of the amount of energy used by an appliance 104 for a selected usage metric (e.g., selected time interval, selected number of appliances operation cycles, and the like).

Then, reference receiving operation 1920 depicts receiving reference energy usage data indicative of energy usage of one or more reference appliances for the selected usage metric. For example, as shown in FIGS. 1A and 1B, one or more processors 108 of the controller 106 may receive reference energy usage data indicative of energy usage of one or more reference appliances for the selected usage metric from a selected reference appliance energy usage source (e.g., memory 114 of appliance 104, memory 120 of remote system 118, or memory 112 of controller 106).

Then, comparing operation 1930 depicts comparing the measured energy usage of the one or more appliances 104 for the selected usage metric to the one or more received sets of reference energy usage data for the selected usage metric. For example, the one or more processors 108 of the controller 106 may compare the measured energy usage of the one or more appliances 104 for the selected usage metric to the one or more received sets of reference energy usage data for the selected usage metric. In this regard, the one or more processors 108 of the controller 106 may determine an amount of energy savings of the appliance 104 as measured relative to the received sets of reference energy usage data. For example, the one or more processors 108 may determine an absolute difference between the energy usage (e.g., time averaged energy usage, operation averaged energy usage, and the like) of the appliance 104 and the reference energy data associated with a reference energy appliance. By way of another example, the one or more processors 108 may determine a relative difference between the energy usage of the appliance 104 and the reference energy data associated with a reference energy appliance. Further, the one or more processors 108 may determine a ratio between the energy usage of the appliance 104 and the reference energy data associated with a reference energy appliance.

Then, cost receiving operation 1940 depicts receiving energy cost data indicative of a cost of energy during at least a portion of the energy usage measurement. For example, as shown in FIGS. 1A and 1B, one or more processors 108 of the controller 106 may receive energy cost data indicative of cost of energy usage of the one or more appliances 104 from a selected cost reference source (e.g., memory of appliance 104, memory of controller 106, memory of remote system 118, network accessible cost of energy database, and the like) for at least a portion of the energy usage measurement.

Then, reporting operation 1950 depicts reporting an amount of energy cost saving based on the comparison of measured energy usage of the one or more appliances 104 and the one or more received sets of reference energy data and the received energy cost data. For example, as shown in FIGS. 1A and 1B, the one or more processors 108 of the controller 106 may display the energy cost savings based on the comparison of measured energy usage of the one or more appliances 104 and the one or more received sets of reference energy data and the received energy cost data on a display device (e.g., audio display device, visual display device, and the like). By way of another example, the one or more processors 108 of the controller 106 may store the energy cost savings based on the comparison of measured energy usage of the one or more appliances 104 and the one or more received sets of reference energy data and the received energy cost data in an energy cost savings database (e.g., cost savings database 144, cost savings database 146, cost savings database 148, and the like) maintained on memory device (e.g., controller memory 112, appliance memory 114, remote memory 120, and the like).

Figure 20:
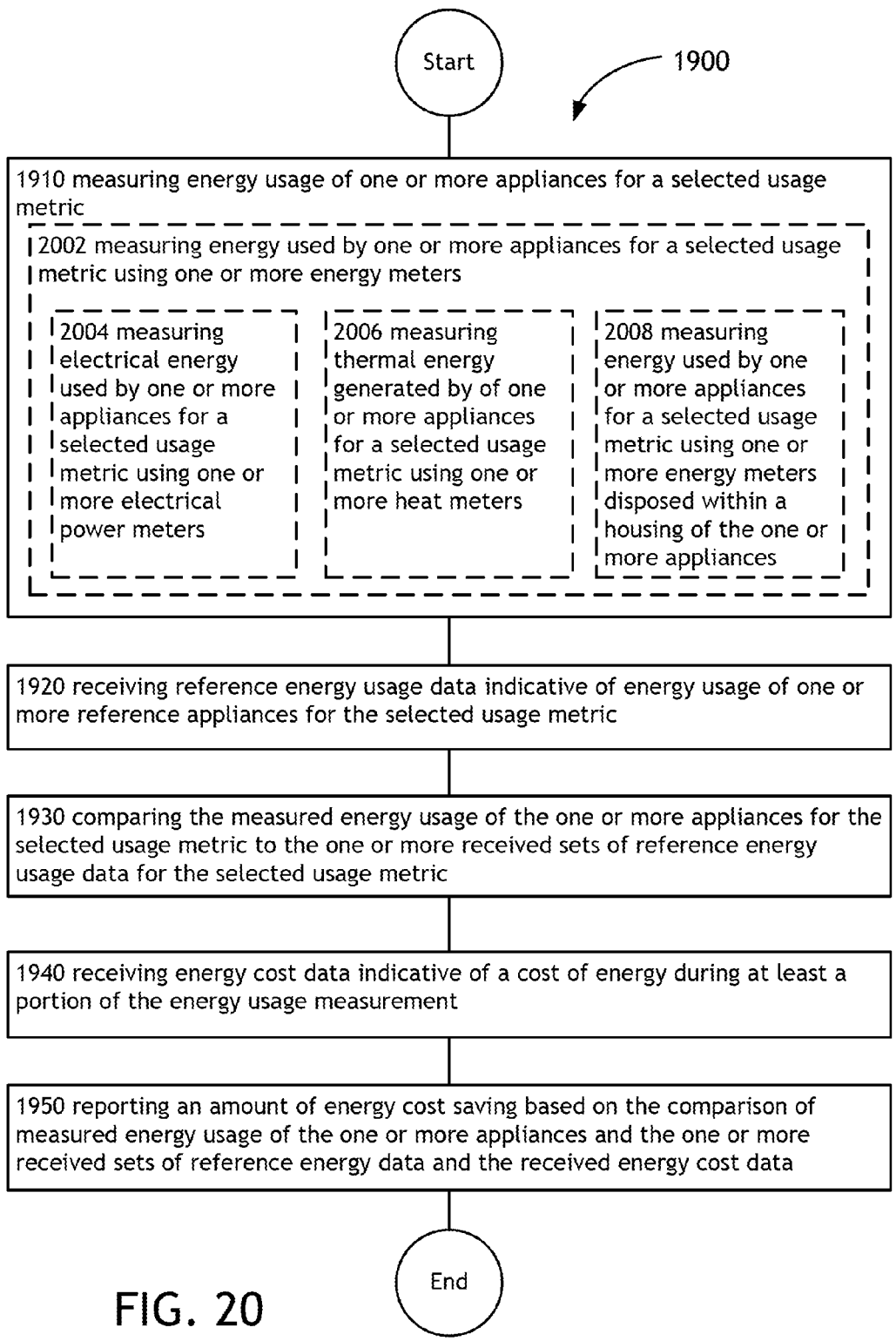
FIGS. 20 through 36 are high-level flowcharts depicting alternate implementations of FIG. 19.

FIG. 20 illustrates alternative embodiments of the example operational flow 1900 of FIG. 19. FIG. 20 illustrates example embodiments where the measuring operation 1910 may include at least one additional operation. Additional operations may include operations 2002, 2004, 2006 and/or 2008.

The operation 2002 illustrates measuring energy used by one or more appliances 104 for a selected usage metric using one or more energy meters 102. For example, as shown in FIGS. 1A and 1B, an electrical-based energy meter wired in a common circuit (e.g., local household circuit) with the one or more appliances 104 may measure energy used by the one or more appliances 104 for a selected usage metric using one or more energy meters. In this regard, the electrical-based energy meter may measure one or more electrical parameters (e.g., voltage, current, and the like) of the one or more appliances 104 in order to characterize the amount of energy used by the one or more appliances 104 over a selected usage metric. For instance, the electrical-based energy meter may be wired in a parallel configuration with the one or more appliances 104. In another instance, the electrical-based energy meter may be wired in a series configuration with the one or more appliances 104. It is further contemplated that the one or more energy meters 102 may include multiple individual electrical-based energy meters, wherein the measurement results of the electrical-based energy meters may be combined by the one or more processors 108 in order to characterize the energy usage of the one or more appliances 104 over a selected usage metric.

In a further embodiment, operation 2004 illustrates measuring electrical energy used by one or more appliances 104 for a selected usage metric using one or more electrical power meters. For example, as shown in FIGS. 1A and 1B, an electric power meter wired in a common circuit (e.g., local household circuit) with the one or more appliances 104 may measure energy used by one or more appliances 104 for a selected usage metric. In this regard, the electrical power meter may be configured to measure the instantaneous or time-averaged electrical power utilized by the one or more appliances 104. The one or more processors 108 may then determine the amount of energy used by the appliance over a selected usage metric using the measured electric power measurements provided by the one or more electric power meters. Further, the one or more electrical power meters may be wired in series with the one or more appliances 104.

In another embodiment, operation 2006 illustrates measuring thermal energy generated by of one or more appliances 104 for a selected usage metric using one or more heat meters. For example, as shown in FIGS. 1A and 1B, one or more heat meters placed in contact or located in proximity with the one or more appliances 104 may measure a portion of the thermal energy generated by the one or more appliances 104. The one or more processors 108 may then utilize the thermal energy measurements of the one or more heat meters to estimate the amount of energy used by the one or more appliances 104 for a selected usage metric. In this regard, the system 100 may include one or more heat meters (e.g., single heat meter or multiple heat meters) arranged at selected positions relative the one or more appliances 104. Utilizing a pre-programmed predictive algorithm the one or more processors 108 may aggregate the measurements from each of the one or more heat meters in order to provide an estimate for the amount of energy used by the one or more appliances over a selected usage metric, such as a selected number of appliances operations or a selected amount of time. Those skilled in the art should recognize that the source of heating is associated with the Joule heating present in any operating electrical circuit. It is further contemplated that the system 100 may utilize one or more heat meters in conjunction with one or more electrical-based meters (e.g., power meter). For example, the system 100 may include both one or more electrical power meters and one or more heat meters configured to measure electrical energy used and thermal energy generated by the one or more appliances 104. It is further noted herein that the one or more processors 108 may provide an energy usage estimate for the one or more appliances 104 using an algorithm configured to conjunctively utilized thermal energy measurements from one or more heat meters and an electrical energy measurement from one or more electrical power meters.

In a further embodiment, operation 2008 illustrates measuring energy used by one or more appliances 104 for a selected usage metric using one or more energy meters 102 disposed within a housing of the one or more appliances 104. For example, an electrical power meter disposed within the housing of the one or more appliances 104 may measure energy used by one or more appliances 104 for a selected usage metric. In another example, one or more heat meters disposed within the housing of the one or more appliances 104 may measure thermal energy generated by one or more appliances 104 for a selected usage metric and used to determine the amount of energy used by the one or more appliances 104.

Figure 21:
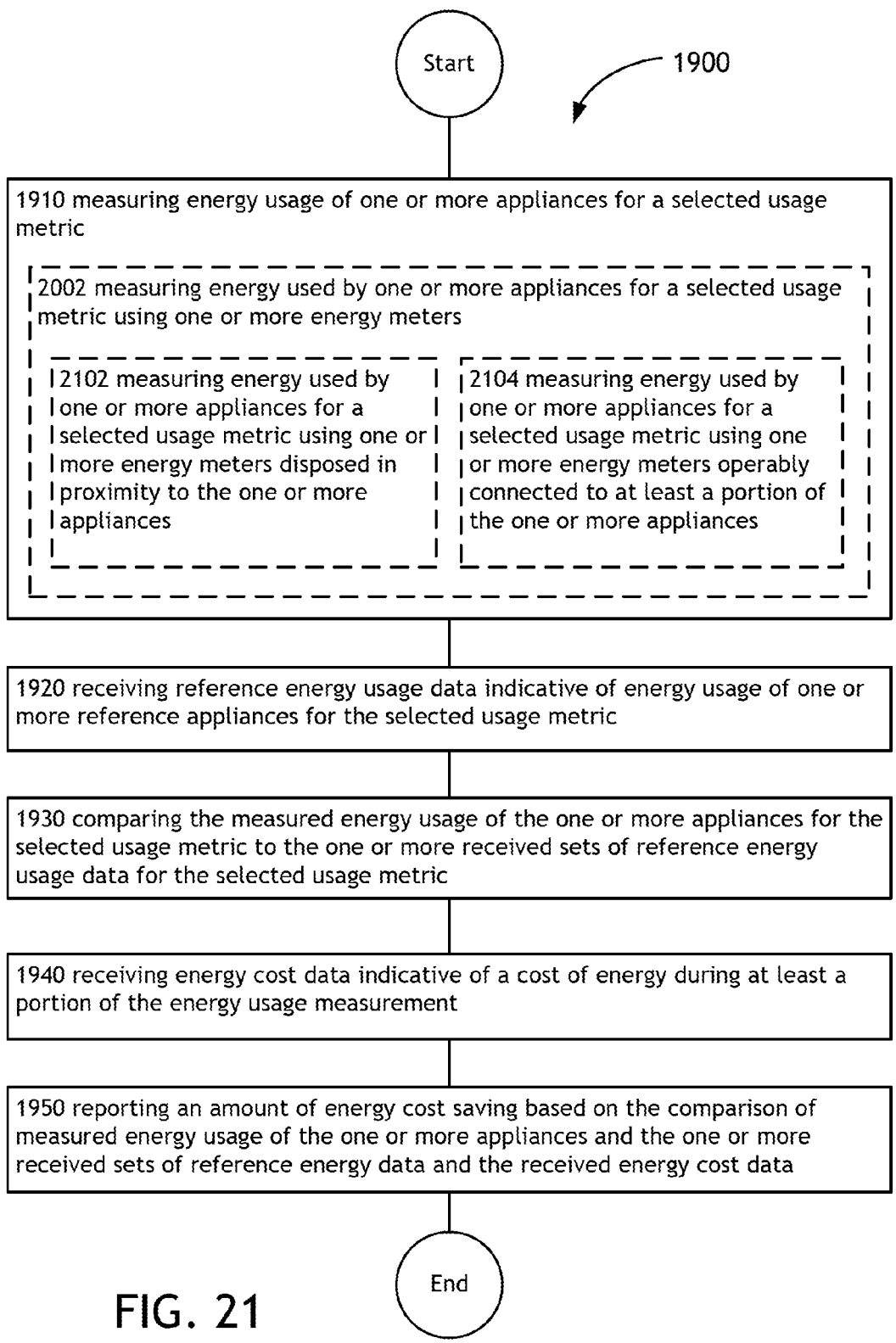

FIG. 21 illustrates alternative embodiments of the example operational flow 1900 of FIG. 19. FIG. 21 illustrates example embodiments where the measuring operation 1910 may include at least one additional operation. Additional operations may include an operation 2102, and/or operation 2104.

In a further embodiment, operation 2102 illustrates measuring energy used by one or more appliances for a selected usage metric using one or more energy meters 102 disposed in proximity to the one or more appliances 104. For example, as shown in FIGS. 1A and 1B, one or more energy meters 102 may be disposed about the one or more appliances 104 according to a selected spatial arrangement and utilized to measure energy usage of the one or more appliances 104 for a selected usage metric. For instance, an electrical power meter electrically coupled to the one or more appliances 104 and positioned at a selected position relative to the one or more appliances 104 may measure electrical energy used by one or more appliances 104 for a selected usage metric. For instance, a portable electrical power meter may be used to retrofit the one or more appliances 104 with negawatt measurement capabilities. In this regard, the one or more energy meters 102 may reside in a housing different from the housing of the one or more appliances 104, with the one or more energy meters 102 being reversibly electrically couplable to the one or more appliances 104. In another example, one or more heat meters positioned in proximity to the one or more appliances 104 may measure thermal energy generated by one or more appliances 104 for a selected usage metric and determine the amount of energy used by the one or more appliances 104. In this regard, the one or more processors 108 may be configured to execute an algorithm pre-programmed to estimate the energy usage of the one or more appliances 104 based on the geometrical arrangement of the one or more heat meters relative to the one or more appliances 104.

In another embodiment, operation 2104 illustrates measuring energy used by one or more appliances 104 for a selected usage metric using one or more energy meters 102 operably connected to at least a portion of the one or more appliances 104. For example, as shown in FIGS. 1A and 1B, an energy meter 102 mechanically coupled to a portion of the one or more appliances 104 may measure energy used by one or more appliances 104 for a selected usage metric. For instance, an energy meter 102 may be mechanically coupled to a surface (e.g., external surface or internal surface) of the one or more appliances 104. In another example, one or more heat meters mechanically and thermally coupled to a surface of the housing (e.g., interior side of housing or exterior side of housing) of the one or more appliances may measure thermal energy generated by one or more appliances 104 for a selected usage metric determine the amount of energy used by the one or more appliances 104. In this regard, the housing of the one or more appliances 104 may act to serve as a thermal absorbing medium that absorbs thermal energy generated by the electrical circuitry of the one or more appliances 104. In this regard, the one or more processors 108 may be configured to execute an algorithm pre-programmed to estimate the energy usage of the one or more appliances 104 based on the geometrical arrangement and material properties of the housing and the heat measurements at one or more locations of the housing of the one or more appliances 104.

Figure 22:
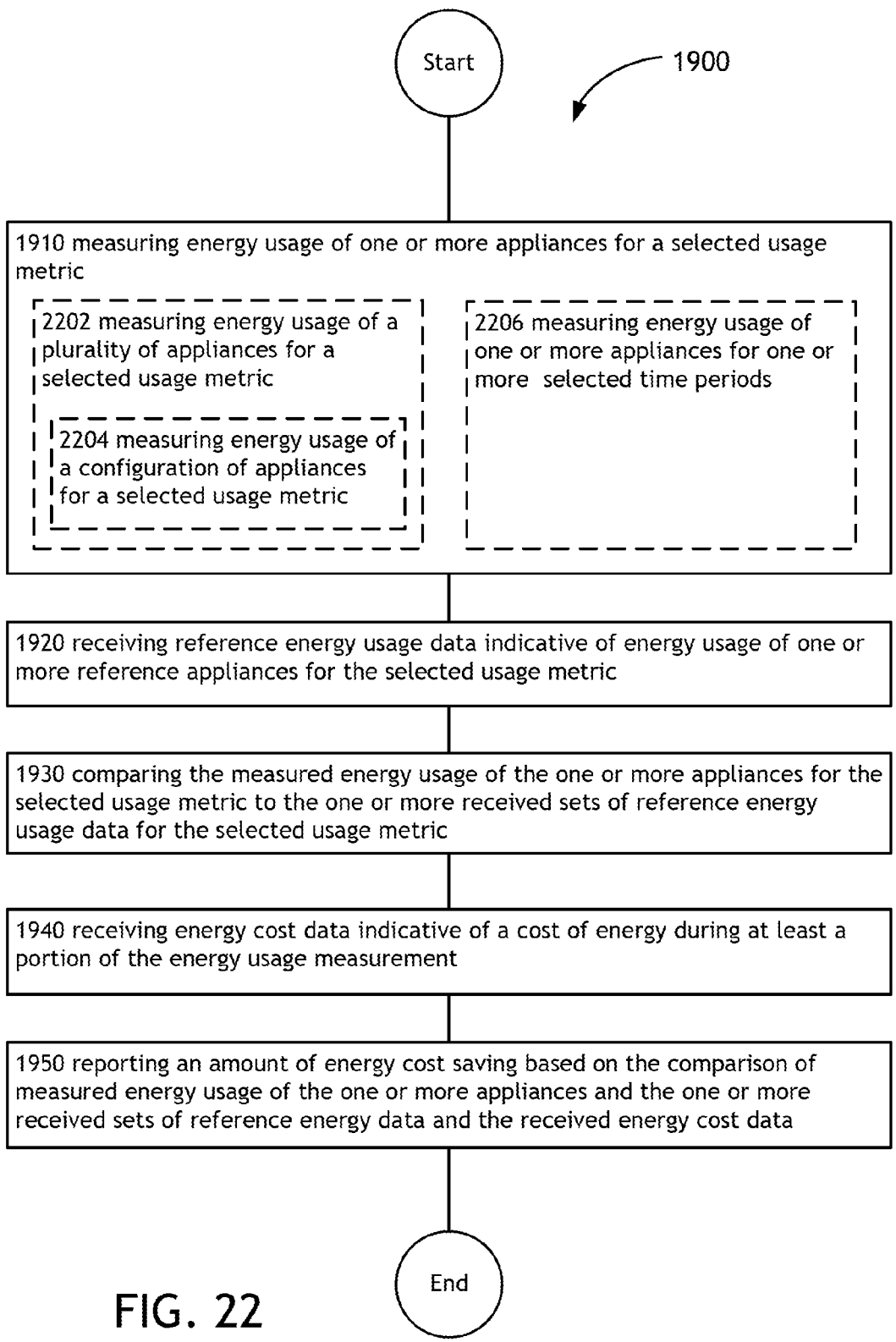

FIG. 22 illustrates alternative embodiments of the example operational flow 1900 of FIG. 19. FIG. 22 illustrates example embodiments where the measuring operation 1910 may include at least one additional operation. Additional operations may include an operation 2202, 2204 and/or operation 2206.

The operation 2202 illustrates measuring energy usage of a plurality of appliances 104 for a selected usage metric. For example, as shown in FIGS. 1A and 1B, one or more energy meters 102 may measure energy usage of a set of appliances 104 for a selected usage metric. The set of appliances 104 may include a first appliance, a second appliance, and up to and including an Nth appliance. For instance, the one or more energy meters 102 may measure the aggregated energy usage of the appliances 104 in a selected room of a residence. In another instance, the one or more energy meters 102 may measure the aggregated energy usage of the appliances 104 of a selected type (e.g., laundry-based appliances, kitchen-based appliances, entertainment-based devices, and the like). In this regard, the one or more energy meters 102 may measure energy usage of any grouping of appliances 104 as selected by a user.

Further, operation 2204 illustrates measuring energy usage of a configuration of appliances for a selected usage metric. For example, the one or more energy meters 102 may measure the aggregated energy usage of a configuration of appliances 104. For instance, a configuration of appliances 104 may include a selected set of laundry appliances, such as a washer and dryer. In another instance, a configuration of appliances 104 may include a selected set of kitchen appliances, such as refrigerator, dishwasher, microwave, and oven. It is further contemplated that the one or more processors 108 may then compare the energy usage of a selected appliance configuration with reference energy usage data associated with the same appliance configuration.

The operation 2206 illustrates measuring energy usage of one or more appliances 104 for one or more selected time periods. For example, as shown in FIGS. 1A and 1B, the one or more energy meters 102 may measure the energy used by one or more appliances 104 for one or more selected time periods. For instance, the one or more energy meters 102 may measure the total energy used by one or more appliances 104 over a selected time interval (e.g., 1 hour, 1 day, 1 month, 1 year, and the like). In another instance, the one or more energy meters 102 may measure the total energy used by one or more appliances 104 over a selected number of time interval. In yet another instance, the one or more energy meters 102 may measure the total energy used by one or more appliances 104 over a cumulative time period. In this regard, the energy meter 102 may begin an energy usage measurement operation upon receiving a start instruction from the controller 106 and end the energy usage measurement operation upon receiving a stop instruction from the controller 106.

Figure 23:
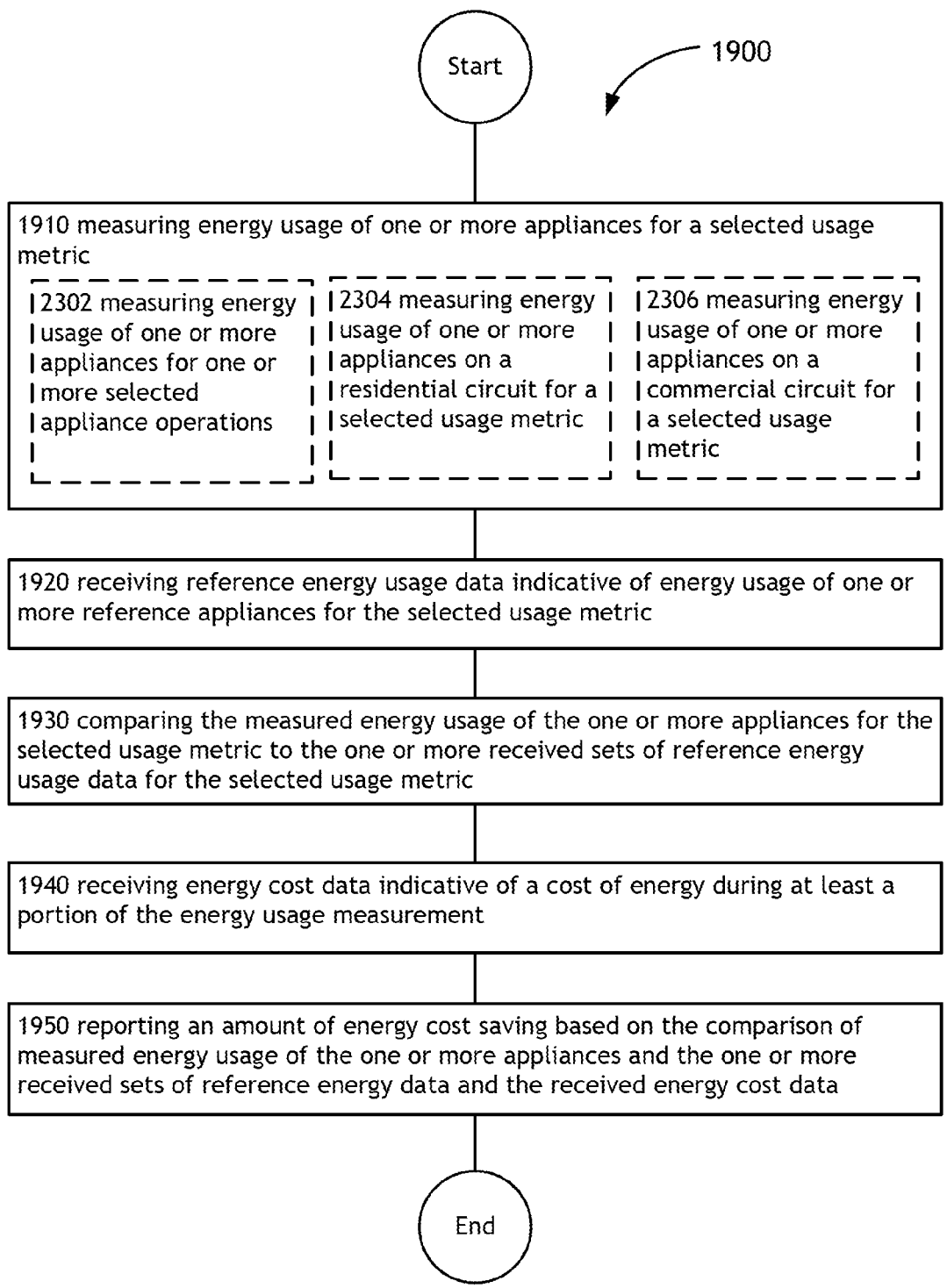

FIG. 23 illustrates alternative embodiments of the example operational flow 1900 of FIG. 19. FIG. 23 illustrates example embodiments where the measuring operation 1910 may include at least one additional operation. Additional operations may include an operation 2302, 2304 and/or operation 2306.

The operation 2302 illustrates measuring energy usage of one or more appliances for one or more selected appliance operations. For example, as shown in FIGS. 1A and 1B, the one or more energy meters 102 may measure the energy used by one or more appliances 104 for a selected number of appliance operations. For instance, the one or more energy meters 102 may measure the energy used by a washer/dryer for a selected number of washing/drying cycles.

The operation 2304 illustrates measuring energy usage of one or more appliances on a residential circuit for a selected usage metric. For example, as shown in FIGS. 1A and 1B, the one or more energy meters 102 may measure the energy used by one or more appliances 104 on a residential circuit for a selected usage metric.

The operation 2306 illustrates measuring energy usage of one or more appliances on a commercial circuit for a selected usage metric. For example, as shown in FIGS. 1A and 1B, the one or more energy meters 102 may measure the energy used by one or more appliances 104 on a commercial circuit for a selected usage metric.

Figure 24:
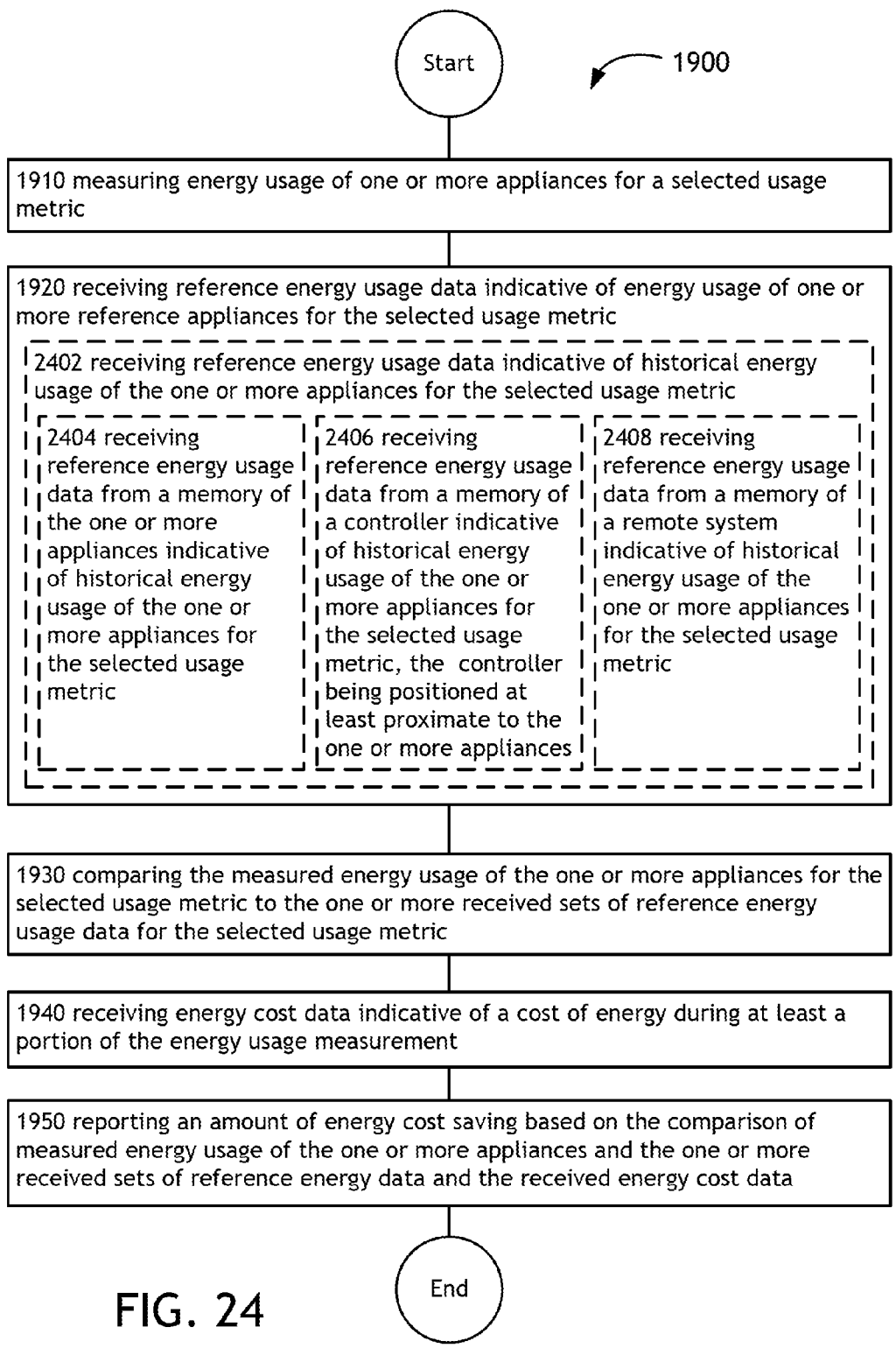

FIG. 24 illustrates alternative embodiments of the example operational flow 1900 of FIG. 19. FIG. 24 illustrates example embodiments where the reference receiving operation 1920 may include at least one additional operation. Additional operations may include an operation 2402, 2404, 2406 and/or operation 2408.

The operation 2402 illustrates receiving reference energy usage data indicative of historical energy usage of the one or more appliances 104 for the selected usage metric. For example, as shown in FIGS. 1A and 1B, the one or more processors 108 of the controller 106 may receive reference energy usage data indicative of historical energy usage of the one or more appliances 104 from a reference energy usage database (e.g., database 110, database 116, database 122 and the like) maintained on a memory device. In this regard, the controller 106 may act to generate a historical energy usage database for one or more appliances 104 by storing energy usage data associated with the one or more appliances 104 in a reference energy database maintained in a memory communicatively coupled to the one or more processors 108 of the controller 106. Reference energy usage data stored in the generated historical reference energy database may then be transmitted from the memory device to the one or more processors 108 of the controller 106 via network 124.

In a further embodiment, operation 2404 illustrates receiving reference energy usage data from a memory 114 of the one or more appliances 104 indicative of historical energy usage of the one or more appliances for the selected usage metric. For example, as shown in FIGS. 1A and 1B, the one or more processors 108 of the controller 106 may receive reference energy usage data indicative of historical energy usage of the one or more appliances 104 from a reference energy usage database 116 maintained in a memory device 114 of the one or more appliances 104 via a wireline data coupling or wireless data coupling between the one or more appliances 104 and the controller 106.

In a further embodiment, operation 2406 illustrates receiving reference energy usage data from a memory 112 of a controller 106 indicative of historical energy usage of the one or more appliances 104 for the selected usage metric, the controller 104 being positioned at least proximate to the one or more appliances 104. For example, as shown in FIGS. 1A and 1B, the one or more processors 108 of the controller 106 may receive reference energy usage data indicative of historical energy usage of the one or more appliances 104 for a selected usage metric from a reference energy database 110 maintained on a memory device 112 of controller 106.

In a further embodiment, operation 2408 illustrates receiving reference energy usage data from a memory 120 of a remote system 118 indicative of historical energy usage of the one or more appliances 104 for the selected usage metric. For example, as shown in FIGS. 1A and 1B, the one or more processors 108 of the controller 106 may receive reference energy usage data indicative of historical energy usage of the one or more appliances 104 for a selected usage metric from a reference energy database 122 maintained on a memory device 120 of a remote system 118 via network 124.

Figure 25:
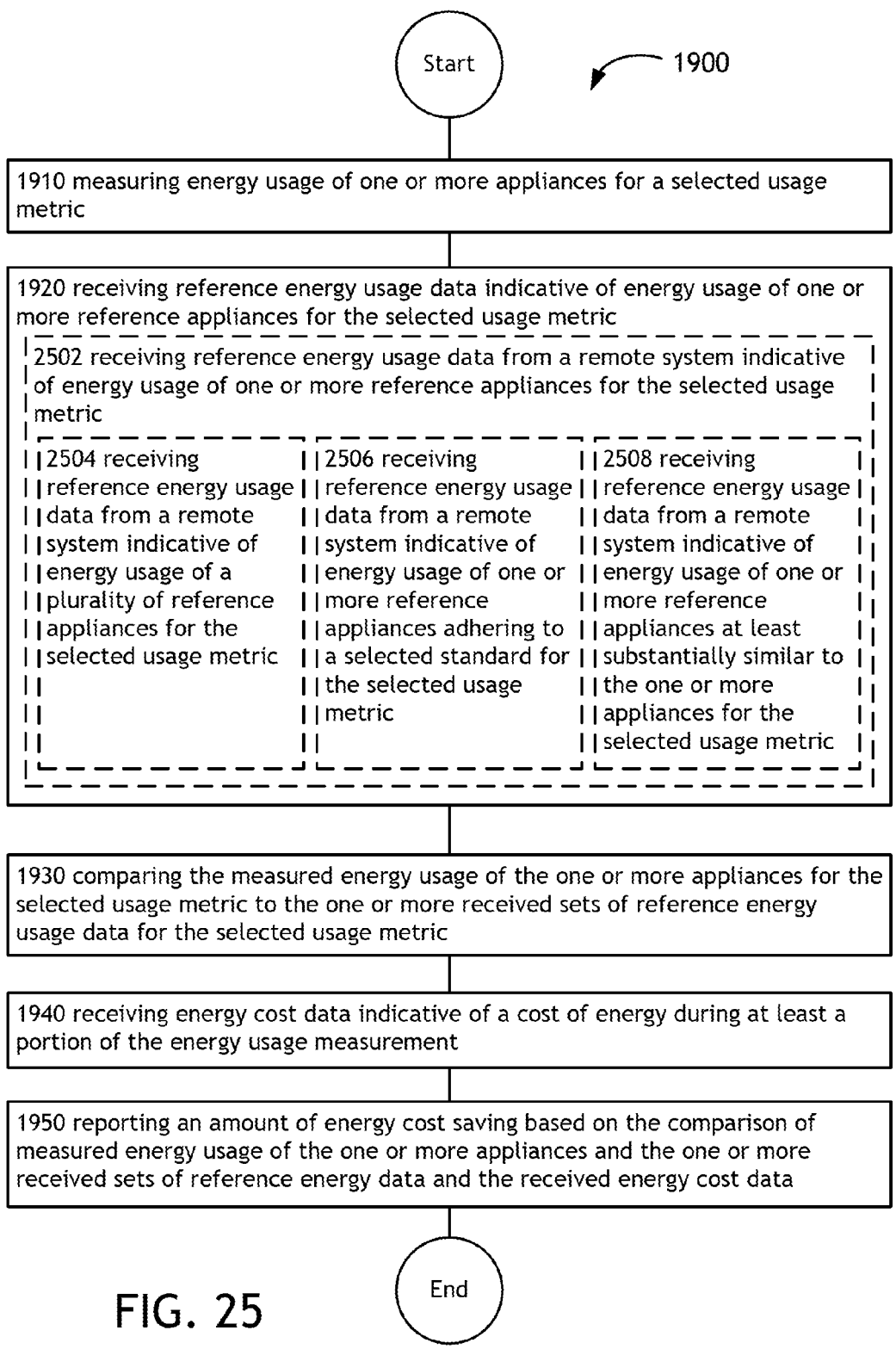

FIG. 25 illustrates alternative embodiments of the example operational flow 1900 of FIG. 19. FIG. 25 illustrates example embodiments where the reference receiving operation 1920 may include at least one additional operation. Additional operations may include an operation 2502, 2504, 2506 and/or operation 2508.

The operation 2502 illustrates receiving reference energy usage data from a remote system 118 indicative of energy usage of one or more reference appliances for the selected usage metric. For example, as shown in FIGS. 1A and 1B, the one or more processors 108 of the controller 106 may receive reference energy usage data indicative of energy usage of one or more reference appliances for the selected usage metric from a reference energy database 122 maintained on a memory device 120 of a remote system 118. The one or more processors 108 and the remote system 118 may both be connected to the network 124 via network interface devices 138 and 140, respectively. In this regard, the remote system 118 may transmit reference energy usage data from the reference energy database 122 maintained on the memory device 120 to the one or more processors 108 of controller 106 via network 124.

In a further embodiment, operation 2504 illustrates receiving reference energy usage data from a remote system 118 indicative of energy usage of a plurality of reference appliances for the selected usage metric. For example, as shown in FIGS. 1A and 1B, the one or more processors 108 of the controller 106 may receive reference energy usage data indicative of energy usage of a plurality of reference appliances for the selected usage metric from a reference energy database 122 maintained on a memory device 120 of a remote system 118 via network 124. In this regard, the remote system 118 may act to aggregate reference energy data from multiple reference appliances. For instance, the remote system 118 may act to aggregate reference energy data from multiple reference appliances from a selected geographic region (e.g., neighborhood, city, state, country, and the like). In one embodiment, the remote system 118 may feed reference data to the one or more processors 108 of the controller 106 for reference appliances residing in the same geographic region as the one or more appliances 104. In another instance, the remote system 118 may act to aggregate reference energy data from multiple reference appliances from a selected time period. In a further aspect, the multiple reference appliances may be identical to or similar in type (e.g., brand, model, and the like) as the one or more appliances 104. In another aspect, the multiple reference appliances may be of a different type than the one or more appliances 104.

In a further embodiment, operation 2506 illustrates receiving reference energy usage data from a remote system indicative of energy usage of one or more reference appliances adhering to a selected standard for the selected usage metric. For example, as shown in FIGS. 1A and 1B, the one or more processors 108 of the controller 106 may receive reference energy usage data indicative of energy usage of one or more reference appliances adhering to a selected standard for the selected usage metric from a reference energy database 122 maintained on a memory device 120 of a remote system 118 via network 124. In this regard, the remote system 118 may act to collect reference energy data from one or more reference appliances adhering to a selected standard. For instance, the selected standard may include, but is not limited to, standard defined by an industry (e.g., industry trade association), a standard defined by a manufacturer, a standard defined by a consumer advocacy group, and the like.

In a further embodiment, operation 2508 illustrates receiving reference energy usage data from a remote system 118 indicative of energy usage of one or more reference appliances at least substantially similar to the one or more appliances 104 for the selected usage metric. For example, as shown in FIGS. 1A and 1B, the one or more processors 108 of the controller 106 may receive reference energy usage data indicative of energy usage for one or more references appliances similar or identical to the one or more appliances 104 for the selected usage metric from a reference energy database 122 maintained on a memory device 120 of a remote system 118 via network 124. In this regard, the remote system 118 may act to collect reference energy data from one or more reference appliances identical to or at least similar to the one or more appliances 104. The remote system 118 may then transmit the reference energy data to the one or more processors 108 of the controller 106 via the network 124.

Figure 26:
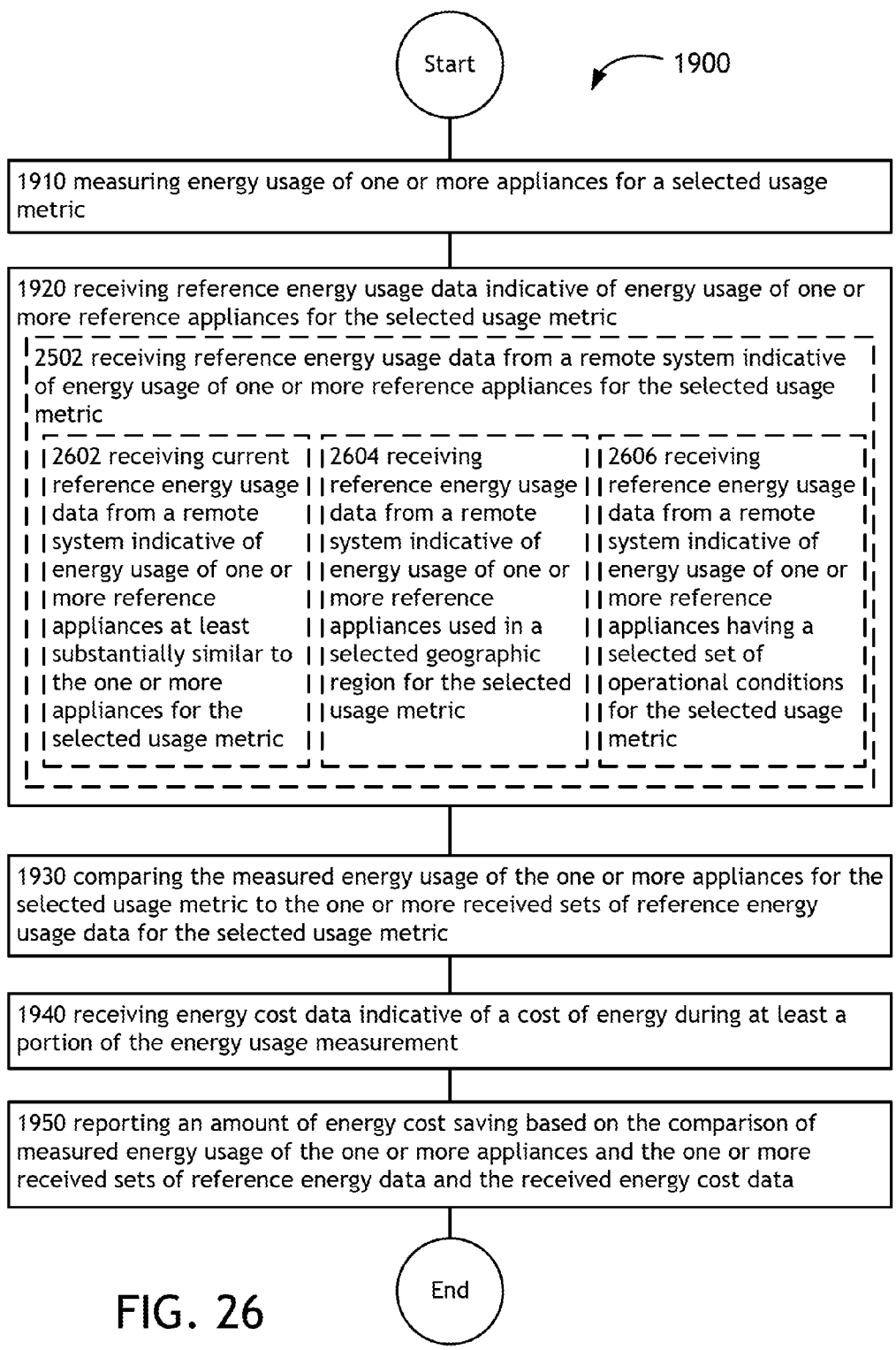

FIG. 26 illustrates alternative embodiments of the example operational flow 1900 of FIG. 19. FIG. 26 illustrates example embodiments where the reference receiving operation 1920 may include at least one additional operation. Additional operations may include an operation 2602, 2604, and/or operation 2606.

In a further embodiment, operation 2602 illustrates receiving current reference energy usage data from a remote system 118 indicative of energy usage of one or more reference appliances at least substantially similar to the one or more appliances 104 for the selected usage metric. For example, as shown in FIGS. 1A and 1B, the one or more processors 108 of the controller 106 may receive current reference energy usage data indicative of energy usage for one or more references appliances similar or identical to the one or more appliances 104 for the selected usage metric from a reference energy database 122 maintained on a memory device 120 of a remote system 118 via network 124. In this regard, the remote system 118 may act to collect reference energy data from one or more reference appliances identical to or at least similar to the one or more appliances 104 and, in real-time or near real-time, transmit the reference energy data to the one or more processors 108 of the controller 106 via the network 124.

In a further embodiment, operation 2604 illustrates receiving reference energy usage data from a remote system indicative of energy usage of one or more reference appliances used in a selected geographic region for the selected usage metric. For example, as shown in FIGS. 1A and 1B, the one or more processors 108 of the controller 106 may receive reference energy usage data indicative of energy usage for one or more references appliances used in a selected geographic region for the selected usage metric from a reference energy database 122 maintained on a memory device 120 of a remote system 118 via network 124. For instance, the remote system 118 may act to collect reference energy data from one or more reference appliances used in a geographic region (e.g., neighborhood, city, state, country and the like) common to the one or more appliances 104 and transmit the reference energy data to the one or more processors 108 of the controller 106 via the network 124. In another instance, the remote system 118 may act to collect reference energy data from one or more reference appliances used in a geographic different from the geographic region of the one or more appliances 104 and transmit the reference energy data to the one or more processors 108 of the controller 106 via the network 124.

In a further embodiment, operation 2606 illustrates receiving reference energy usage data from a remote system 118 indicative of energy usage of one or more reference appliances having a selected set of operational conditions for the selected usage metric. For example, as shown in FIGS. 1A and 1B, the one or more processors 108 of the controller 106 may receive reference energy usage data indicative of energy usage for one or more references appliances having a selected set of operational conditions for the selected usage metric from a reference energy database 122 maintained on a memory device 120 of a remote system 118 via network 124. For instance, the remote system 118 may act to collect reference energy data from one or more reference appliances for a selected set of operational conditions of the one or more appliances 104 and transmit the reference energy data to the one or more processors 108 of the controller 106 via the network 124. In one aspect, the one or more selected set of operational conditions may include, but are not limited to, conditions associated with the physical setting of the one or more appliances 104. For instance, an operational condition may include, but is not limited to, a physical attribute associated with the residence or building with which the one or more appliances 104 are implemented. For example, in the case of a heater/air conditioner, an operational condition may include, but is not limited to, the average outdoor temperature of the geographic region the appliance 104 is implemented, the orientation (e.g., relative to the Sun) of the building the heater/air conditioner is implemented, the average humidity of the geographic region the appliance 104 is implemented, and the like.

Figure 27:
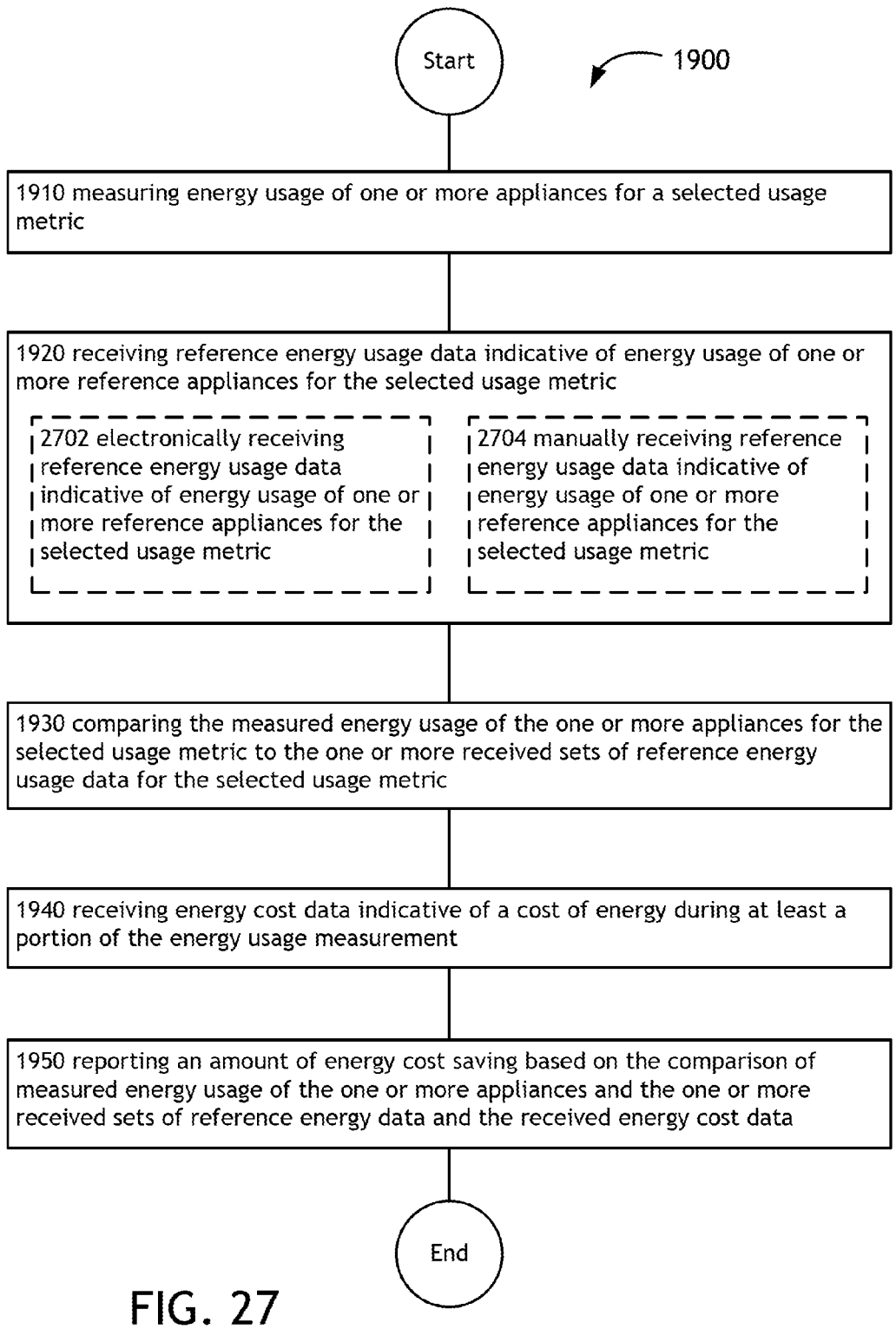

FIG. 27 illustrates alternative embodiments of the example operational flow 1900 of FIG. 19. FIG. 27 illustrates example embodiments where the reference receiving operation 1920 may include at least one additional operation. Additional operations may include an operation 2702 and/or operation 2704.

The operation 2702 illustrates electronically receiving reference energy usage data indicative of energy usage of one or more reference appliances for the selected usage metric. For example, as shown in FIGS. 1A and 1B, the one or more processors 108 of the controller 106 may electronically receive reference energy usage data indicative of energy usage for one or more references appliances for the selected usage metric from a reference energy database 122 maintained on a memory device 120 of a remote system 118 via network 124. For instance, the remote system 118 may include a remote server suitable for storing in memory the reference energy database 122 and coupled to network 124 via network interface device 140. Further, the one or more processors 108 of controller 106 may be coupled to the network 124 via network interface device 138, allowing the one or more processors 108 to selectably access the reference database 122 maintained on the memory of the server of the remote system 118.

The operation 2704 illustrates manually receiving reference energy usage data indicative of energy usage of one or more reference appliances for the selected usage metric. For example, as shown in FIGS. 1A and 1B, the one or more processors 108 of the controller 106 may manually receive reference energy usage data indicative of energy usage for one or more references appliances for the selected usage metric. For instance, reference energy data may be stored on a non-transitory medium (e.g., magnetic storage device, solid state memory device, optical storage device, and the like). The medium may then be manually transferred to the controller 106 by a user, wherein the one or more processors 108 may read the medium in order to obtain the reference energy data stored on the medium. In another instance, the reference energy data may be manually inputted into the controller 106 by a user via a user input device 142 (e.g., keyboard, touchpad interface, bezel mounted input device and the like) of the controller 106.

Figure 28:
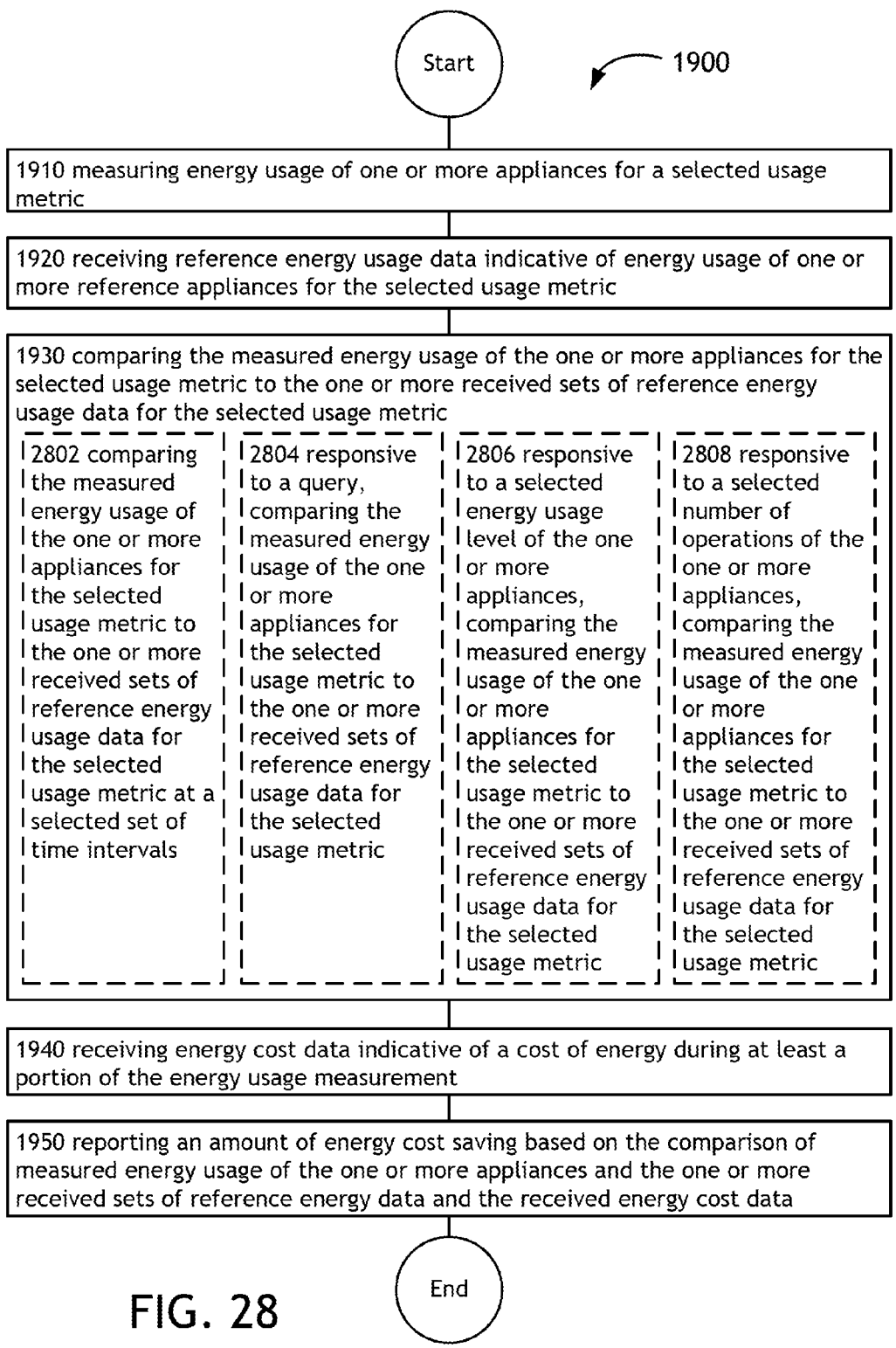

FIG. 28 illustrates alternative embodiments of the example operational flow 1900 of FIG. 19. FIG. 28 illustrates example embodiments where the comparing operation 1930 may include at least one additional operation. Additional operations may include an operation 2802, 2804, 2806, and/or operation 2808.

The operation 2802 illustrates comparing the measured energy usage of the one or more appliances 104 for the selected usage metric to the one or more received sets of reference energy usage data for the selected usage metric at a selected set of time intervals. For example, as shown in FIGS. 1A and 1B, the one or more processors 108 of controller 106 may compare the energy usage of the one or more appliances 104 as measured by the energy meter 102 to the one or more received sets of reference energy usage data for the selected usage metric at each of a selected set of time intervals. In this regard, the one or more processors 108 of the controller 106 may determine an amount of energy savings of the appliance 104 as measured relative to the received sets of reference energy usage data at each of a selected set of time intervals (e.g., selected number of hours, selected number of days, selected number of weeks, selected number of months, selected number of years and the like).

The operation 2804 illustrates, responsive to a query, comparing the measured energy usage of the one or more appliances 104 for the selected usage metric to the one or more received sets of reference energy usage data for the selected usage metric. For example, as shown in FIGS. 1A and 1B, the one or more processors 108 of controller 106 may compare the energy usage of the one or more appliances 104 as measured by the energy meter 102 to the one or more received sets of reference energy usage data for the selected usage metric in response to a query. For instance, a query may include a user generated query received by the one or more processors 108 from the user input device 142. In this regard, the one or more processors 108 of the controller 106 may determine an amount of energy savings of the appliance 104 as measured relative to the received set of reference energy usage data in response to a query signal from the user input device 142. In another instance, a query may include a query received from an additional system received by the one or more processors 108. In this regard, the one or more processors 108 of the controller 106 may determine an amount of energy savings of the appliance 104 as measured relative to the received set of reference energy usage data in response to a signal received from an additional system (e.g., received via network 124). For instance, the additional system (e.g., remote system 118) may include a system communicatively coupled to the controller 106 and maintained by an entity (e.g., manufacturer of appliance 104, governmental entity, consumer advocacy group, and the like) seeking to track the energy usage and/or efficiency of the one or more appliances 104.

The operation 2806 illustrates, responsive to a selected energy usage level of the one or more appliances 104, comparing the measured energy usage of the one or more appliances 104 for the selected usage metric to the one or more received sets of reference energy usage data for the selected usage metric. For example, as shown in FIGS. 1A and 1B, upon reaching a selected amount of used energy by the one or more appliances 104, the one or more processors 108 of controller 106 may compare the energy usage of the one or more appliances 104 as measured by the energy meter 102 to the one or more received sets of reference energy usage data for the selected usage metric. In this regard, the one or more processors 108 of the controller 106 may determine an amount of energy savings of the appliance 104 as measured relative to the received sets of reference energy usage data once the energy meter 102 has measured a selected level of energy usage by the one or more appliances 104. For instance, the selected level of energy usage by the one or more appliances 104 may include a selected amount of energy usage in a selected amount of time. For example, the one or more processors 108 may determine the amount of energy savings of the appliance 104 in the event the appliance 104 uses a selected amount of energy (e.g., 0.1 kWh, 1 kWh, 10 kWh, and the like) in one day. By way of another example, the one or more processors 108 may determine an amount of energy savings of the appliance 104 upon the measurement of an accumulated amount of energy usage by the appliance 104 that meets or exceeds a selected level of energy usage since the most recent comparison by the one or more processors 108. For instance, the one or more processors 108 may determine an amount of energy savings of the appliance 104 after the energy meter 102 measures an accumulated usage of 1 kWh by an appliance 104 since the last comparison operation performed by the one or more processors 108.

The operation 2808 illustrates, responsive to a selected number of operations of the one or more appliances 104, comparing the measured energy usage of the one or more appliances 104 for the selected usage metric to the one or more received sets of reference energy usage data for the selected usage metric. For example, as shown in FIGS. 1A and 1B, upon sensing a selected number of operations by the one or more appliances 104, the one or more processors 108 of controller 106 may compare the energy usage of the one or more appliances 104 as measured by the energy meter 102 to the one or more received sets of reference energy usage data for the selected usage metric. In this regard, the one or more processors 108 of the controller 106 may determine an amount of energy savings of the appliance 104 as measured relative to the received sets of reference energy usage data once the controller 106 has detected that the one or more appliances 104 have performed a selected number of operations. For instance, in the case of a washer/dryer, the one or more processors 108 may determine the amount of energy savings of the washer/dryer once the washer/dryer has performed a selected number of operations (e.g., 10 cycles, 100 cycles, 1000 cycles, and the like).

Figure 29:
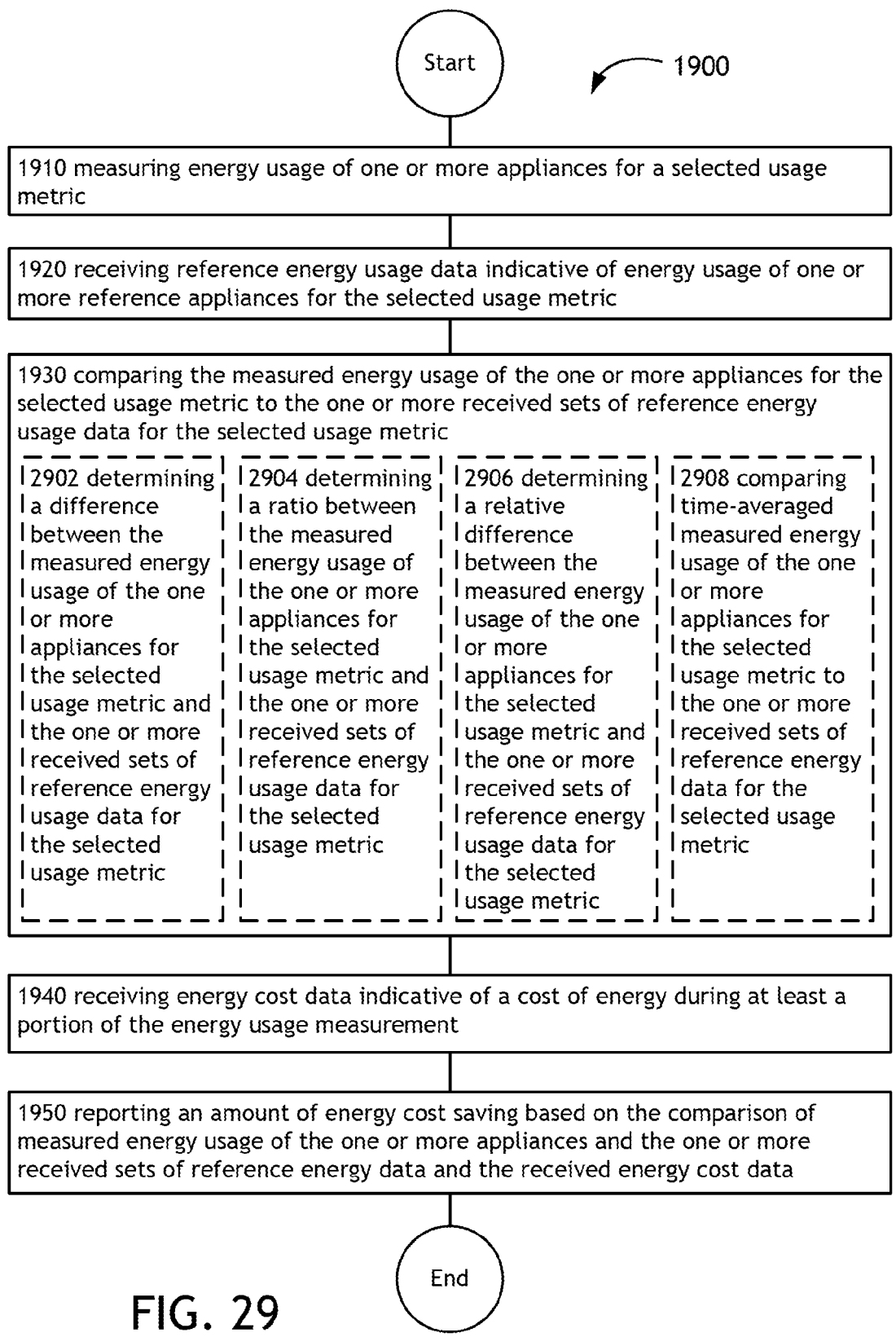

FIG. 29 illustrates alternative embodiments of the example operational flow 1900 of FIG. 19. FIG. 29 illustrates example embodiments where the comparing operation 1930 may include at least one additional operation. Additional operations may include an operation 2902, 2904, 2906, and/or operation 2908.

The operation 2902 illustrates determining a difference between the measured energy usage of the one or more appliances 104 for the selected usage metric and the one or more received sets of reference energy usage data for the selected usage metric. For example, as shown in FIGS. 1A and 1B, the one or more processors 108 of controller 106 may calculate a difference between the energy used by the one or more appliances 104 as measured by the energy meter 102 and the one or more received sets of reference energy usage data for the selected usage metric.

The operation 2904 illustrates determining a ratio between the measured energy usage of the one or more appliances for the selected usage metric and the one or more received sets of reference energy usage data for the selected usage metric. For example, as shown in FIGS. 1A and 1B, the one or more processors 108 of controller 106 may calculate a ratio between the energy used by the one or more appliances 104 as measured by the energy meter 102 and the one or more received sets of reference energy usage data for the selected usage metric.

The operation 2906 illustrates determining a relative difference between the measured energy usage of the one or more appliances for the selected usage metric and the one or more received sets of reference energy usage data for the selected usage metric. For example, as shown in FIGS. 1A and 1B, the one or more processors 108 of controller 106 may calculate a relative difference between the energy used by the one or more appliances 104 as measured by the energy meter 102 and the one or more received sets of reference energy usage data for the selected usage metric.

The operation 2908 illustrates comparing time-averaged measured energy usage of the one or more appliances 104 for the selected usage metric to the one or more received sets of reference energy data for the selected usage metric. For example, as shown in FIGS. 1A and 1B, the one or more processors 108 of controller 106 may compare the time-averaged energy usage of the one or more appliances 104 as measured by the energy meter 102 to the one or more received sets of reference energy usage data corresponding to the time-averaged energy usage of one or more reference appliances. For instance, the one or more processors 108 of the controller may compare (e.g., calculate a difference, relative difference, or ratio) the energy usage averaged over a selected time interval (e.g., 1 hour, 1 day, 1 month, 1 year, and the like) to the one or more received sets of reference energy corresponding to the time-averaged energy usage of one or more reference appliances.

Figure 30:
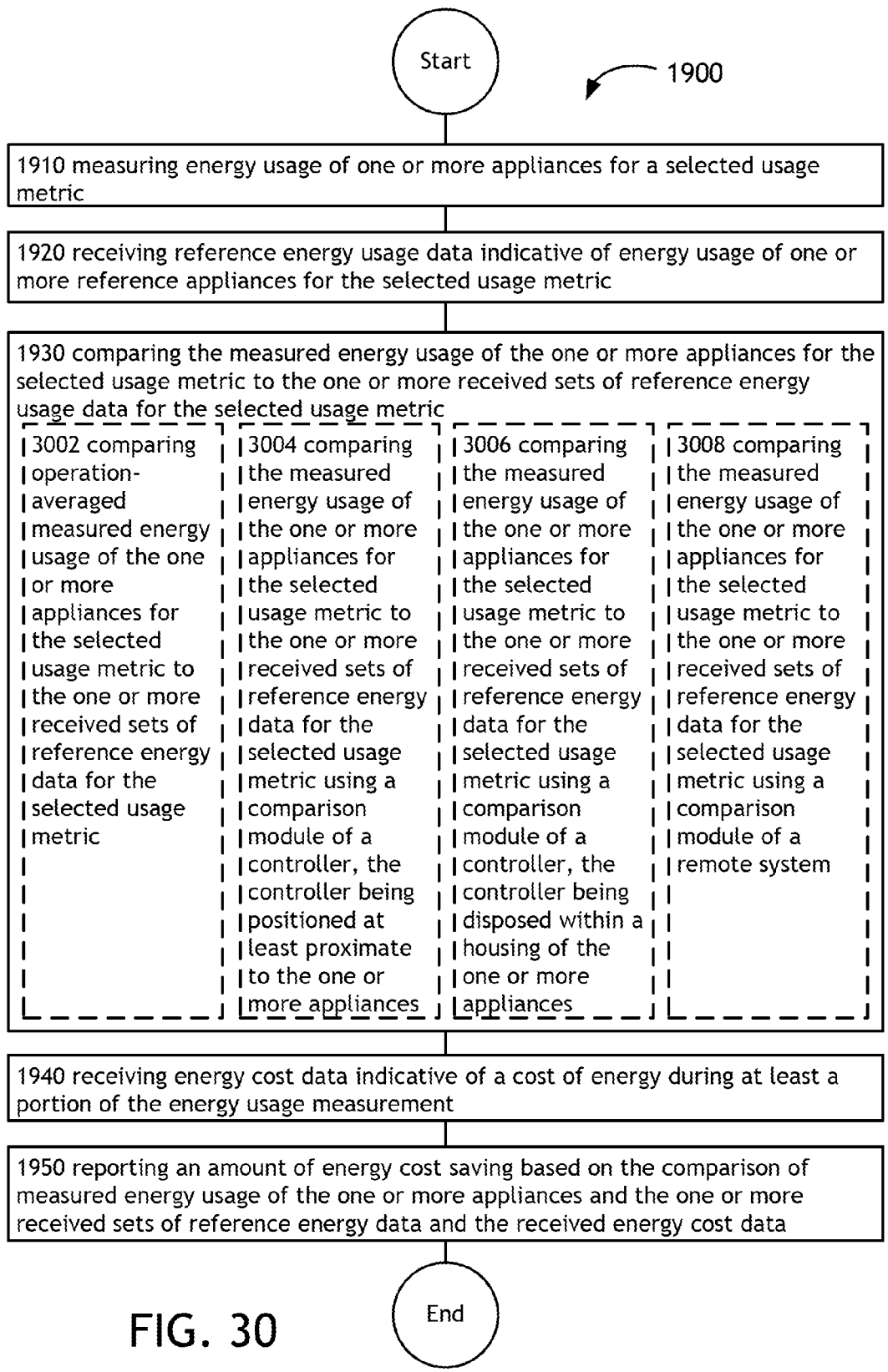

FIG. 30 illustrates alternative embodiments of the example operational flow 1900 of FIG. 19. FIG. 30 illustrates example embodiments where the comparing operation 1930 may include at least one additional operation. Additional operations may include an operation 3002, 3004, 3006, and/or operation 3008.

The operation 3002 illustrates comparing operation-averaged measured energy usage of the one or more appliances 104 for the selected usage metric to the one or more received sets of reference energy data for the selected usage metric. For example, as shown in FIGS. 1A and 1B, the one or more processors 108 of controller 106 may compare the operation-averaged energy usage of the one or more appliances 104 as measured by the energy meter 102 to the one or more received sets of reference energy usage data corresponding to the operation-averaged energy usage of one or more reference appliances. For instance, the one or more processors 108 of the controller 106 may compare the energy usage averaged over a selected number of operation cycles of the one or more appliances 104 to the one or more received sets of reference energy usage data corresponding to the operation-averaged energy usage of one or more reference appliances.

The operation 3004 illustrates comparing the measured energy usage of the one or more appliances 104 for the selected usage metric to the one or more received sets of reference energy data for the selected usage metric using a comparison module of a controller 106 positioned at least proximate to the one or more appliances 104. For example, as shown in FIGS. 1A and 1B, the one or more processors 108 of a controller 106 positioned proximate to the one or more appliances 104 may utilize a comparison module 144 in order to compare the energy usage of the one or more appliances 104 as measured by the energy meter 102 to the one or more received sets of reference energy usage data for the selected usage metric. In this regard, the comparison module 144 may include a set of program instructions stored in the memory 112 of the controller 106 and configured to direct the one or more processors 108 to execute a comparison operation between the measured energy usage of the one or more appliances 104 and the reference energy data.

The operation 3006 illustrates comparing the measured energy usage of the one or more appliances 104 for the selected usage metric to the one or more received sets of reference energy data for the selected usage metric using a comparison module of a controller 106 disposed within a housing of the one or more appliances 104. For example, as shown in FIGS. 1A and 1B, the one or more processors 108 of a controller 106 disposed within the housing of the one or more appliances 104 may utilize a comparison module 144 in order to compare the energy usage of the one or more appliances 104 as measured by the energy meter 102 to the one or more received sets of reference energy usage data for the selected usage metric. In this regard, the comparison module 144 may include a set of program instructions stored in the memory 112 of the controller 106 and configured to direct the one or more processors 108 to execute a comparison operation between the measured energy usage of the one or more appliances 104 and the reference energy data.

The operation 3008 illustrates comparing the measured energy usage of the one or more appliances 104 for the selected usage metric to the one or more received sets of reference energy data for the selected usage metric using a comparison module of a remote system 118. For example, as shown in FIGS. 1A and 1B, the one or more processors 108 of a controller 106 may utilize a comparison module 146 of a remote system 118 in order to compare the energy usage of the one or more appliances 104 as measured by the energy meter 102 to the one or more received sets of reference energy usage data for the selected usage metric. For instance, the comparison module 146 may include a set of program instructions stored in the memory 120 of the remote system 118 and configured to direct the one or more processors 108 of controller 106 to execute a comparison operation between the measured energy usage of the one or more appliances 104 and the reference energy data. In one aspect, the one or more controllers 106 may include a free-standing controller operatively coupled to the one or more appliances 104 and configured to execute the set of program instructions stored on the memory 120 of the remote system 118. Alternatively, the one or more controllers 106 may be disposed within the remote system 118 (e.g., within the housing of the remote system) or proximate to the remote system 118 and may be configured to execute the comparison algorithm stored on the memory 120 of the remote system 118.

Figure 31:
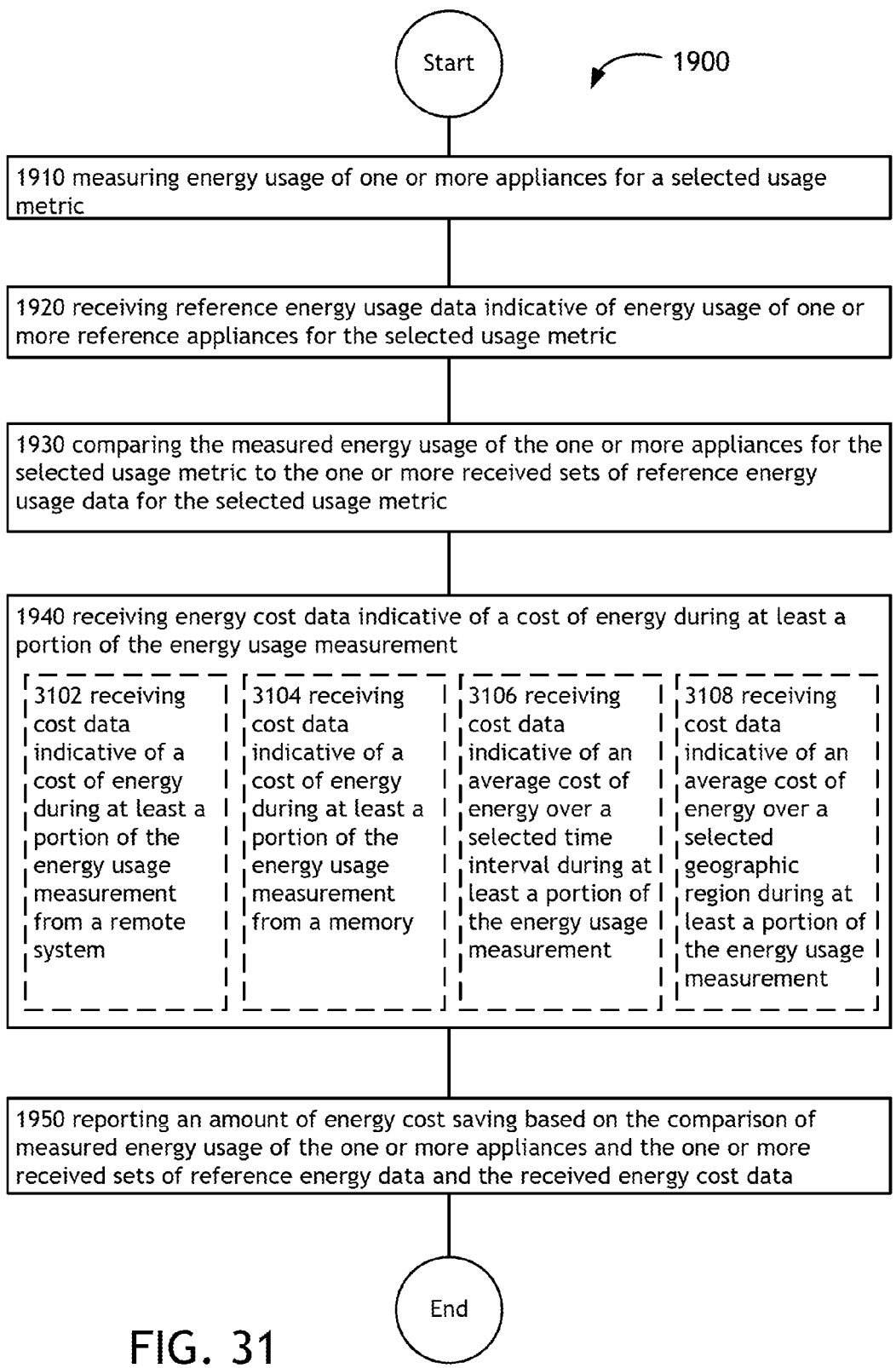

FIG. 31 illustrates alternative embodiments of the example operational flow 1900 of FIG. 19. FIG. 14 illustrates example embodiments where the cost receiving operation 1940 may include at least one additional operation. Additional operations may include an operation 3102, 3104, 3106, and/or operation 3108.

The operation 3102 illustrates receiving cost data indicative of a cost of energy during at least a portion of the energy usage measurement from a remote system. For example, as shown in FIGS. 1A and 1B, the one or more processors 108 of the controller 106 may receive energy cost data indicative of the cost of energy used by the one or more appliances 104 for at least a portion of the energy usage measurement performed by the energy meter 102 from a remote system 118 (e.g., server maintained by utility company, server maintained by appliance manufacturer, server maintained by governmental agency, and the like) via network 124.

The operation 3104 illustrates receiving cost data indicative of a cost of energy during at least a portion of the energy usage measurement from a memory. For example, as shown in FIGS. 1A and 1B, the one or more processors 108 of the controller 106 may receive energy cost data indicative of the cost of energy used by the one or more appliances 104 for at least a portion of the energy usage measurement performed by the energy meter 102 from a memory device. For instance, the one or more processors 108 of the controller 106 may receive energy cost data indicative of the cost of energy used by the one or more appliances 104 for at least a portion of the energy usage measurement performed by the energy meter 102 from a cost savings database 144 maintained in the memory 120 of a remote system 118. In this regard, the remote system 118 may act to collect energy cost information and store that information in an energy cost database 144 in memory 120. The energy cost database 144 may then be selectably accessed by the one or more processors 108 of the controller 106.

In another instance, the one or more processors 108 of the controller 106 may receive energy cost data indicative of the cost of energy used by the one or more appliances 104 for at least a portion of the energy usage measurement performed by the energy meter 102 from a cost savings database 147 maintained in the memory 112 of the controller 106. In this regard, the controller 106 may act to receive energy cost information from an external source (e.g., remote system 118, an additional cost information source, and the like) and store that information in an energy cost database 147 in memory 112. The energy cost database 147 may then be selectably accessed by the one or more processors 108 of the controller 106.

In another instance, the one or more processors 108 of the controller 106 may receive energy cost data indicative of the cost of energy used by the one or more appliances 104 for at least a portion of the energy usage measurement performed by the energy meter 102 from a cost savings database 148 maintained in the memory 114 of the one or more appliances 104. In this regard, the one or more appliances 104 may act to receive energy cost information from an external source (e.g., remote system 118, an additional cost information source, and the like) and store that information in an energy cost database 148 in memory 114. The energy cost database 148 may then be selectably accessed by the one or more processors 108 of the controller 106.

The operation 3106 illustrates receiving cost data indicative of an average cost of energy over a selected time interval during at least a portion of the energy usage measurement. For example, as shown in FIGS. 1A and 1B, the one or more processors 108 of the controller 106 may receive energy cost data indicative of the average cost of energy over a selected time period (e.g., selected number of minutes, selected number of hours, selected number days, selected number of years, and the like) for at least a portion of the energy usage measurement performed by the energy meter 102 via network 124. In this regard, the time period used to average the cost of energy consists of a sub-set of the time period of the energy usage measurement performed by the energy meter 102.

The operation 3108 illustrates receiving cost data indicative of an average cost of energy over a selected geographic region during at least a portion of the energy usage measurement. For example, as shown in FIGS. 1A and 1B, the one or more processors 108 of the controller 106 may receive energy cost data indicative of the average cost of energy over a selected geographic region for at least a portion of the energy usage measurement performed by the energy meter 102 via network 124.

Figure 32:
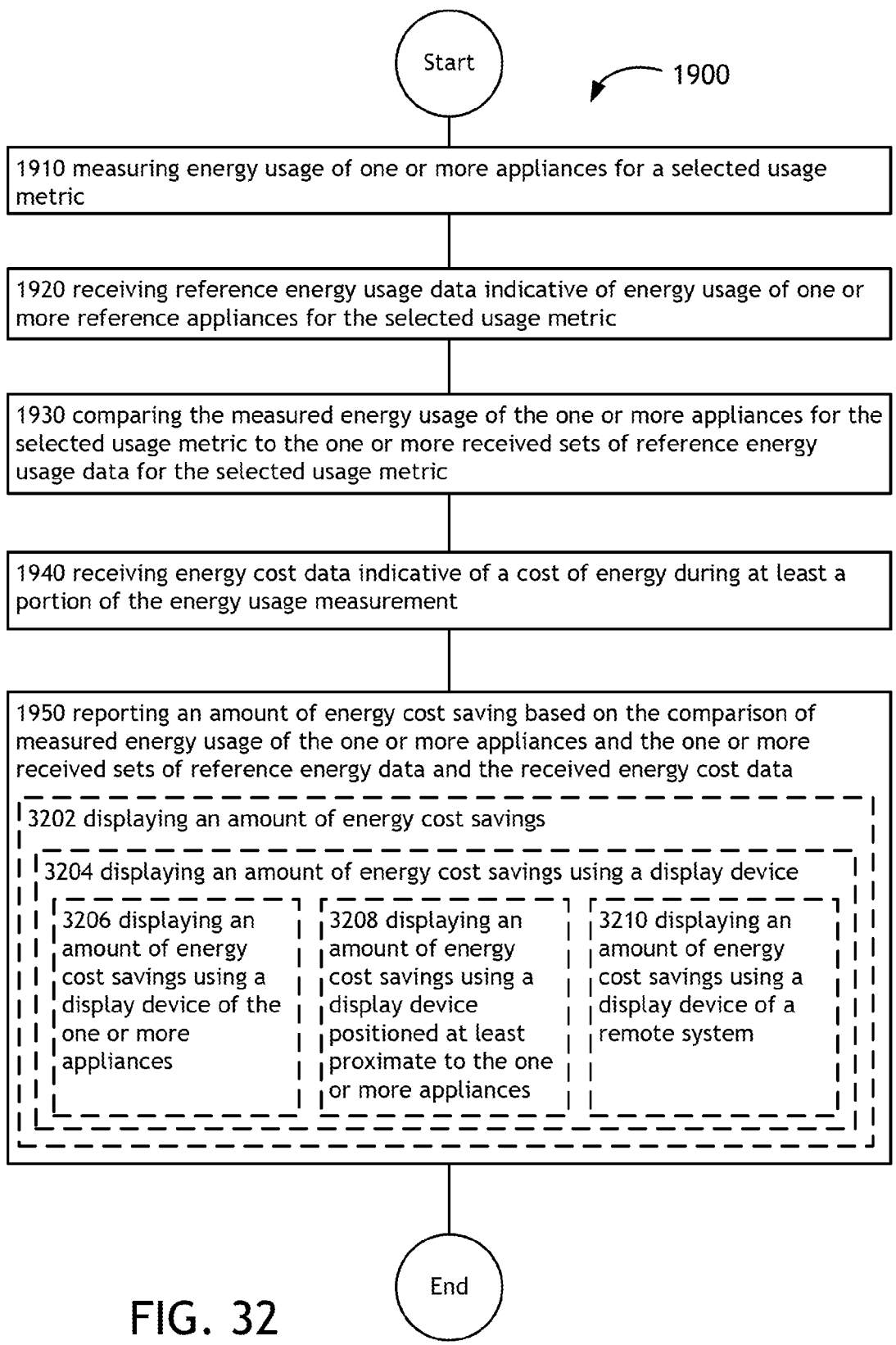

FIG. 32 illustrates alternative embodiments of the example operational flow 1900 of FIG. 19. FIG. 32 illustrates example embodiments where the reporting operation 1950 may include at least one additional operation. Additional operations may include an operation 3202, 3204, 3206, 3208, and/or operation 3210.

The operation 3202 illustrates displaying an amount of energy cost savings. For example, as shown in FIG. 1A and FIG. 1B, the one or more processors 108 of the controller 106 may visually display the amount of energy cost savings based on the comparison of the measured energy usage of the one or more appliances 104 and the one or more received sets of reference energy data and the received energy cost data. In another example, the one or more processors 108 of the controller 106 may audibly display the amount of energy cost savings based on the comparison of measured energy usage of the one or more appliances and the one or more received sets of reference energy data and the received energy cost data.

In a further embodiment, operation 3204 illustrates displaying an amount of energy cost savings using a display device. For example, as shown in FIG. 1A and FIG. 1B, the one or more processors 108 of the controller 106 may display the amount of energy cost savings based on the comparison of measured energy usage of the one or more appliances 104 and the one or more received sets of reference energy data and the received energy cost data on one or more display devices communicatively coupled to the one or more processors 108. For instance, the one or more processors 108 of the controller 106 may display the amount of energy cost savings on one or more visual display devices, such as a liquid crystal display (LCD), one or more light emitting diodes (LEDs), one or more organic LEDs (OLEDs), or a cathode rate tube (CRT). In this regard, the one or more display devices may be configured to utilize text-based messages, symbols, indicia, or other identifiable visual characters, or symbols. In another instance, the one or more processors 108 of the controller 106 may display the amount of energy on one or more audio display devices, such as a speaker. In this regard, information related to the energy cost savings of the one or more appliances 104 may be relayed to a user via an audible signal, such as, but not limited to, an audible announcement, a tone, a simulated voice, or a series of tones.

Further, operation 3206 illustrates displaying an amount of energy savings on a display device 128 of the one or more appliances 104. For example, as shown in FIG. 1A and FIG. 1B, the one or more processors 108 of the controller 106 may display the amount of energy cost savings based on the comparison of measured energy usage of the one or more appliances 104 and the one or more received sets of reference energy data and the received energy cost data on one or more display devices 128 of the one or more appliances 104. In this regard, the one or more display devices 128 may be integrated within the housing of the one or more appliances 104.

Further, operation 3208 illustrates displaying an amount of energy savings on a display device 126 positioned at least proximate to the one or more appliances 104. For example, as shown in FIG. 1A and FIG. 1B, the one or more processors 108 of the controller 106 may display the amount of energy cost savings based on the comparison of measured energy usage of the one or more appliances and the one or more received sets of reference energy data and the received energy cost data on one or more display devices 128 positioned at least proximate to the one or more appliances 104. For instance, the one or more processors 108 may display the energy cost savings on a free-standing display device 126 communicatively coupled to the one or more processors 108 of the controller 106 and positioned proximate to the one or more appliances 104. In another instance, the one or more processors 108 may display the energy cost savings on an integrated controller-display device, whereby the display device 126 and controller 106 are integrated into a single housing unit, which is communicatively couplable to the energy meter 102. In another instance, the one or more processors 108 may display the energy cost savings on a display device 126 integrated within the housing of the energy meter 102 (e.g., a LCD display of the energy meter 102).

Further, operation 3210 illustrates displaying an amount of energy savings on a display device 130 of a remote system 118. For example, as shown in FIG. 1A and FIG. 1B, the one or more processors 108 of the controller 106 may display the amount of energy cost savings based on the comparison of measured energy usage of the one or more appliances 104 and the one or more received sets of reference energy data and the received energy cost data on one or more display devices 130 of a remote system 118. For instance, the remote system 118 may consist of a system positioned remotely from the controller 106 and communicatively coupled to the controller 106, such as a portable communications device (e.g., tablet, PDA, smartphone, and the like) or a remotely positioned computing system (e.g., desktop computer, server, network of multiple computers, and the like).

Figure 33:
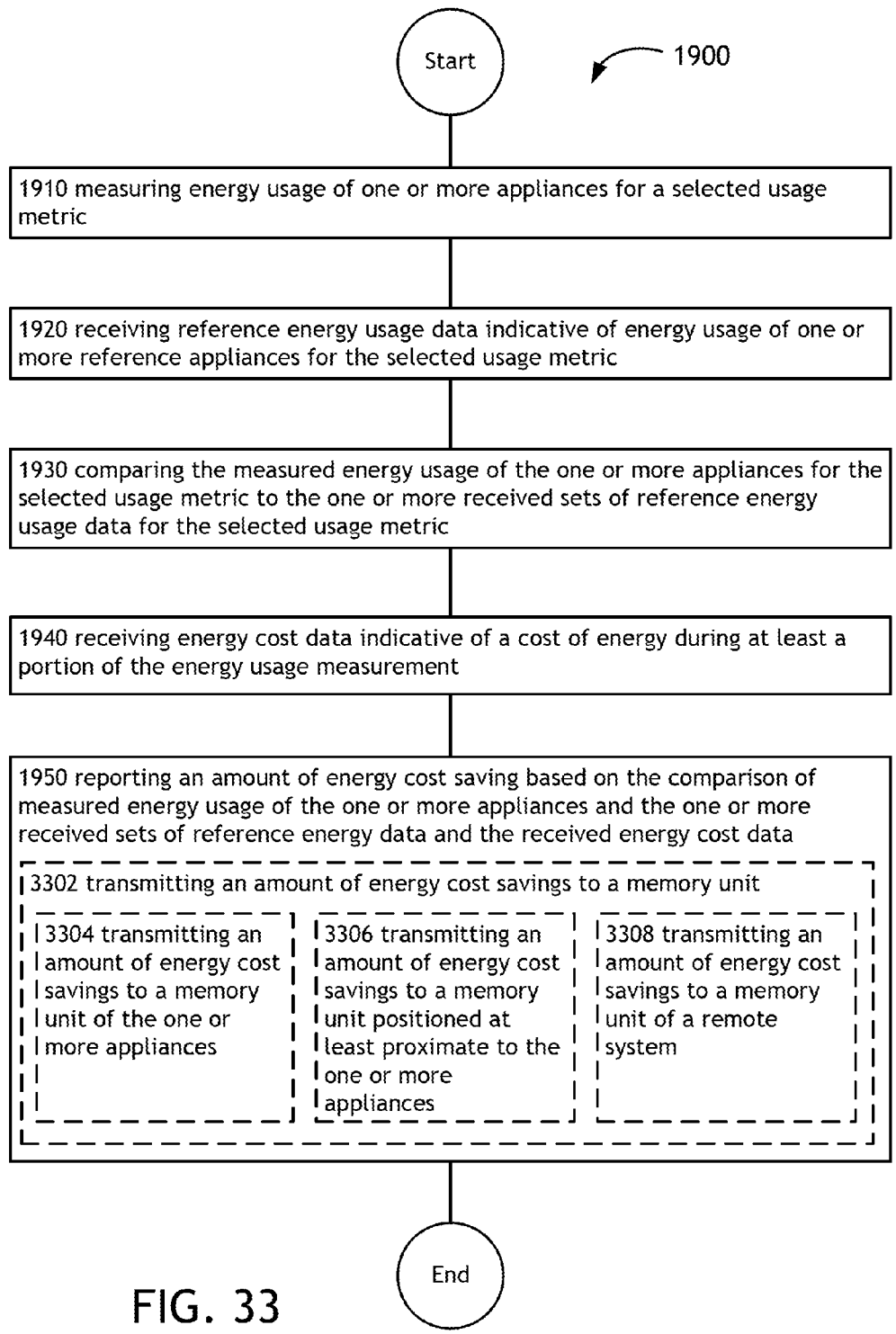

FIG. 33 illustrates alternative embodiments of the example operational flow 1900 of FIG. 19. FIG. 33 illustrates example embodiments where the reporting operation 1950 may include at least one additional operation. Additional operations may include an operation 3302, 3304, 3306, and/or 3308.

The operation 3302 illustrates transmitting an amount of energy savings to a memory unit. For example, as shown in FIGS. 1A and 1B, the one or more processors 108 of the controller 106 may transmit the amount of energy cost savings based on the comparison of measured energy usage of the one or more appliances 104 and the one or more received sets of reference energy data and the received energy cost data to a memory unit communicatively coupled to the one or more processors 108. For instance, the one or more processors 108 of the controller 106 may transmit the amount of energy cost savings based on the comparison of measured energy usage of the one or more appliances 104 and the one or more received sets of reference energy data and the received energy cost data to an energy cost savings database maintained on a memory unit communicatively coupled to the one or more processors 108.

In a further embodiment, operation 3304 illustrates transmitting an amount of energy cost savings to a memory unit 114 of the one or more appliances 104. For example, as shown in FIGS. 1A and 1B, the one or more processors 108 of the controller 106 may transmit the amount of energy cost savings based on the comparison of measured energy usage of the one or more appliances 104 and the one or more received sets of reference energy data and the received energy cost data to a memory unit 114 of the one or more appliances 104 communicatively coupled to the one or more processors 108. For instance, the one or more processors 108 of the controller 106 may transmit the amount of energy cost savings based on the comparison of measured energy usage of the one or more appliances 104 and the one or more received sets of reference energy data and the received energy cost data to an energy cost savings database 152 maintained on a memory unit 114 communicatively coupled to the one or more processors 108.

In a further embodiment, operation 3306 illustrates transmitting an amount of energy cost savings to a memory unit 112 positioned at least proximate to the one or more appliances 104. For example, as shown in FIGS. 1A and 1B, the one or more processors 108 of the controller 106 may transmit the amount of energy cost savings based on the comparison of measured energy usage of the one or more appliances 104 and the one or more received sets of reference energy data and the received energy cost data to a memory unit 112 positioned at least proximate to the one or more appliances 104 and communicatively coupled to the one or more processors 108 of the controller 106. For instance, the one or more processors 108 of the controller 106 may transmit the amount of energy savings based on the comparison of measured energy usage of the one or more appliances 104 and the one or more received sets of reference energy data and the received energy cost data to an energy cost savings database 150 maintained on a memory unit 112 of the controller 106, whereby the controller 106 is positioned at least proximate to the one or more appliances 104.

In a further embodiment, operation 3308 illustrates transmitting an amount of energy savings to a memory unit 120 of a remote system 118. For example, as shown in FIGS. 1A and 1B, the one or more processors 108 of the controller 106 may transmit the amount of energy cost savings based on the comparison of measured energy usage of the one or more appliances 104 and the one or more received sets of reference energy data and the received energy cost data to a memory unit 120 of a remote system 118. For instance, the one or more processors 108 of the controller 106 may transmit the amount of energy savings based on the comparison of measured energy usage of the one or more appliances 104 and the one or more received sets of reference energy data and the received energy cost data to an energy cost savings database 154 maintained on a memory unit 120 of the remote system 118 via network 124.

Figure 34:
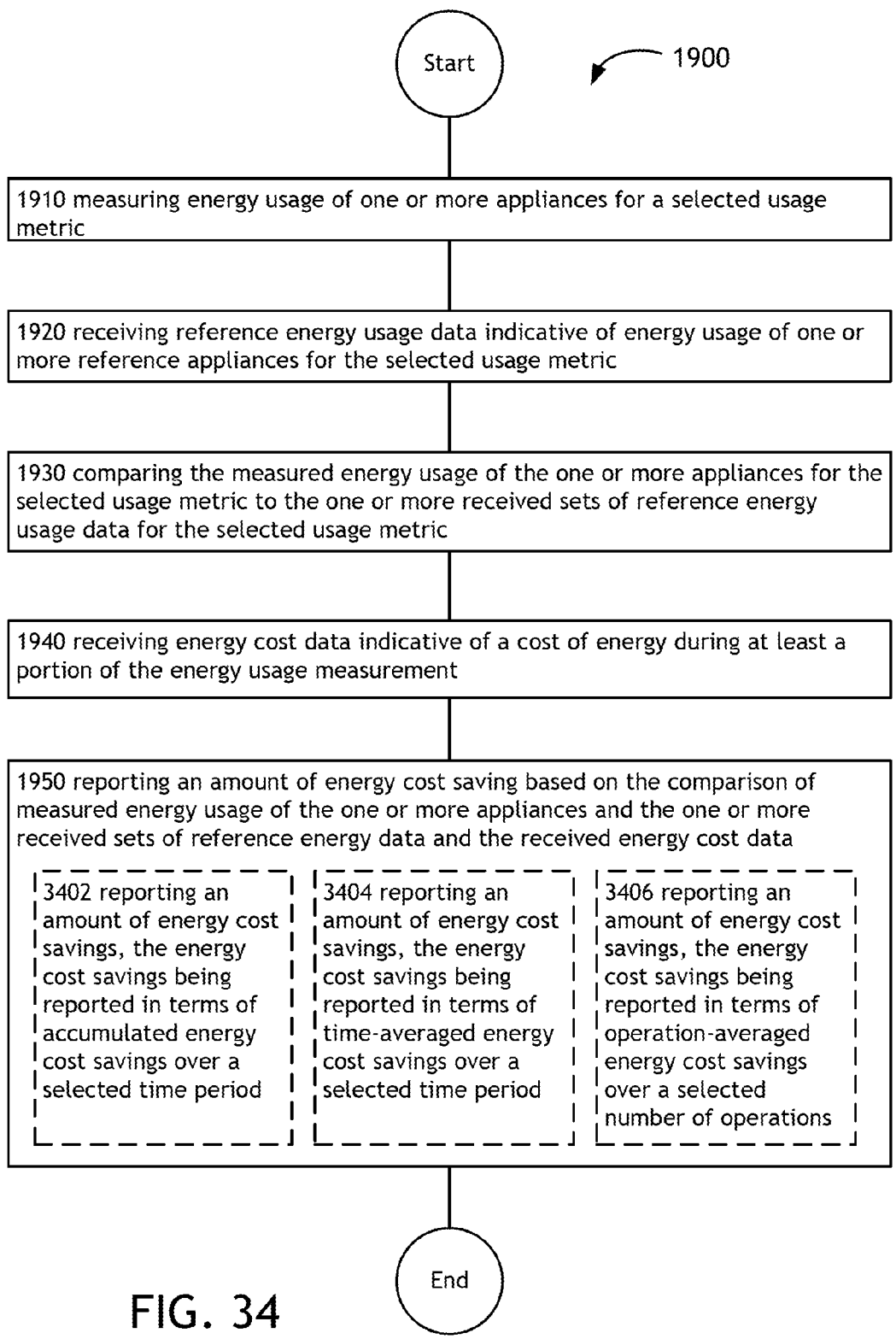

FIG. 34 illustrates alternative embodiments of the example operational flow 1900 of FIG. 19. FIG. 34 illustrates example embodiments where the reporting operation 1950 may include at least one additional operation. Additional operations may include an operation 3402, 3404, and/or 3406.

The operation 3402 illustrates reporting an amount of energy cost savings in terms of accumulated energy cost savings over a selected time period. For example, as shown in FIGS. 1A and 1B, the one or more processors 108 of the controller 106 may report (e.g., display on display device, transmit to memory, and the like) the amount of energy cost savings based on the comparison of measured energy usage of the one or more appliances 104 and the one or more received sets of reference energy data and the received energy cost data in terms of accumulated energy cost savings over a selected time period (e.g., selected by a user).

The operation 3404 illustrates reporting an amount of energy cost savings in terms of time-averaged power savings over a selected time period. For example, as shown in FIGS. 1A and 1B, the one or more processors 108 of the controller 106 may report the amount of energy cost savings based on the comparison of measured energy usage of the one or more appliances 104 and the one or more received sets of reference energy data and the received energy cost data in terms of time-averaged power savings over a selected time period.

The operation 3406 illustrates reporting an amount of energy cost savings in terms of operation-averaged power savings over a selected number of operations. For example, as shown in FIGS. 1A and 1B, the one or more processors 108 of the controller 106 may report the amount of energy cost savings based on the comparison of measured energy usage of the one or more appliances 104 and the one or more received sets of reference energy data and the received energy cost data in terms of operation-averaged power savings over a selected number of appliance operations (i.e., appliance cycles).

Figure 35:
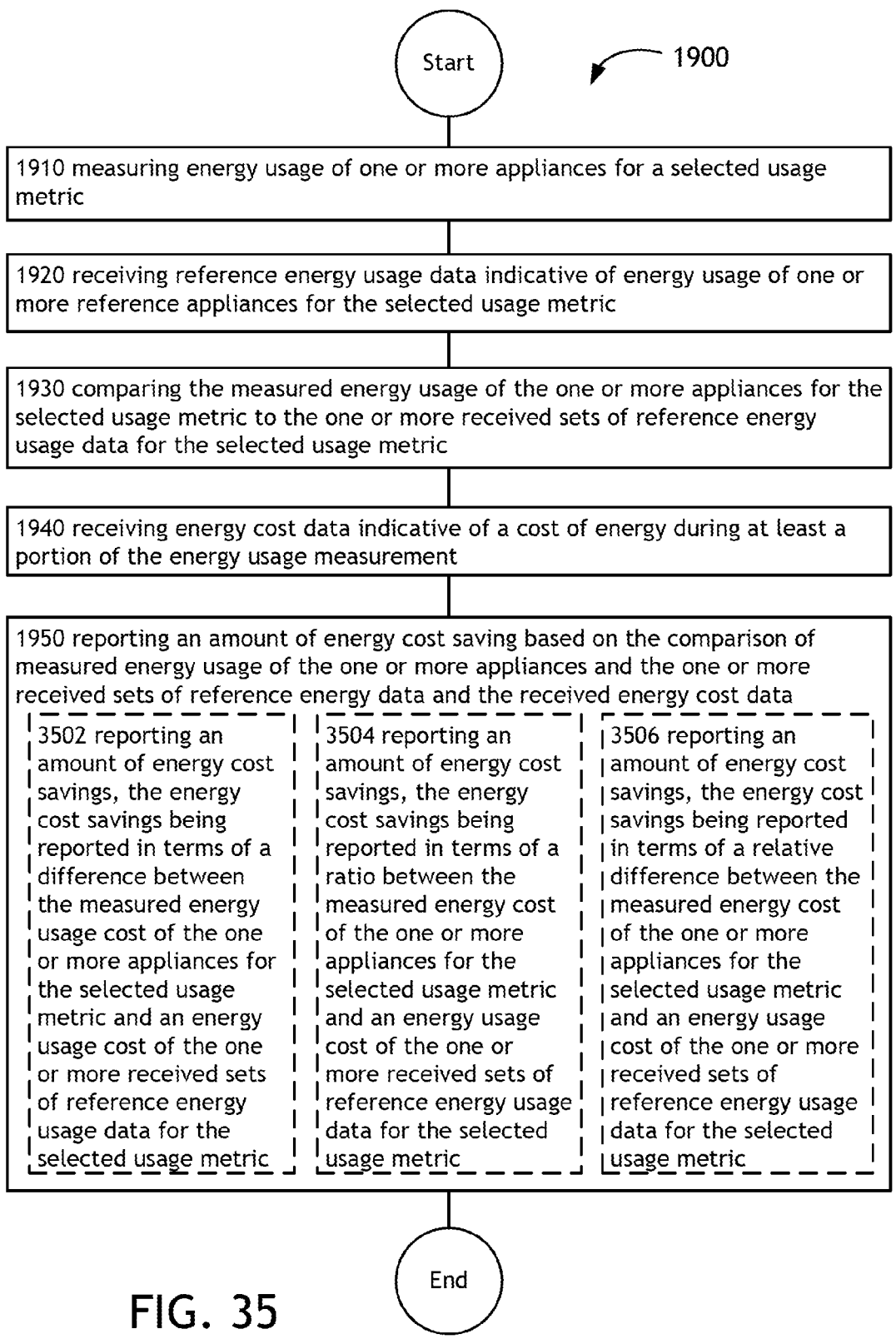

FIG. 35 illustrates alternative embodiments of the example operational flow 1900 of FIG. 19. FIG. 35 illustrates example embodiments where the reporting operation 1950 may include at least one additional operation. Additional operations may include an operation 3502, 3504, and/or 3506.

The operation 3502 illustrates reporting an amount of energy cost savings in terms of a difference between the measured energy usage cost of the one or more appliances 104 for the selected usage metric and an energy usage cost of the one or more received sets of reference energy usage data for the selected usage metric. For example, as shown in FIGS. 1A and 1B, the one or more processors 108 of the controller 106 may report the amount of energy cost savings based on the comparison of measured energy usage of the one or more appliances 104 and the one or more received sets of reference energy data and the received energy cost data in terms of a difference between the measured energy usage cost of the one or more appliances 104 and an energy usage cost of the one or more received sets of reference energy usage data for the selected usage metric.

The operation 3504 illustrates reporting an amount of energy cost savings in terms of a ratio between the measured energy usage cost of the one or more appliances 104 for the selected usage metric and an energy usage cost of the one or more received sets of reference energy usage data for the selected usage metric. For example, as shown in FIGS. 1A and 1B, the one or more processors 108 of the controller 106 may report the amount of energy cost savings based on the comparison of measured energy usage of the one or more appliances 104 and the one or more received sets of reference energy data and the received energy cost data in terms of a ratio between the measured energy usage cost of the one or more appliances 104 and an energy usage cost of the one or more received sets of reference energy usage data for the selected usage metric.

The operation 3506 illustrates reporting an amount of energy cost savings in terms of a relative difference between the measured energy usage cost of the one or more appliances 104 for the selected usage metric and an energy usage cost of the one or more received sets of reference energy usage data for the selected usage metric. For example, as shown in FIGS. 1A and 1B, the one or more processors 108 of the controller 106 may report the amount of energy cost savings based on the comparison of measured energy usage of the one or more appliances 104 and the one or more received sets of reference energy data and the received energy cost data in terms of a relative difference between the measured energy usage cost of the one or more appliances 104 and an energy usage cost of the one or more received sets of reference energy usage data for the selected usage metric.

Figure 36:
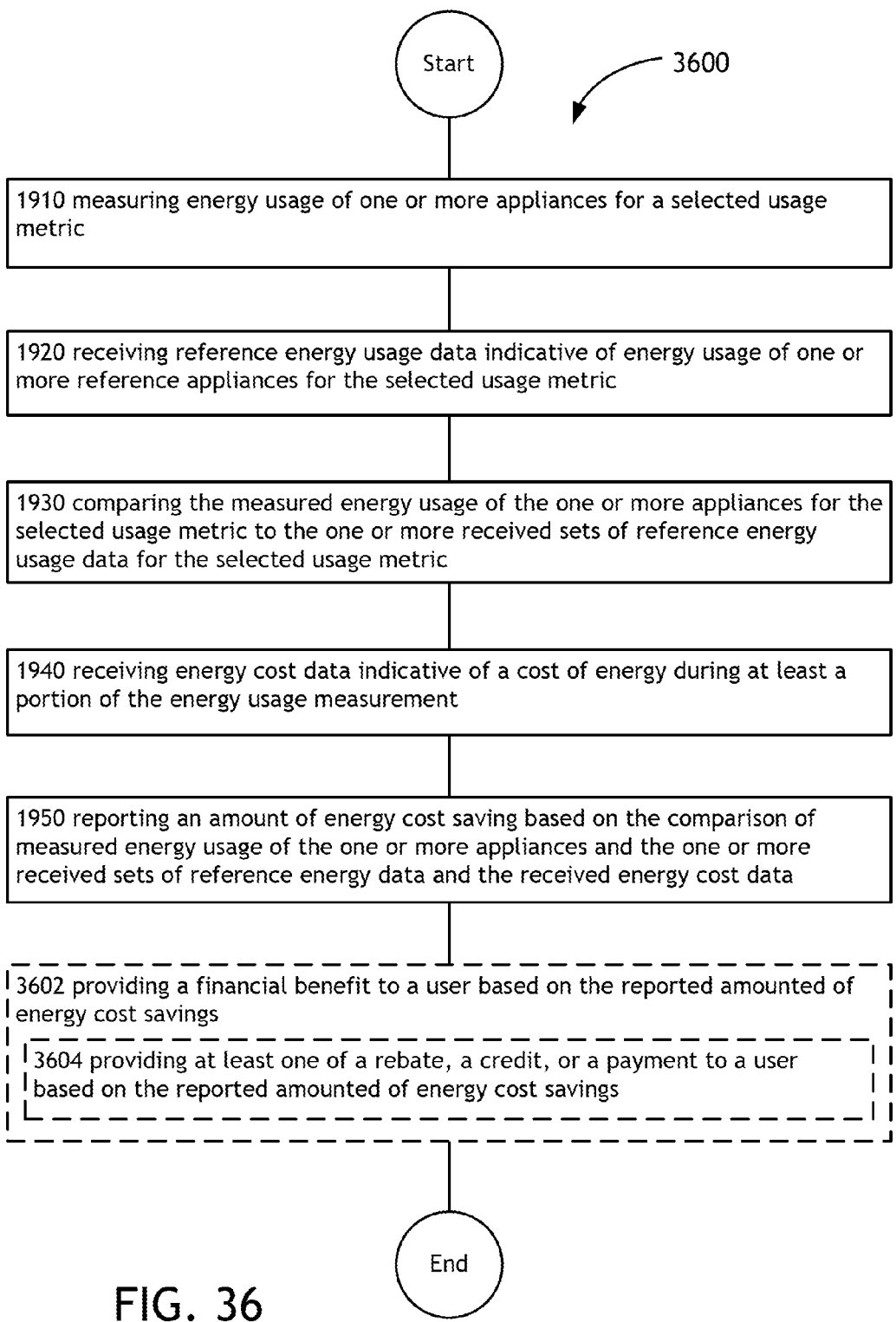

FIG. 36 illustrates alternative embodiments of the example operational flow 1900 of FIG. 19. FIG. 36 illustrates example embodiments where the reporting operation 1950 may include at least one additional operation. Additional operations may include an operation 3602 and/or 3604.

The operation 3602 illustrates providing a financial benefit to a user based on the reported amounted of energy cost savings. For example, as shown in FIGS. 1A and 1B, upon receiving a report from the controller 106, a remote system 118 communicatively coupled to the controller 106 and maintained by an entity (e.g., utility company, appliance manufacturer, governmental entity) may provide a financial benefit to a user based on the reported energy cost savings of step 1950. In this regard, after a remote system 118 receives the reported energy cost savings from the controller 106, the remote system 118 may determine a financial benefit associated with the reported energy cost savings and then transmit a notification of a financial benefit to the controller 106 or to another user device (e.g., smartphone, computer, and the like) via network 124. Alternatively, the remote system 118 may determine a financial benefit associated with the reported energy cost savings and then transmit a notification of the financial benefit to the entity maintaining the remote system 118. Further, the remote system 118 may provide the financial benefit electronically to user by transmitting the financial benefit to an electronic-based financial account (e.g., bank account, utility account, and the like) of the user via network 124.

In a further embodiment, operation 3604 illustrates providing at least one of a rebate, a credit, or a payment to a user based on the reported amounted of energy savings. For example, as shown in FIGS. 1A and 1B, upon receiving a report from the controller 106, a remote system 118 communicatively coupled to the controller 106 and maintained by an entity (e.g., utility company, appliance manufacturer, governmental entity) may provide at least one of a rebate, a credit, or a payment to a user based on the reported amounted of energy cost savings to a user based on the reported energy savings of step 1950. In this regard, after a remote system 118 receives the reported energy cost savings from the controller 106, the remote system 118 may determine the amount of at least one of a rebate, a credit, or a payment based on the reported amounted of energy savings and then transmit a notification of a financial benefit to the controller 106 or to another user device (e.g., smartphone, computer, and the like) via network 124. Alternatively, the remote system 118 may determine the amount of at least one of a rebate, a credit, or a payment based on the reported energy cost savings and then transmit a notification of the financial benefit to the entity maintaining the remote system 118. Further, the remote system 118 may provide the benefit electronically to user by transmitting a rebate, credit, or payment to an electronic-based financial account of the user via network 124.

Those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

In some implementations described herein, logic and similar implementations may include software or other control structures. Electronic circuitry, for example, may have one or more paths of electrical current constructed and arranged to implement various functions as described herein. In some implementations, one or more media may be configured to bear a device-detectable implementation when such media hold or transmit device-detectable instructions operable to perform as described herein. In some variants, for example, implementations may include an update or modification of existing software or firmware, or of gate arrays or programmable hardware, such as by performing a reception of or a transmission of one or more instructions in relation to one or more operations described herein. Alternatively or additionally, in some variants, an implementation may include special-purpose hardware, software, firmware components, and/or general-purpose components executing or otherwise invoking special-purpose components. Specifications or other implementations may be transmitted by one or more instances of tangible transmission media as described herein, optionally by packet transmission or otherwise by passing through distributed media at various times.

Alternatively or additionally, implementations may include executing a special-purpose instruction sequence or invoking circuitry for enabling, triggering, coordinating, requesting, or otherwise causing one or more occurrences of virtually any functional operations described herein. In some variants, operational or other logical descriptions herein may be expressed as source code and compiled or otherwise invoked as an executable instruction sequence. In some contexts, for example, implementations may be provided, in whole or in part, by source code, such as C++, or other code sequences. In other implementations, source or other code implementation, using commercially available and/or techniques in the art, may be compiled/implemented/translated/converted into a high-level descriptor language (e.g., initially implementing described technologies in C or C++ programming language and thereafter converting the programming language implementation into a logic-synthesizable language implementation, a hardware description language implementation, a hardware design simulation implementation, and/or other such similar mode(s) of expression). For example, some or all of a logical expression (e.g., computer programming language implementation) may be manifested as a Verilog-type hardware description (e.g., via Hardware Description Language (HDL) and/or Very High Speed Integrated Circuit Hardware Descriptor Language (VHDL)) or other circuitry model which may then be used to create a physical implementation having hardware (e.g., an Application Specific Integrated Circuit). Those skilled in the art will recognize how to obtain, configure, and optimize suitable transmission or computational elements, material supplies, actuators, or other structures in light of these teachings.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

In a general sense, those skilled in the art will recognize that the various embodiments described herein can be implemented, individually and/or collectively, by various types of electro-mechanical systems having a wide range of electrical components such as hardware, software, firmware, and/or virtually any combination thereof and a wide range of components that may impart mechanical force or motion such as rigid bodies, spring or torsional bodies, hydraulics, electromagnetically actuated devices, and/or virtually any combination thereof. Consequently, as used herein "electro-mechanical system" includes, but is not limited to, electrical circuitry operably coupled with a transducer (e.g., an actuator, a motor, a piezoelectric crystal, a Micro Electro Mechanical System (MEMS), etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), electrical circuitry forming a communications device (e.g., a modem, communications switch, optical-electrical equipment, etc.), and/or any non-electrical analog thereto, such as optical or other analogs. Those skilled in the art will also appreciate that examples of electro-mechanical systems include but are not limited to a variety of consumer electronics systems, medical devices, as well as other systems such as motorized transport systems, factory automation systems, security systems, and/or communication/computing systems. Those skilled in the art will recognize that electro-mechanical as used herein is not necessarily limited to a system that has both electrical and mechanical actuation except as context may dictate otherwise.

In a general sense, those skilled in the art will recognize that the various aspects described herein which can be implemented, individually and/or collectively, by a wide range of hardware, software, firmware, and/or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), and/or electrical circuitry forming a communications device (e.g., a modem, communications switch, optical-electrical equipment, etc.). Those having skill in the art will recognize that the subject matter described herein may be implemented in an analog or digital fashion or some combination thereof.

Those skilled in the art will recognize that at least a portion of the devices and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

Although a user is shown/described herein as a single illustrated figure, those skilled in the art will appreciate that the user may be representative of a human user, a robotic user (e.g., computational entity), and/or substantially any combination thereof (e.g., a user may be assisted by one or more robotic agents) unless context dictates otherwise. Those skilled in the art will appreciate that, in general, the same may be said of "sender" and/or other entity-oriented terms as such terms are used herein unless context dictates otherwise.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that such terms (e.g., "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B.

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

The invention claimed is:

1. A method, comprising:
    measuring energy usage of one or more appliances for a selected usage metric, wherein measuring the selected usage metric comprises one or more of measuring an aggregated energy usage of a configuration of appliances, measuring an energy used by one or more appliances for a selected number of appliance operations, and measuring a total energy used by one or more appliances over a cumulative time period;
    receiving reference energy usage data from a remote system indicative of real-time or near real-time energy usage of one or more reference appliances used in a geographic region for the selected usage metric, wherein the geographic region is selected from a group consisting of a neighborhood, a city, a state, and a country;
    comparing the measured energy usage of the one or more appliances for the selected usage metric to the one or more received sets of reference energy usage data for the selected usage metric; and
    reporting an amount of energy savings based on the comparison of measured energy usage of the one or more appliances and the one or more received sets of reference energy data.

2. The method of claim 1, wherein the receiving reference energy usage data indicative of energy usage of one or more reference appliances for the selected usage metric further comprises:
    receiving reference energy usage data indicative of historical energy usage of the one or more appliances for the selected usage metric.

3. The method of claim 1, wherein the comparing the measured energy usage of the one or more appliances for the selected usage metric to the one or more received sets of reference energy usage data for the selected usage metric comprises:
    responsive to a query, comparing the measured energy usage of the one or more appliances for the selected usage metric to the one or more received sets of reference energy usage data for the selected usage metric.

4. The method of claim 1, wherein the comparing the measured energy usage of the one or more appliances for the selected usage metric to the one or more received sets of reference energy usage data for the selected usage metric comprises:
    responsive to a selected energy usage level of the one or more appliances, comparing the measured energy usage of the one or more appliances for the selected usage metric to the one or more received sets of reference energy usage data for the selected usage metric.

5. The method of claim 1, wherein the comparing the measured energy usage of the one or more appliances for the selected usage metric to the one or more received sets of reference energy usage data for the selected usage metric comprises:
    responsive to a selected number of operations of the one or more appliances, comparing the measured energy usage of the one or more appliances for the selected usage metric to the one or more received sets of reference energy usage data for the selected usage metric.

6. The method of claim 1, wherein the reporting an amount of energy savings comprises:
    displaying an amount of energy savings.

7. The method of claim 6, wherein the displaying an amount of energy savings comprises displaying the amount of energy savings using a display device comprises:
    displaying an amount of energy savings on a display device of a remote system.

8. The method of claim 1, wherein the reporting an amount of energy savings comprises:
    reporting an amount of energy savings in terms of accumulated energy savings over a selected time period.

9. The method of claim 1, wherein the reporting an amount of energy savings comprises:
    reporting an amount of energy savings in terms of time-averaged power savings over a selected time period.

10. The method of claim 1, wherein the reporting an amount of energy savings comprises:
    reporting an amount of energy savings in terms of operation-averaged energy savings over a selected number of operations.

11. The method of claim 1, further comprising:
    providing a financial benefit to a user based on the reported amounted of energy savings.

12. The method of claim 11, wherein the providing a financial benefit to a user based on the reported amounted of energy savings comprises:
    providing at least one of a rebate, a credit, or a payment to a user based on the reported amounted of energy savings.

13. A method, comprising:
    measuring energy usage of one or more appliances for a selected usage metric, wherein measuring the selected usage metric comprises one or more of measuring an aggregated energy usage of a configuration of appliances, measuring an energy used by one or more appliances for a selected number of appliance operations, and measuring a total energy used by one or more appliances over a cumulative time period;
    receiving reference energy usage data indicative of energy usage of one or more reference appliances in a selected geographic region for the selected usage metric, wherein the selected geographic region comprises one or more of a neighborhood, a city, a state, and a country;
    comparing the measured energy usage of the one or more appliances for the selected usage metric to the one or more received sets of reference energy usage data for the selected usage metric;
    receiving energy cost data indicative of a cost of energy during at least a portion of the energy usage measurement; and
    reporting an amount of energy cost saving based on the comparison of measured energy usage of the one or more appliances and the one or more received sets of reference energy data and the received energy cost data.

14. The method of claim 13, wherein the receiving reference energy usage data indicative of energy usage of one or more reference appliances for the selected usage metric further comprises:
receiving reference energy usage data indicative of historical energy usage of the one or more appliances for the selected usage metric.

15. The method of claim 13, wherein the receiving reference energy usage data from a remote system indicative of energy usage of one or more reference appliances for the selected usage metric comprises:
receiving reference energy usage data from a remote system indicative of energy usage of one or more reference appliances having a selected set of operational conditions for the selected usage metric.

16. The method of claim 13, wherein the comparing the measured energy usage of the one or more appliances for the selected usage metric to the one or more received sets of reference energy usage data for the selected usage metric comprises:
determining a difference between the measured energy usage of the one or more appliances for the selected usage metric and the one or more received sets of reference energy usage data for the selected usage metric.

17. The method of claim 13, wherein the receiving energy cost data indicative of a cost of energy during at least a portion of the energy usage measurement comprises:
receiving cost data indicative of an average cost of energy over a selected geographic region during at least a portion of the energy usage measurement.

18. The method of claim 13, wherein the reporting an amount of energy cost saving based on the comparison of measured energy usage of the one or more appliances and the one or more received sets of reference energy data and the received energy cost data comprises:
displaying an amount of energy cost savings.

19. The method of claim 13, wherein the reporting an amount of energy cost saving based on the comparison of measured energy usage of the one or more appliances and the one or more received sets of reference energy data and the received energy cost data comprises:
reporting an amount of energy cost savings, the energy cost savings being reported in terms of accumulated energy cost savings over a selected time period.

20. The method of claim 13, wherein the reporting an amount of energy cost saving based on the comparison of measured energy usage of the one or more appliances and the one or more received sets of reference energy data and the received energy cost data comprises:
reporting an amount of energy cost savings, the energy cost savings being reported in terms of time-averaged energy cost savings over a selected time period.

21. The method of claim 13, wherein the reporting an amount of energy cost saving based on the comparison of measured energy usage of the one or more appliances and the one or more received sets of reference energy data and the received energy cost data comprises:
reporting an amount of energy cost savings, the energy cost savings being reported in terms of operation-averaged energy cost savings over a selected number of operations.

22. The method of claim 13, further comprising:
providing a financial benefit to a user based on the reported amounted of energy cost savings.

23. The method of claim 22, wherein the providing a financial benefit to a user based on the reported amounted of energy cost savings comprises:
providing at least one of a rebate, a credit, or a payment to a user based on the reported amounted of energy cost savings.

24. An apparatus, comprising:
one or more energy meters configured to measure energy usage of one or more appliances for a selected usage metric, wherein measuring the selected usage metric comprises one or more of measuring an aggregated energy usage of a configuration of appliances, measuring an energy used by one or more appliances for a selected number of appliance operations, and measuring a total energy used by one or more appliances over a cumulative time period;
a controller communicatively coupled to the one or more energy meters, the controller configured to:
receive reference energy usage data indicative of energy usage of one or more reference appliances in a selected geographic region for the selected usage metric, wherein the selected geographic region comprises one or more of a neighborhood, a city, a state, and a country;
compare the energy usage of the one or more appliances measured by the one or more energy meters for the selected usage metric to the one or more received sets of reference energy usage data for the selected usage metric; and
a display device communicatively coupled to the controller and configured to display an amount of energy savings based on the comparison of measured energy usage of the one or more appliances and the one or more received sets of reference energy data.

25. The apparatus of claim 24, wherein the one or more energy meters comprises:
one or more electrical power meters.

26. The apparatus of claim 24, wherein the one or more energy meters comprises:
one or more heat meters configured to measure the thermal energy generated by the one or more appliances.

27. The apparatus of claim 24, wherein the one or more energy meters comprises:
one or more energy meters disposed within a housing of the one or more appliances.

28. The apparatus of claim 24, wherein the one or more energy meters comprises:
one or more energy meters disposed in proximity to the one or more appliances.

29. The apparatus of claim 24, wherein the one or more energy meters comprises:
one or more energy meters operably connected to at least a portion of the one or more appliances.

30. The apparatus of claim 24, wherein the one or more energy meters is configured to measure energy usage of one or more appliances on a residential circuit for a selected usage metric.

31. The apparatus of claim 24, wherein the one or more energy meters is configured to measure energy usage of one or more appliances on a commercial circuit for a selected usage metric.

32. The apparatus of claim 24, wherein the controller is further configured to determine a difference between the measured energy usage of the one or more appliances for the selected usage metric and the one or more received sets of reference energy usage data for the selected usage metric.

33. The apparatus of claim 24, wherein the controller is further configured to compare time-averaged measured energy usage of the one or more appliances for the selected usage metric to the one or more received sets of reference energy data for the selected usage metric.

34. The apparatus of claim 24, wherein the controller is further configured to compare operation-averaged measured energy usage of the one or more appliances for the selected usage metric to the one or more received sets of reference energy data for the selected usage metric.

35. The apparatus of claim 24, wherein the display device is positioned at least proximate to the one or more appliances.

36. The apparatus of claim 24, wherein the display device comprises:
a display device of a remote system.

37. The apparatus of claim 24, wherein the display device comprises:
a display device of the one or more appliances.

38. The apparatus of claim 24, wherein the controller is further configured to transmit an amount of energy savings to a memory unit.

39. The apparatus of claim 24, further comprising:
a remote system configured to provide a financial benefit to a user based on an amount of energy savings.

40. An apparatus, comprising:
one or more energy meters configured to measure energy usage of one or more appliances for a selected usage metric, wherein measuring the selected usage metric comprises one or more of measuring an aggregated energy usage of a configuration of appliances, measuring an energy used by one or more appliances for a selected number of appliance operations, and measuring a total energy used by one or more appliances over a cumulative time period;
a controller communicatively coupled to the one or more energy meters, the controller configured to:
receive reference energy usage data indicative of energy usage of one or more reference appliances in a selected geographic region for the selected usage metric, wherein the selected geographic region comprises one or more of a neighborhood, a city, a state, and a country;
compare the energy usage of the one or more appliances measured by the one or more energy meters for the selected usage metric to the one or more received sets of reference energy usage data for the selected usage metric; and
receive energy cost data indicative of a cost of energy during at least a portion of the energy usage measurement; and
a display device communicatively coupled to the controller and configured to display the amount of energy cost savings based on the comparison of measured energy usage of the one or more appliances and the one or more received sets of reference energy data, and the received energy cost data.

41. The apparatus of claim 40, wherein the one or more energy meters comprises:
one or more electrical power meters.

42. The apparatus of claim 40, wherein the one or more energy meters comprises:
one or more heat meters configured to measure the thermal energy generated by the one or more appliances.

43. The apparatus of claim 40, wherein the one or more energy meters comprises:
one or more energy meters disposed within a housing of the one or more appliances.

44. The apparatus of claim 40, wherein the one or more energy meters is configured to measure energy usage of a plurality of appliances for a selected usage metric.

45. The apparatus of claim 40, wherein the controller is further configured to compare time-averaged measured energy usage of the one or more appliances for the selected usage metric to the one or more received sets of reference energy data for the selected usage metric.

46. The apparatus of claim 40, wherein the controller is further configured to compare operation-averaged measured energy usage of the one or more appliances for the selected usage metric to the one or more received sets of reference energy data for the selected usage metric.

47. The apparatus of claim 40, further comprising:
a remote system configured to provide a financial benefit to a user based on an amount of energy cost savings.

* * * * *

UNITED STATES PATENT AND TRADEMARK OFFICE
CERTIFICATE OF CORRECTION

PATENT NO. : 9,207,270 B2
APPLICATION NO. : 13/600397
DATED : December 8, 2015
INVENTOR(S) : Caldeira et al.

Page 1 of 1

It is certified that error appears in the above-identified patent and that said Letters Patent is hereby corrected as shown below:

In the claims

Column 48, lines 35-36, claim 11: "based on the reported amounted of energy savings." should read --based on the reported amount of energy savings.--

Column 48, lines 38-39, claim 12: "based on the reported amounted of energy savings" should read --based on the reported amount of energy savings--

Column 48, line 41, claim 12: "based on the reported amounted of energy savings." should read --based on the reported amount of energy savings.--

Column 49, lines 63-64, claim 22: "based on the reported amounted of energy cost savings." should read --based on the reported amount of energy cost savings.--

Column 49, lines 66-67, claim 23: "based on the reported amounted of energy cost savings" should read --based on the reported amount of energy cost savings--

Column 50, lines 2-3, claim 23: "based on the reported amounted of energy cost savings." should read --based on the reported amount of energy cost savings.--

Signed and Sealed this
Fourteenth Day of June, 2016

Michelle K. Lee
*Director of the United States Patent and Trademark Office*